(12) United States Patent
Asaki et al.

(10) Patent No.: US 8,368,617 B2
(45) Date of Patent: Feb. 5, 2013

(54) DISPLAY DEVICE AND DISPLAY UNIT

(75) Inventors: Reo Asaki, Tokyo (JP); Hirofumi Fujioka, Kanagawa (JP); Yasunobu Hiromasu, Kanagawa (JP)

(73) Assignee: Sony Corporation, Tokyo (JP)

( * ) Notice: Subject to any disclaimer, the term of this patent is extended or adjusted under 35 U.S.C. 154(b) by 666 days.

(21) Appl. No.: 11/670,120

(22) Filed: Feb. 1, 2007

(65) Prior Publication Data
US 2008/0143649 A1 Jun. 19, 2008

(30) Foreign Application Priority Data

Feb. 3, 2006 (JP) .................................. 2006-027062
Dec. 27, 2006 (JP) .................................. 2006-351863

(51) Int. Cl.
*G09G 3/30* (2006.01)

(52) U.S. Cl. .............. 345/76; 345/206; 345/80; 345/82; 313/506

(58) Field of Classification Search .................... 345/45, 345/76, 80, 204–206, 904; 313/506, 509; 345/82, 83
See application file for complete search history.

(56) References Cited

U.S. PATENT DOCUMENTS

| | | | |
|---|---|---|---|
| 5,936,347 A * | 8/1999 | Isaka et al. ................... | 313/509 |
| 5,990,629 A | 11/1999 | Yamada et al. | |
| 6,741,228 B1 | 5/2004 | Yokoyama et al. | |
| 6,911,960 B1 | 6/2005 | Tokoyama | |
| 7,075,106 B2 * | 7/2006 | Shibata et al. ................... | 257/40 |
| 7,242,375 B2 * | 7/2007 | Hayashi et al. ................ | 345/76 |
| 7,268,485 B2 | 9/2007 | Tyan et al. | |
| 7,548,019 B2 | 6/2009 | Omura et al. | |
| 7,903,055 B2 * | 3/2011 | Nishikawa et al. ............. | 345/77 |
| 2005/0073228 A1 | 4/2005 | Tyan et al. | |

FOREIGN PATENT DOCUMENTS

JP 09-045477 2/1997

(Continued)

OTHER PUBLICATIONS

Japanese Patent Office Action corresponding to Japanese Serial No. 2006-351863 dated May 25, 2010.

(Continued)

*Primary Examiner* — Lun-Yi Lao
*Assistant Examiner* — Tom V Sheng
(74) *Attorney, Agent, or Firm* — SNR Denton US LLP

(57) ABSTRACT

A display device capable of improving the view angle characteristics without deteriorating the outside light contrast and a display unit using it are provided. The display device includes a first electrode, an organic layer including a light emitting lay and a second electrode sequentially over a substrate, and having a resonator structure in which light generated in the light emitting layer is resonated between a first end and a second end. An end face of the first electrode on the light emitting layer side is the first end having a step shape. A distance adjustment layer that fills in the step shape and has a flat surface on the second electrode side is provided between the first electrode and the second electrode, and thereby the second end is planarized, and an optical distance between the first end and the second end is varied according to the step shape.

10 Claims, 36 Drawing Sheets

FOREIGN PATENT DOCUMENTS

| | | |
|---|---|---|
| JP | 9-190883 | 7/1997 |
| JP | 2002-008870 | 1/2002 |
| JP | 2006-032327 | 2/2006 |
| JP | 2007-507851 | 3/2007 |
| WO | WO0139554 | 5/2001 |
| WO | 2005/107327 | 11/2005 |
| WO | WO2005107327 | * 11/2005 |

OTHER PUBLICATIONS

Japanese Office Action issued on Jan. 24, 2012, in connection with counterpart JP Application No. 2010-166724.
Japanese Office Action issued on Nov. 8, 2011 in connection with counterpart JP Application No. 2010-166724.

* cited by examiner

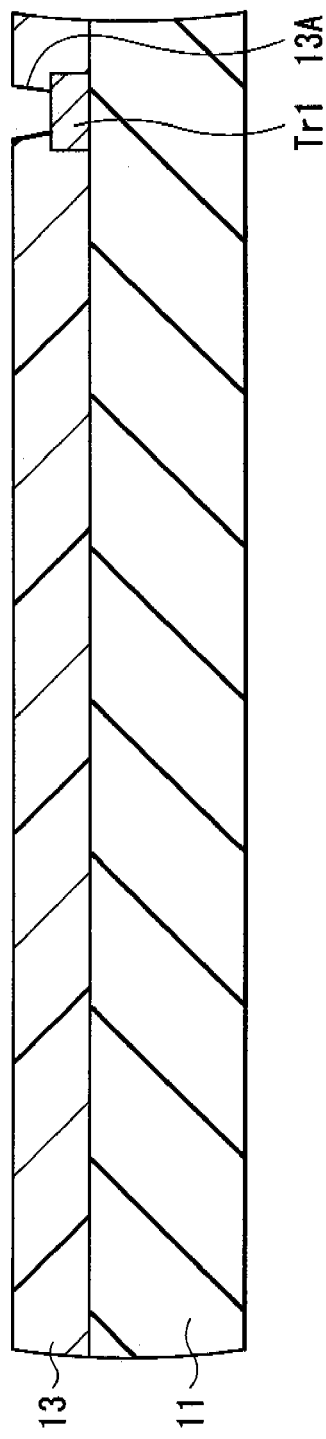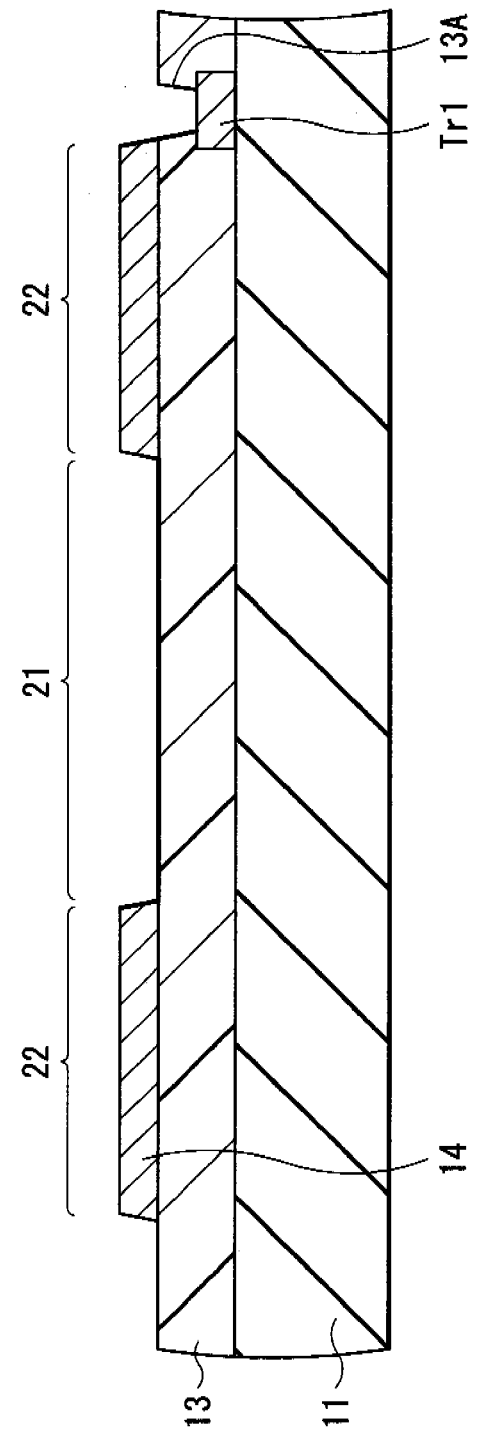

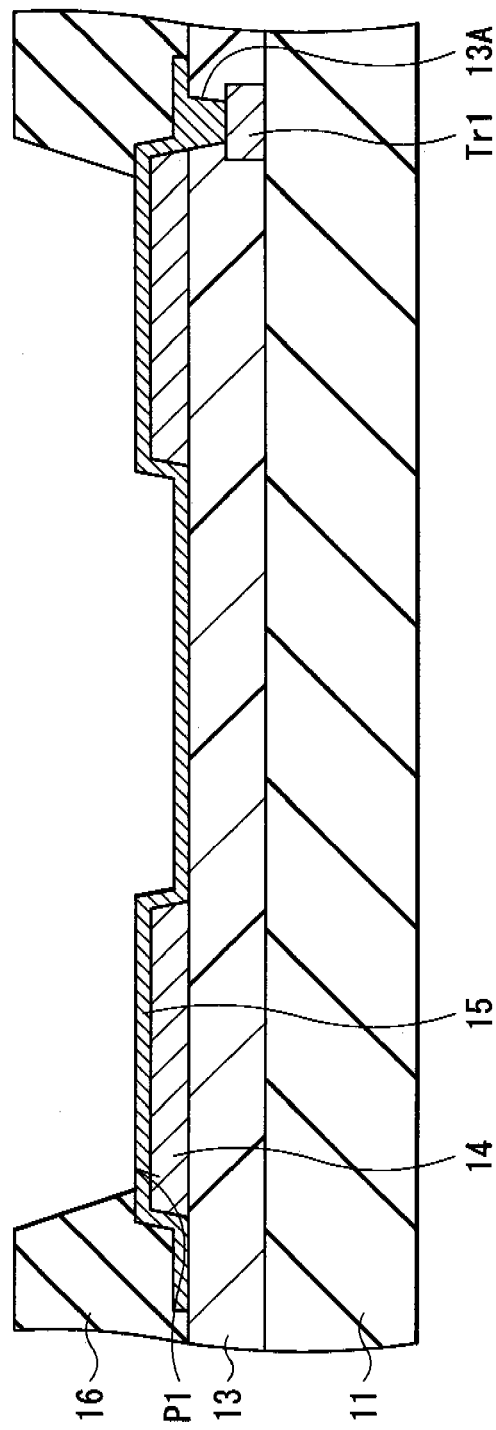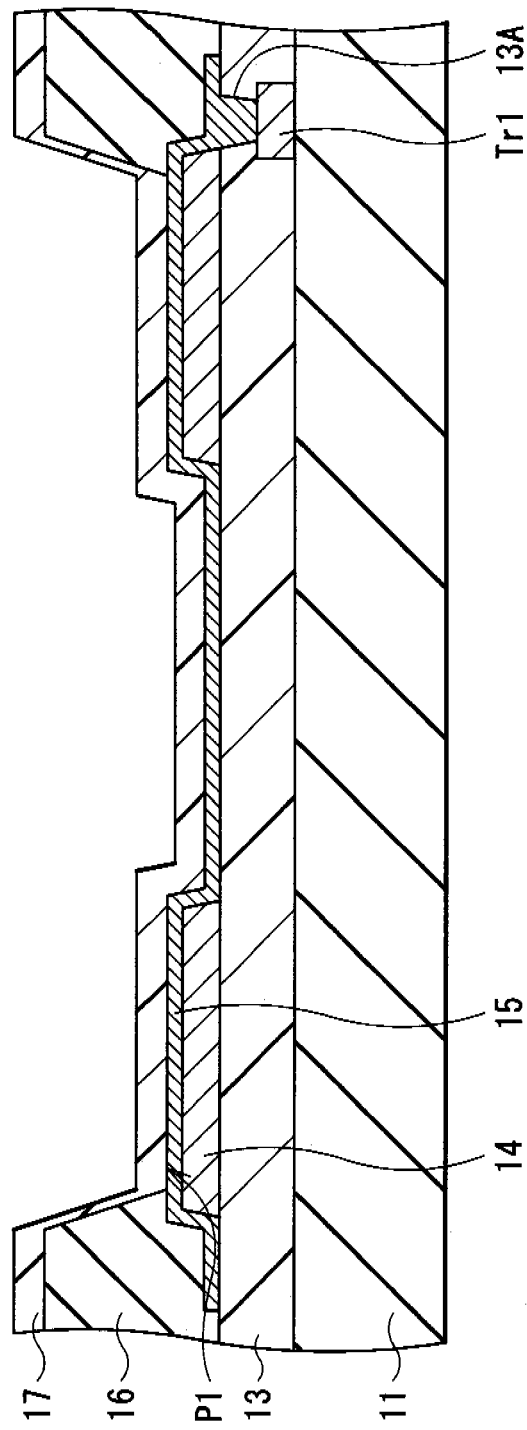

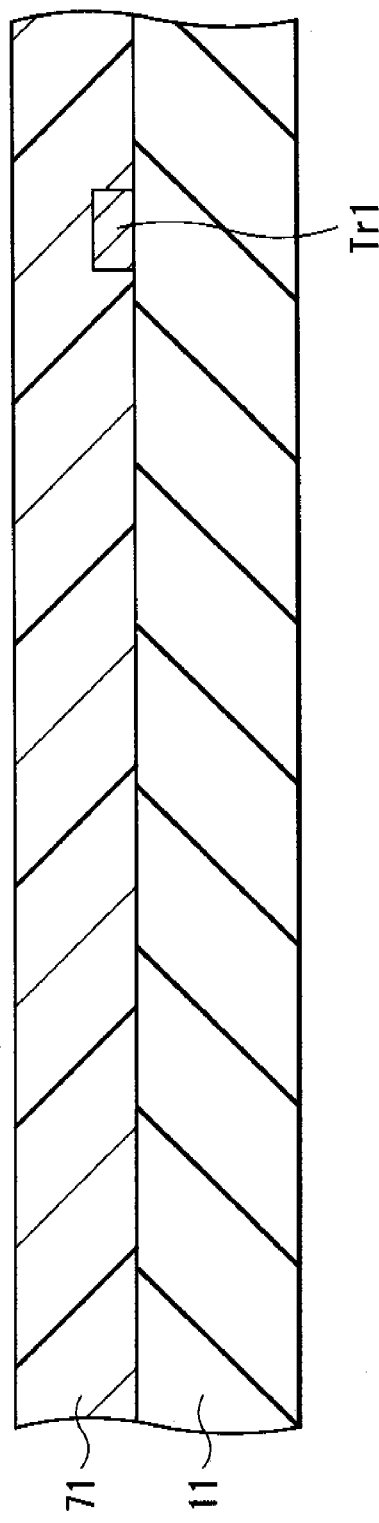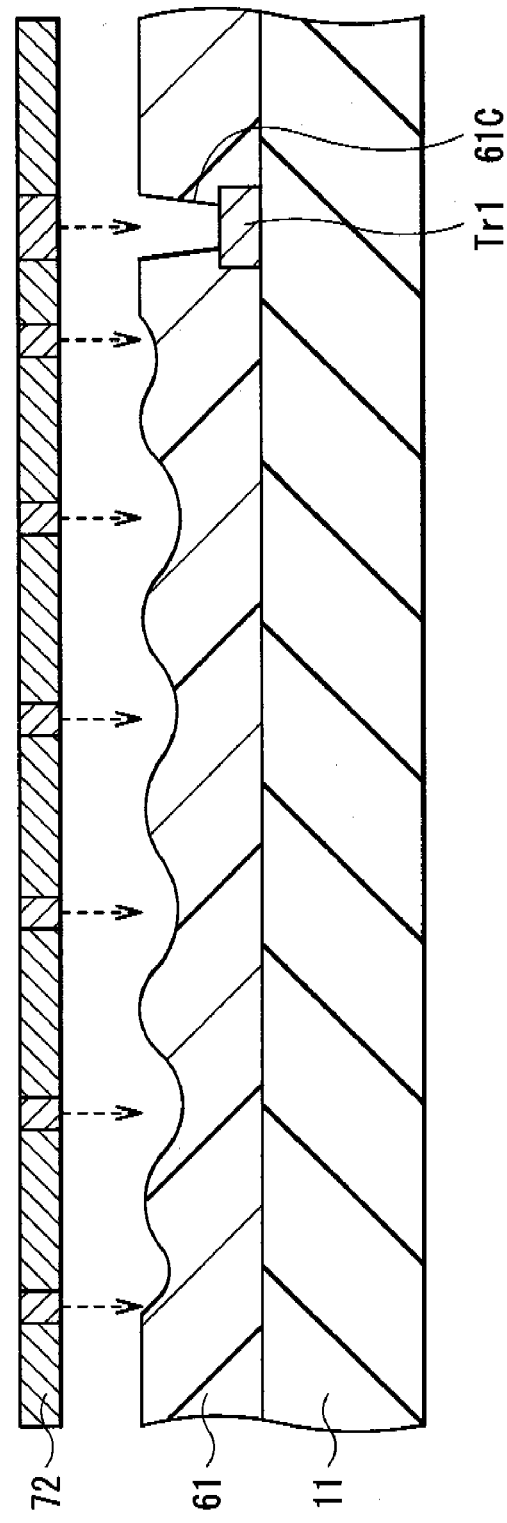
FIG. 19A
FIG. 19B

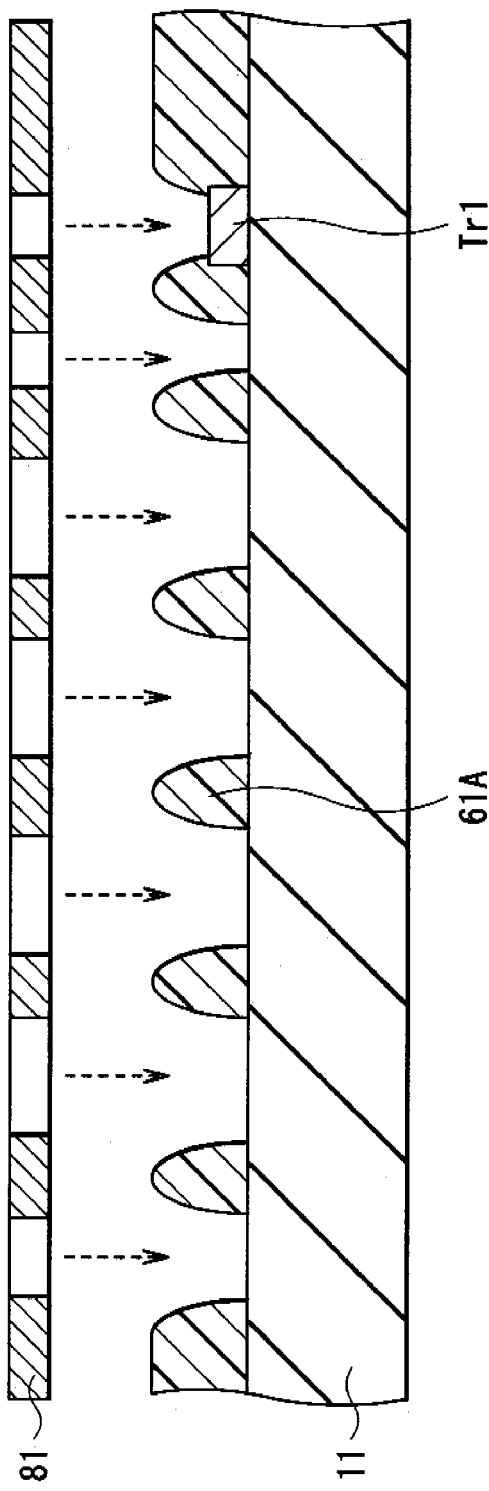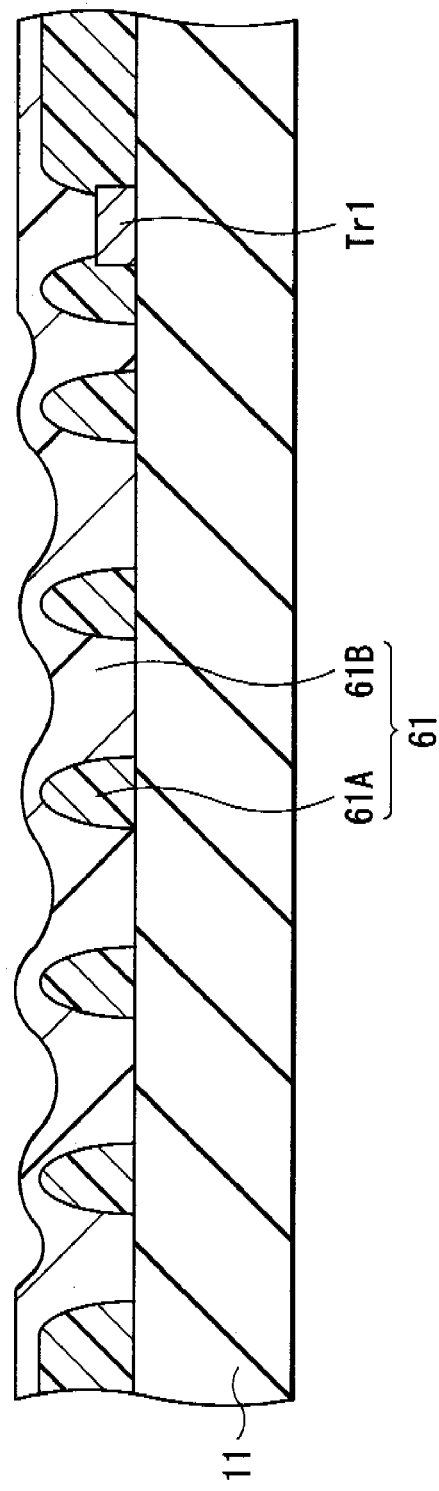
FIG. 21A
FIG. 21B

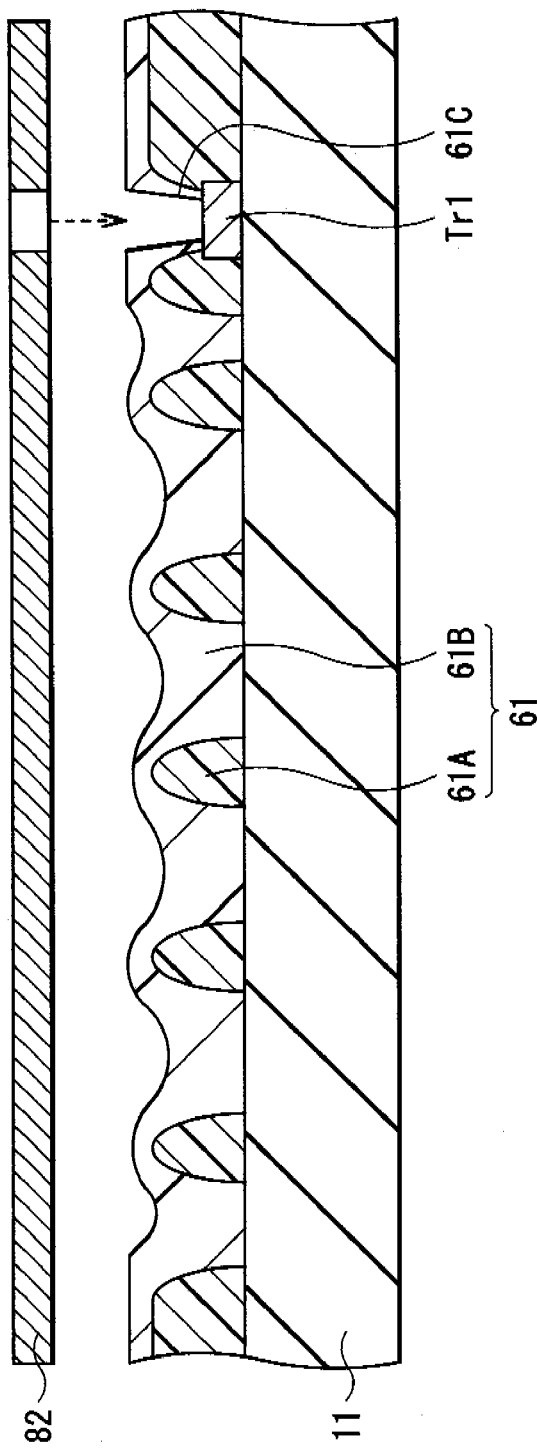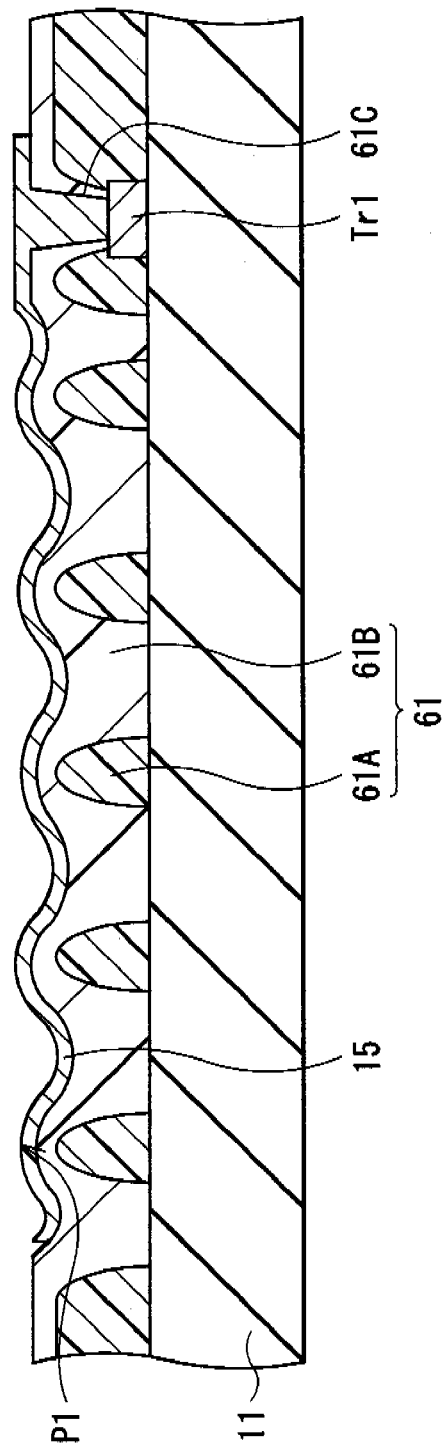
FIG. 22A
FIG. 22B

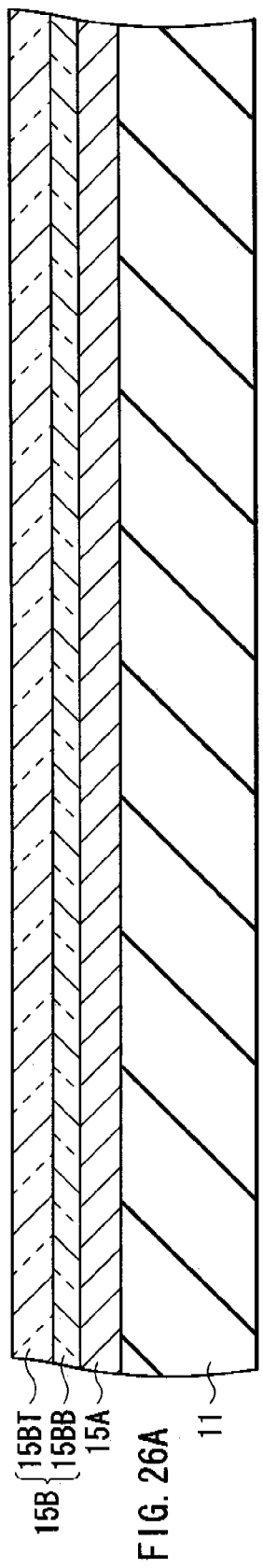
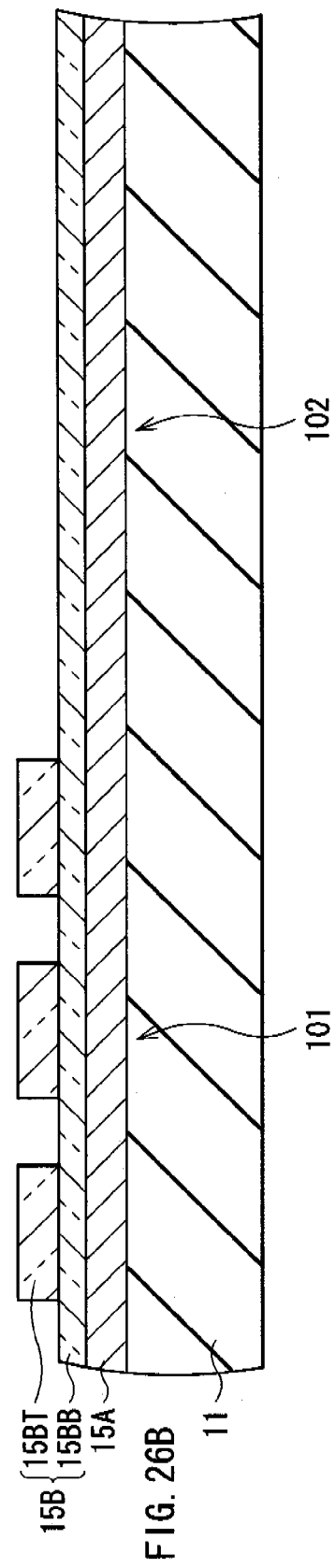
FIG. 26A
FIG. 26B

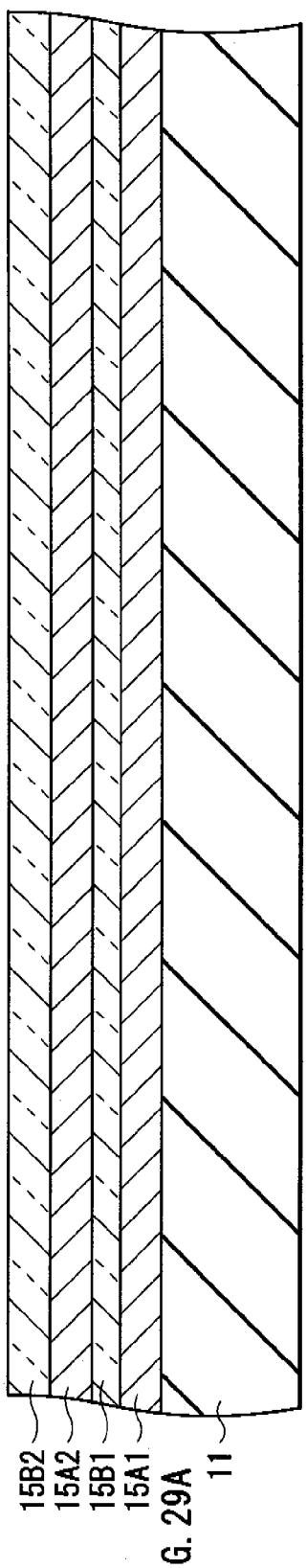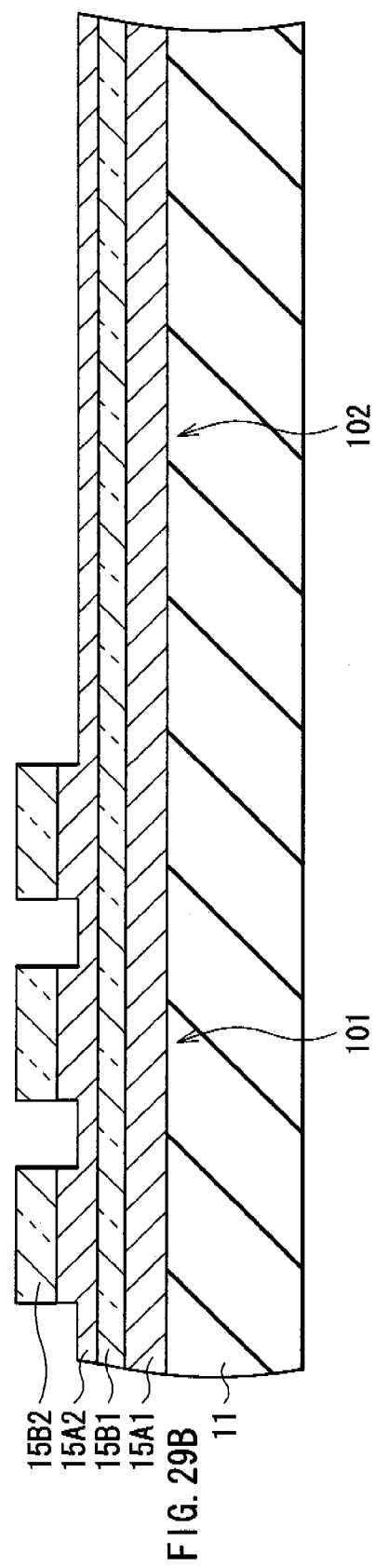
FIG. 29A
FIG. 29B

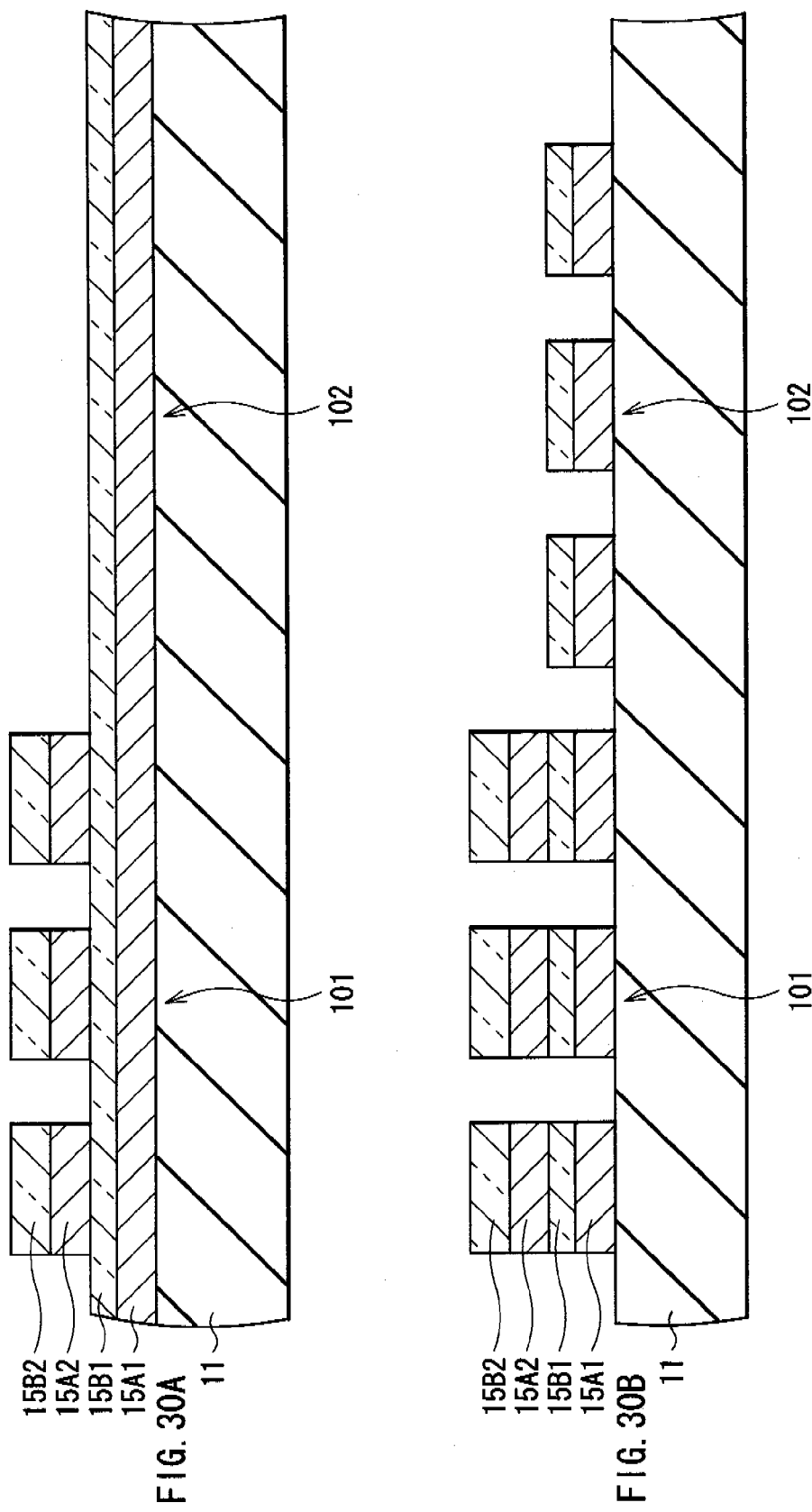

DISPLAY DEVICE AND DISPLAY UNIT

CROSS REFERENCES TO RELATED APPLICATIONS

The present invention contains subject matter related to Japanese Patent Application JP 2006-027062 filed in the Japanese Patent Office on Feb. 3, 2006, and Japanese Patent Application JP 2006-351863 filed in the Japanese Patent Office on Dec. 27, 2006, the entire contents of which being incorporated herein by references.

BACKGROUND OF THE INVENTION

1. Field of the Invention

The present invention relates to a self-light emitting display device such as an organic light emitting device and a display unit, and particularly to a display device having a resonator structure and a display unit.

2. Description of the Related Art

In these years, as a display unit displacing a liquid crystal display, an organic EL display using organic light emitting devices has been in practical use. Since the organic EL display is a self-light emitting display, its view angle is wider than that of the liquid crystal display. Further, the organic EL display is regarded as a display having sufficient response to high-definition and high-speed video signals.

In the past, for the organic light emitting devices, attempts to control light generated in the light emitting layer, for example, attempts to improve the color purity of light emitting colors and increase the light emitting efficiency by introducing a resonator structure have been made (for example, refer to International Publication No. 01/39554).

SUMMARY OF THE INVENTION

When the resonator structure is provided for the organic light emitting device, since a spectrum of resonated light has a high and narrow peak, the light extraction efficiency in the front direction to the display screen is improved. However, when the screen is viewed from an oblique direction, the light emitting wavelength is largely shifted and the light emitting intensity is lowered. That is, in the past, luminance difference and color shift are generated according to the viewing angle to the screen, leading to deterioration of the view angle characteristics, lowering of the image quality and the like.

In the past, to improve the view angle characteristics of the organic light emitting device, there has been an attempt to enlarge the view angle by diffusing a light emitting direction and averaging the light directivity by forming a concave structure, a light diffusion layer, and a light refraction layer on the transparent substrate (for example, refer to Japanese Unexamined Patent Application Publication No. 9-190883). However, in such an existing method, there has been a disadvantage that outside light is also scattered by the concave structure, the light diffusion layer, and the light refraction layer formed on the transparent substrate, leading to largely deteriorating the outside light contrast.

In Japanese Unexamined Patent Application Publication No. 2006-32327, it is proposed that by using a lamination electrode including a metal reflective film and a transparent conductive film and changing the thickness of the transparent conductive film, a plurality of resonator structures with different optical distances are provided in one device. However, in the structure of Japanese Unexamined Patent Application Publication No. 2006-32327, the transparent conductive film is essential. In addition, it is necessary to change the thickness of the transparent conductive film in one device. It results in necessity of a film forming process and a patterning process thereof, leading to increase of the manufacturing cost. Further, a step where the thickness of the transparent conductive film is changed is likely to become a cause of non-light emitting defect or the like. To address such a disadvantage, the step may be covered with an insulating film. However, it causes lowering of aperture ratio.

In view of the foregoing, in the invention, it is desirable to provide a display device capable of inhibiting deterioration of the outside light contrast and improving the view angle characteristics and a display unit.

According to an embodiment of the invention, there is provided a first display device including a first electrode, an organic layer having a light emitting layer, and a second electrode sequentially over a substrate, and having a resonator structure in which light generated in the light emitting layer is resonated between a first end and a second end, wherein an end face of the first electrode on the light emitting layer side is the first end having a step shape, and a distance adjustment layer that fills in the step shape and has a flat surface on the second electrode side is provided between the first electrode and the second electrode, and thereby the second end is planarized, and an optical distance between the first end and the second end is varied according to the step shape.

A first display unit according to an embodiment of the invention includes the foregoing first display device of the embodiment of the invention.

In the first display device according to the embodiment of the invention or the first display unit according to the embodiment of the invention, the first end of the resonator structure has the step shape. The step shape is filled in by the distance adjustment layer and planarized. Thereby, the optical distance between the first end and the second end is varied according to the step shape. Therefore, the peak wavelength of a spectrum of light to be extracted is varied according to the optical distance, the half bandwidth of a spectrum obtained by synthesizing each peak spectrum becomes wide, and the view angle characteristics become improved.

According to an embodiment of the invention, there is provided a second display device including a first electrode, an organic layer having a light emitting layer, and a second electrode sequentially over a substrate, and having a resonator structure in which light generated in the light emitting layer is resonated between a first end and a second end, wherein an end face of the first electrode on the light emitting layer side is the first end having a continuous convexoconcave shape, and a distance adjustment layer that fills in the convexoconcave shape and has a flat surface on the second electrode side is provided between the first electrode and the second electrode, and thereby the second end is planarized, and an optical distance between the first end and the second end is continuously varied according to the convexoconcave shape.

A second display unit according to an embodiment of the invention includes the foregoing second display device of the embodiment of the invention.

In the second display device according to the embodiment of the invention or the second display unit according to the embodiment of the invention, the first end of the resonator structure has the continuous convexoconcave shape. The convexoconcave shape is filled in by the distance adjustment layer and planarized. Thereby, the optical distance between the first end and the second end is continuously changed. Therefore, the peak wavelength of a spectrum of light to be extracted is continuously changed according to the optical distance, the half bandwidth of a spectrum obtained by synthesizing each spectrum becomes wide, and the view angle characteristics become improved.

According to an embodiment of the invention, there is provided a third display unit including a plurality of pixels including display devices that respectively has a first electrode, an organic layer including a light emitting layer, and a second electrode sequentially over a substrate, and has a resonator structure in which light generated in the light emitting layer is resonated between a first end and a second end, wherein for at least two display devices that are included in adjacent pixels and have the same light emitting wavelength of the light emitting layer among the display devices, an optical distance between the first end and the second end is different from each other.

In the third display unit according to the embodiment of the invention, in the at least two display devices that are included in the adjacent pixels and have the same light emitting wavelength of the light emitting layer out of the display devices, the optical distance between the first end and the second end of the resonator structure is different from each other. Therefore, for light extracted from each display device, though the light emitting color is the same, the peak wavelength of the spectrum is different from each other. Therefore, when the display devices emit light concurrently, the half bandwidth of the synthesized spectrum is widened, and the visual field characteristics are improved.

According to the first display device of the embodiment of the invention or the first display unit of the embodiment of the invention, the first end of the resonator structure has the step shape. The step shape is filled in by the distance adjustment layer and planarized. Thereby, the optical distance between the first end and the second end is varied according to the step shape. Therefore, the peak wavelength of a spectrum of light to be extracted is varied according to the optical distance, the half bandwidth of a spectrum obtained by synthesizing each spectrum can be wide, and the view angle characteristics can be improved.

According to the second display device of the embodiment of the invention or the second display unit of the embodiment of the invention, the first end of the resonator structure has the continuous convexoconcave shape. The convexoconcave shape is filled in by the distance adjustment layer and planarized. Thereby, the optical distance between the first end and the second end is continuously changed. Therefore, the peak wavelength of the spectrum of the light to be extracted is continuously changed according to the optical distance, the half bandwidth of the spectrum obtained by synthesizing each spectrum can be wide, and the view angle characteristics can be improved.

According to the third display unit of the embodiment of the invention, in the at least two display devices that are included in the adjacent pixels and have the same light emitting wavelength of the light emitting layer among the display devices, the optical distance between the first end and the second end of the resonator structure is different from each other. Therefore, the peak wavelength of the spectrum of the light to be extracted from the display device having the same light emitting wavelength can be varied, and the view angle characteristics can be improved.

Further, in any of the first to the third display devices or in any of the first to the third display units according to the embodiments of the invention, it is not necessary to form the structure having a possibility to scatter outside light such as a concave face structure, a light diffusion layer, and a light refraction layer on the transparent substrate that is used in the related art. Therefore, there is no risk to cause deterioration of the outside light contrast. Further, it is advantageous in the view of the manufacturing cost as well.

Other and further objects, features and advantages of the invention will appear more fully from the following description.

BRIEF DESCRIPTION OF THE DRAWINGS

FIGS. 10A and 10B are cross sections showing a method of manufacturing the display unit shown in FIG. 1 in the order of steps;

FIGS. 11A and 11B are cross sections showing steps following FIG. 10B;

FIGS. 19A and 19B are cross sections showing a method of manufacturing the display unit shown in FIG. 16 in the order of steps;

FIGS. 21A and 21B are cross sections showing a method of manufacturing the display unit shown in FIG. 17 in the order of steps;

FIGS. 22A and 22B are cross sections showing steps following FIG. 21B;

FIGS. 26A and 26B are cross sections showing a method of manufacturing a display unit shown in FIG. 25 in the order of steps;

FIGS. 29A and 29B are cross sections showing a method of manufacturing a display unit shown in FIG. 28 in the order of steps;

FIGS. 30A and 30B are cross sections showing steps following FIG. 29B;

DETAILED DESCRIPTION OF THE PREFERRED EMBODIMENTS

Embodiments of the invention will be hereinafter described in detail with reference to the drawings.

First Embodiment

Figure 1:
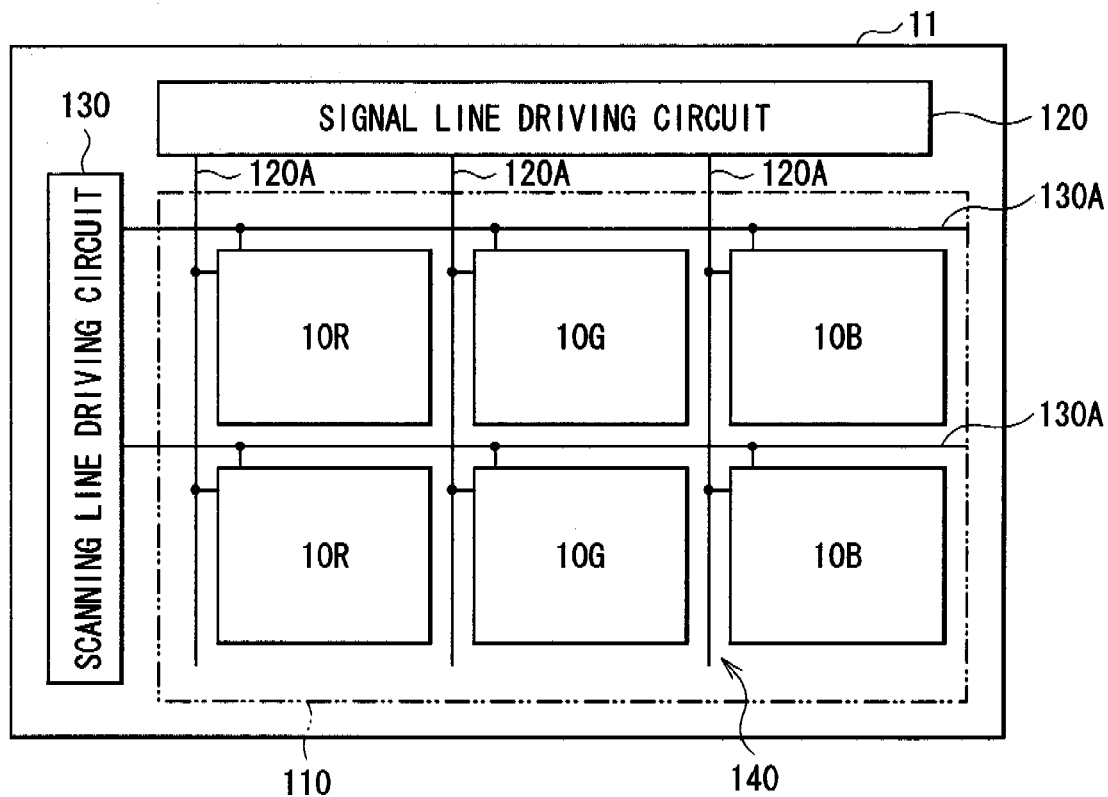
FIG. 1 is a view showing a configuration of a display unit according to a first embodiment of the invention.

FIG. 1 shows a configuration of a display unit using an organic light emitting device according to a first embodiment of the invention. The display unit is used as an ultrathin organic light emitting color display unit or the like. For example, a display region 110 in which a plurality of organic light emitting devices 10R, 10G and 10B described later are arranged in a matrix state is formed on a substrate 11 made of glass, a silicon (Si) wafer, a resin or the like. A signal line driving circuit 120 and a scanning line driving circuit 130 that are drivers for displaying an image are formed on the periphery of the display region 110.

Figure 2:
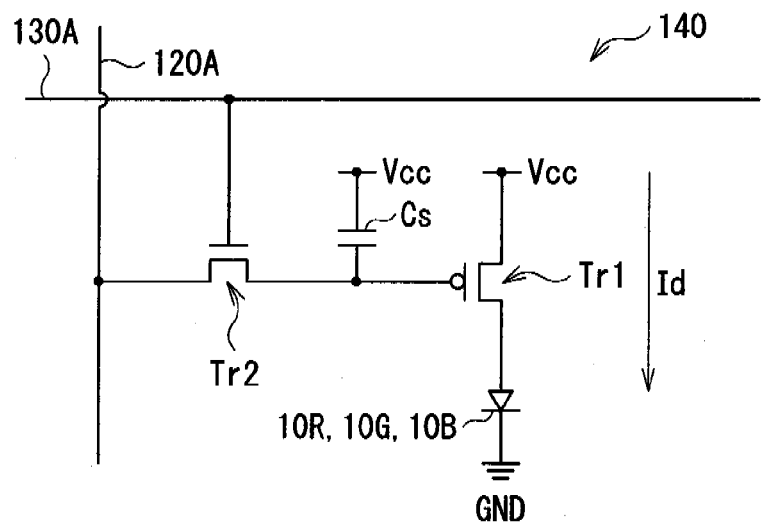
FIG. 2 is a diagram showing an example of a pixel driving circuit shown in FIG. 1.

In the display region 110, a pixel driving circuit 140 is formed. FIG. 2 shows an example of the pixel driving circuit 140. The pixel driving circuit 140 is formed in a layer lower than a first electrode 15 described later. The pixel driving circuit 140 is an active driving circuit having a driving transistor Tr1, a writing transistor Tr2, a capacitor (retention volume) Cs between the driving transistor Tr1 and the writing transistor Tr2, and the organic light emitting device 10R (or 10G, 10B) serially connected to the driving transistor Tr1 between a first power line (Vcc) and a second power line (GND). The driving transistor Tr1 and the writing transistor Tr2 are formed of a general thin film transistor (TFT (Thin Film Transistor)). The structure thereof is not particularly limited, and may be, for example, inverted staggered type (so-called bottom gate type) or co-planer type (top gate type).

In the pixel driving circuit 140, a plurality of signal lines 120A are arranged in the column direction, and a plurality of scanning lines 130A are arranged in the line direction. Each cross point between each signal line 120A and each scanning line 130A corresponds to one of the organic light emitting devices 10R, 10G and 10B (sub pixel). Each signal line 120A is connected to the signal line driving circuit 120. An image signal is supplied to a source electrode of the writing transistor Tr2 from the signal line driving circuit 120 via the signal line 120A. Each scanning line 130A is connected to the scanning line driving circuit 130. A scanning signal is sequentially supplied to a gate electrode of the writing transistor Tr2 from the scanning line driving circuit 130 via the scanning line 130A.

Figure 3:
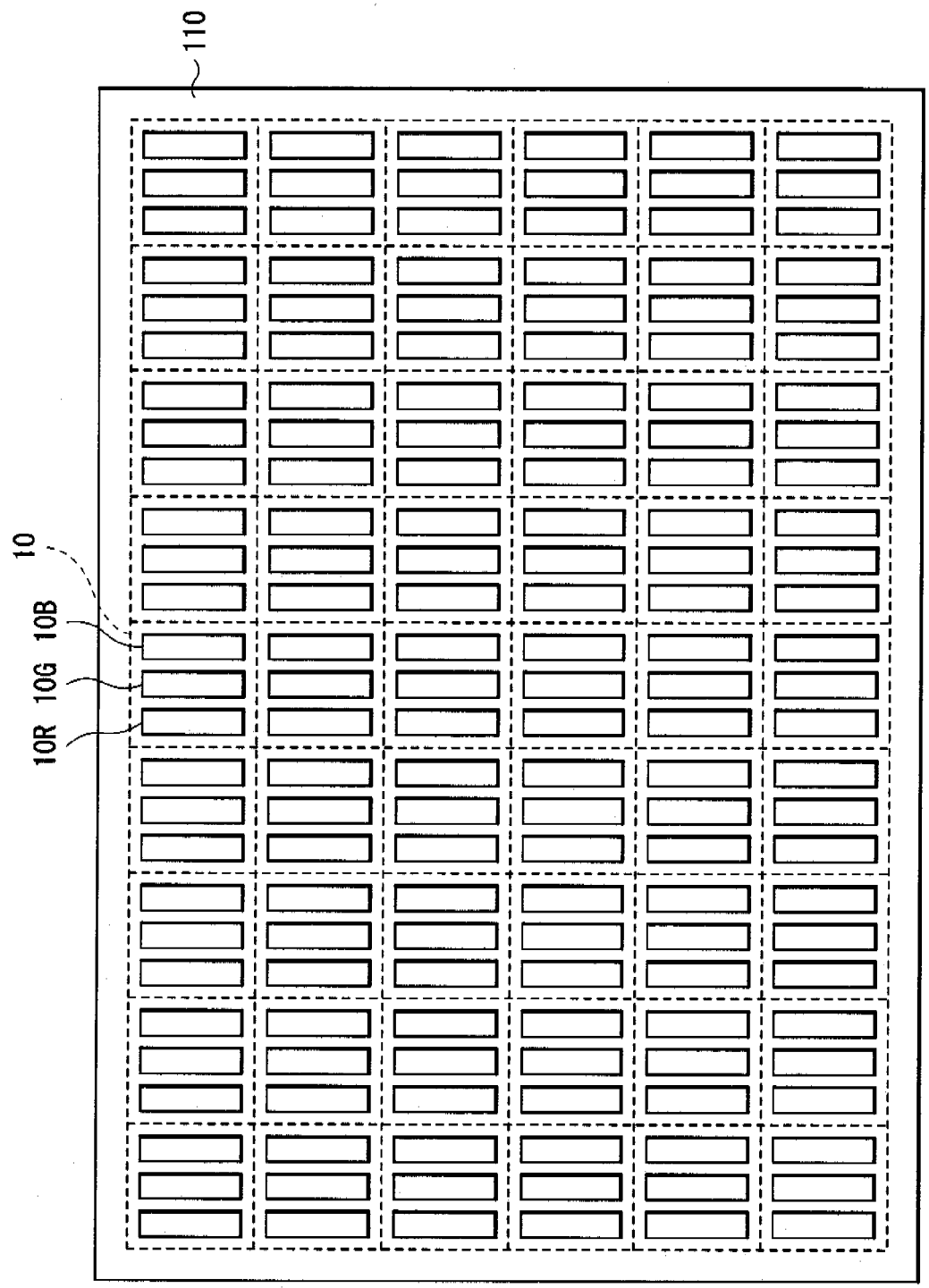
FIG. 3 is a plan view showing a structure of a display region shown in FIG. 1.

FIG. 3 shows an example of a plane structure of the display region 110. In the display region 110, the organic light emitting device 10R generating red light, the organic light emitting device 10G generating green light, and the organic light emitting device 10B generating blue light are sequentially provided in a matrix state as a whole. A combination of the organic light emitting devices 10R, 10G and 10B adjacent to each other forms one pixel 10.

Figure 4:
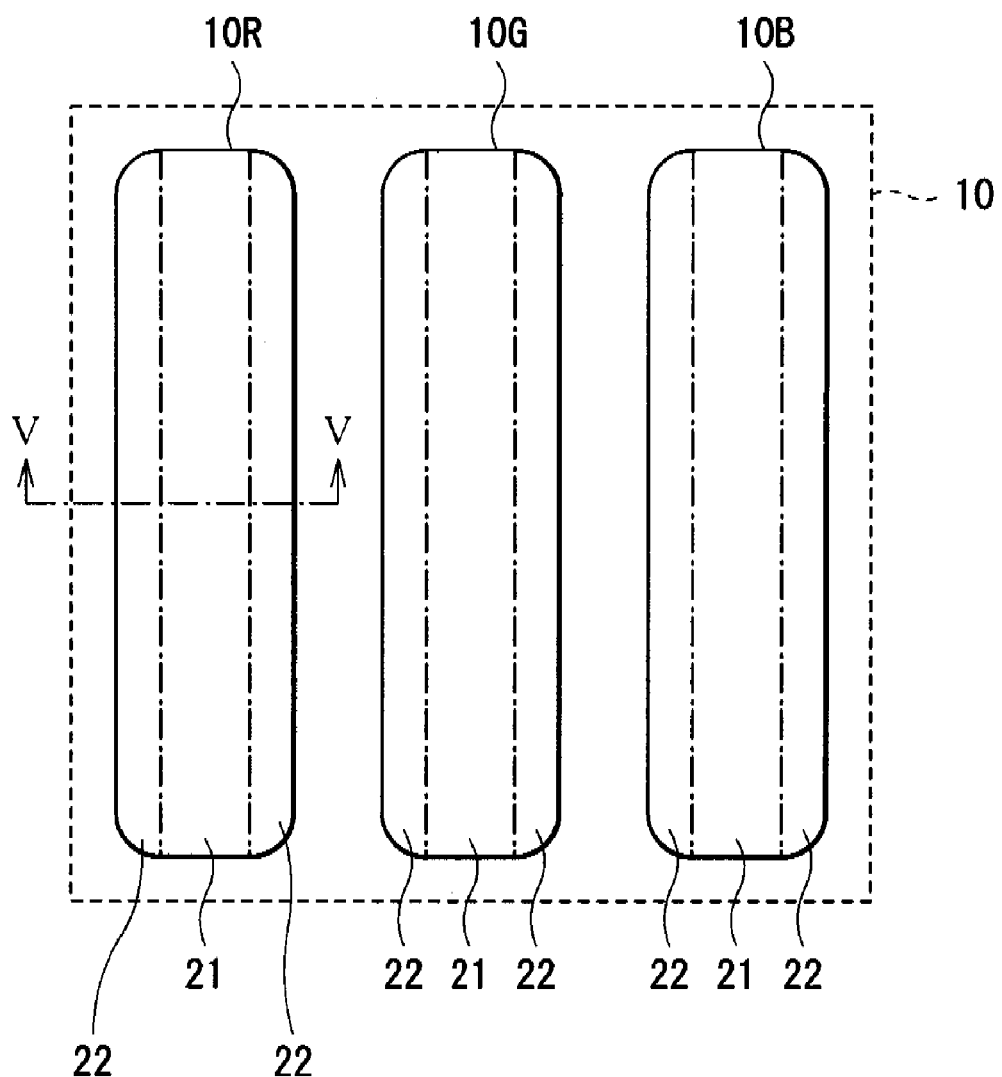
FIG. 4 is a plan view showing a structure of an organic light emitting device shown in FIG. 3.
Figure 5:
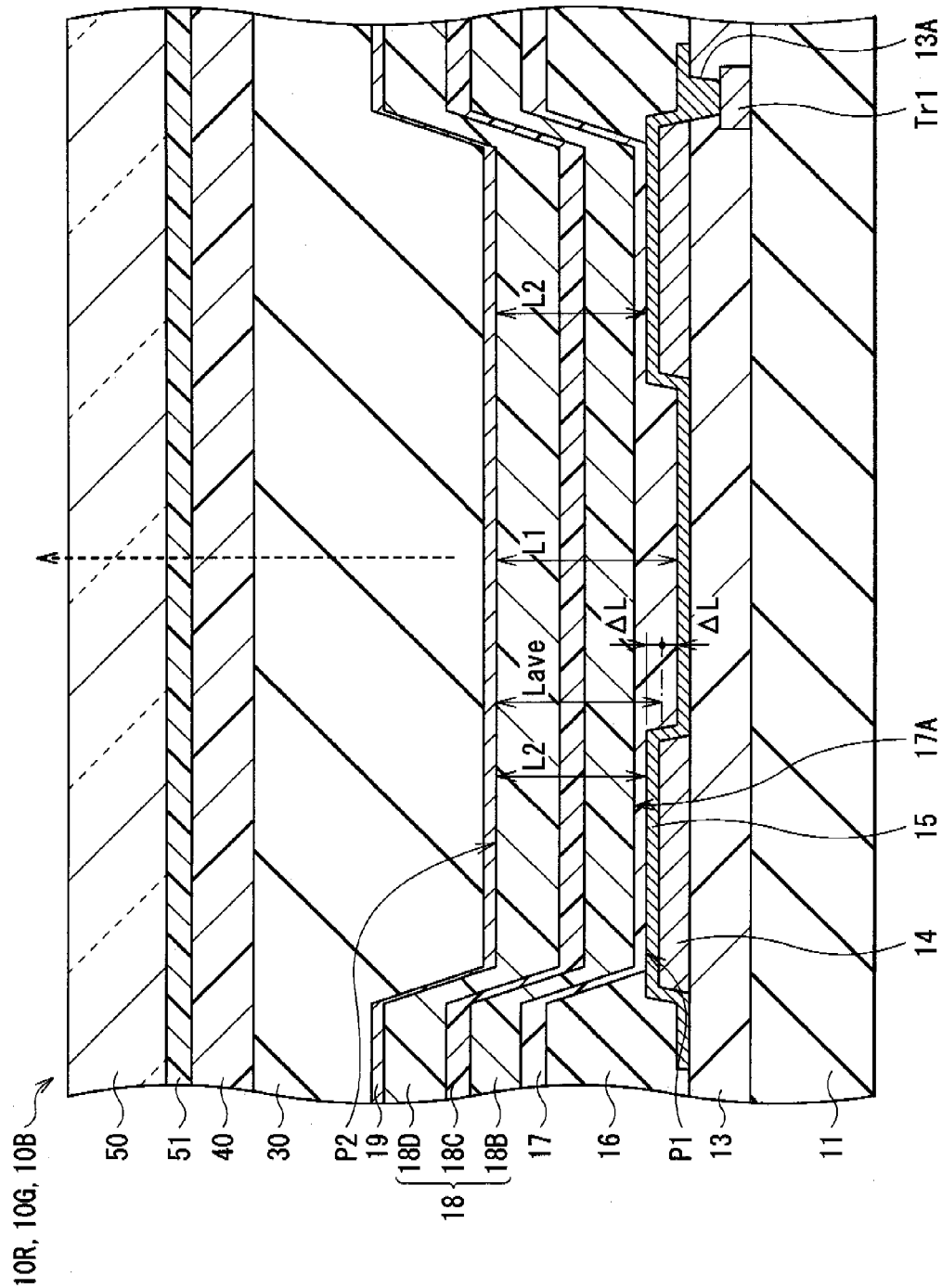
FIG. 5 is a cross sectional structure showing a structure of the organic light emitting device shown in FIG. 3.

FIG. 4 shows a plane structure of the organic light emitting devices 10R, 10G and 10B shown in FIG. 3. FIG. 5 shows a cross sectional structure common to the organic light emitting devices 10R, 10G and 10B. In the organic light emitting devices 10R, 10G and 10B, the foregoing driving transistor Tr1 of the pixel driving circuit 140, a planarizing insulating film 13, a step forming layer 14, the first electrode 15 as an anode, an interelectrode insulting film 16, a distance adjustment layer 17, an organic layer 18 including a light emitting layer 18C described later, and a second electrode 19 as a cathode are layered in this order from the substrate 11 side. The light emitting layer 18C is divided into, for example, a first region 21 in the central portion and a second region 22 in the right and left portions in the plane shape.

The organic light emitting devices 10R, 10G and 10B as above are coated with a protective film 30 made of silicon nitride (SiNx) or the like. Further, a sealing substrate 50 made of glass or the like is bonded to the protective film 30 with an adhesive layer 40 in between over the whole area, and thereby the organic light emitting devices 10R, 10G and 10B are sealed.

In the organic light emitting devices 10R, 10G and 10B, the first electrode 15 has a function as a reflective layer, and the second electrode 19 has a function as a semi-transparent reflective layer. The first electrode 15 and the second electrode 19 form a resonator structure to resonate light generated in the light emitting layer 18C.

That is, the organic light emitting devices 10R, 10G and 10B have the resonator structure in which the light generated in the light emitting layer 18C is resonated and extracted from a second end P2 side, by setting an end face of the first electrode 15 on the light emitting layer 18C side as a first end P1, setting an end face of the second electrode 19 on the light emitting layer 18C side as the second end P2, and setting the organic layer 18 as a resonant portion. When the organic light emitting elements 10R, 10G and 10B have such a resonator structure, the light generated in the light emitting layer 18C generates multiple interference, and operates as a kind of a narrow band filter, so that the half bandwidth of a spectrum of light to be extracted is decreased and the color purity can be improved. Further, outside light that enters from the sealing panel 50 side can be also attenuated by the multiple interference, and the reflectance of the outside light in the organic light emitting devices 10R, 10G and 10B can be extremely lowered by combining a color filter 51 described later or a wave plate and a polarization plate (not shown).

The driving transistor Tr1 is electrically connected to the first electrode 15 through a connection hole 13A provided in the planarizing insulating film 13.

The planarizing insulating film 13 is intended to planarize a surface of the substrate 11 formed with the pixel driving circuit 140. Since the fine connection hole 13A is formed in the planarizing insulating film 13, the planarizing insulating film 13 is preferably made of a material with the favorable pattern precision. As a component material of the planarizing insulating film 13, for example, an organic material such as polyimide, an inorganic material such as silicon oxide ($SiO_2$) or the like can be cited.

The step forming layer 14 is formed only in the second region 22 over the substrate 11 and is used for forming a step shape on the end face of the first electrode 15 on the light emitting layer 18C side. The step forming layer 14 is made of, for example, a simple substance or an alloy of metal elements such as aluminum (Al), molybdenum (Mo), titanium (Ti), chromium (Cr), gold (Au), platinum (Pt), nickel (Ni), copper (Cu), tungsten (W), and silver (Ag). Further, the step forming layer 14 may be formed of an insulating film such as silicon oxide ($SiO_2$) and silicon nitride ($SiN_x$).

Since the first electrode 15 also has the function as the reflective layer, the first electrode 15 desirably has the high reflectance as long as possible to improve the light emitting efficiency. The first electrode 15 has, for example, the thickness in the lamination direction (hereinafter simply referred to as thickness) from 100 nm to 1000 nm, and is made of a simple substance or an alloy of metal elements such as chromium (Cr), gold (Au), platinum (Pt), nickel (Ni), copper (Cu), tungsten (W), and silver (Ag). Part of the first electrode 15 in the second region 22 is formed on the step forming layer 14. Thereby, the end face of the first electrode 15 on the light emitting layer 18C side, that is, the first end P1 of the foregoing resonator structure has a step shape corresponding to the step forming layer 14.

The interelectrode insulating film 16 secures insulation between the first electrode 15 and the second electrode 19, and is used for accurately obtaining a desired shape of the light emitting region including the first region 21 and the second region 22. For example, the interelectrode insulting film 16 is made of a photosensitive resin. The interelectrode insulating film 16 is provided with an opening corresponding to the light emitting region. Though the organic layer 18 and the second electrode 19 are continuously provided over the interelectrode insulating film 16 in addition to over the first region 21 and the second region 22, light is emitted only from the opening of the interelectrode insulating film 16.

The distance adjustment layer 17 changes the optical distance between the first end P1 and the second end P2 according to the step shape. The distance adjustment layer 17 fills in the step shape of the first electrode 15, and has a flat surface 17A on the second electrode 19 side. That is, when the distance adjustment layer 17 is provided, the second end P2 is planarized, and the optical distance L1 between the first end P1 and the second end P2 of the resonator in the first region 21 (hereinafter simply referred to as "optical distance L1 in the first region 21") is different from the optical distance L2 between the first end P1 and the second end P2 of the reso-nator in the second region 22 (hereinafter simply referred to as "optical distance L2 in the second region 22"). Thereby, in the organic light emitting devices 10R, 10G and 10B, the resonant wavelength (peak wavelength of the spectrum of light to be extracted) of the resonator in the first region 21 is different from that in the second region 22, the half bandwidth of a spectrum obtained by synthesizing each spectrum of the light to be extracted respectively from the first region 21 and the second region 22 is widened, and thus the view angle characteristics can be improved.

To that end, the optical distance L1 in the first region 21 and the optical distance L2 in the second region 22 preferably satisfy Mathematical formula 1.

$L1 = L_{ave} + \Delta L$ $L2 = L_{ave} - \Delta L$ $(2L_{ave})/\lambda + \Phi/(2\pi) = m$          Mathematical formula 1

In the formula, $L_{ave}$ represents the average optical distance of the optical distance L1 in the first region 21 and the optical distance L2 in the second region 22, $\Phi$ represents the sum of the phase shift $\Phi_1$ of the reflected light generated at the first end P1 and the phase shift $\Phi_2$ of the reflected light generated at the second end P2 ($\Phi = \Phi_1 + \Phi_2$) (rad), $\lambda$ represents the peak wavelength of the spectrum of the light desired to be extracted from the second end P2 side, and m represents an integer number when $L_{ave}$ becomes positive. In Mathematical formula 1, the unit used for L1, L2, $L_{ave}$, and $\lambda$ should be common, for example, nm is used.

In Mathematical formula 1, the third formula for the average optical distance $L_{ave}$ is for matching the resonant wavelength (peak wavelength of the spectrum of light to be extracted) of the resonator with the peak wavelength of the spectrum of the light desired to be extracted, and to maximize the light extraction efficiency. In reality, for the average optical distance $L_{ave}$, m of the third formula of Mathematical formula 1 is preferably 0 or 1.

As evidenced by Mathematical formula 1, in this embodiment, even when the order m is identical, the optical distance L1 in the first region 21 can be different from the optical distance L2 in the second region 22. Therefore, for example, where m is 1, it is possible to increase the thickness of the organic layer 18, thereby decreasing non-light emitting defect. In the result, both improvement of productivity and favorable view angle characteristics can be achieved. On the contrary, in the related art, Japanese Unexamined Patent Application Publication No. 2006-32327, the order m is respectively set to, for example, 0 and 1 to provide a difference between the respective optical distances. Therefore, the organic layer in the region of m=0 becomes thinner than that in the region of m=1, leading to easily increasing the non-light emitting defect or the like. Further, the difference of the optical distances between the case of m=0 and the case of m=1 (|L2−L1|) is large, for example, about 120 nm in the case of blue by converting to the thickness of ITO (Indium Tin Oxide) and the organic layer. Therefore, compared to the case that the order m is identical, the process to form the step shape has been more difficult.

$\Delta L$ in the first formula and the second formula of Mathematical formula 1 is preferably within 5% of the average optical distance $L_{ave}$, and more preferably within 2% to 5%. When $\Delta L$ is larger than 5%, the light extraction efficiency may be largely decreased. Meanwhile, when $\Delta L$ is smaller than 2%, it is difficult to obtain sufficient effects.

Figure 6:
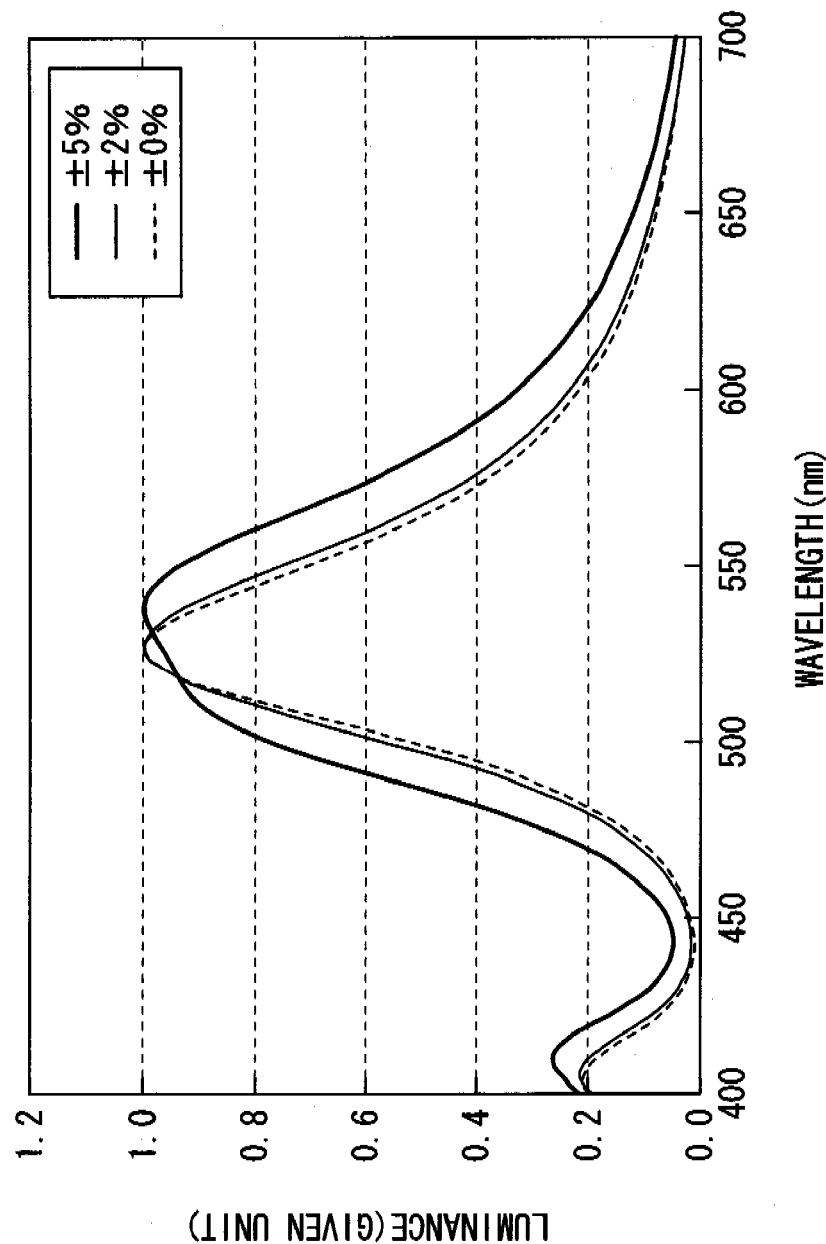
FIG. 6 is a diagram showing a spectrum of a resonator filter when $\Delta L$ is changed.

FIG. 6 shows a spectrum obtained by synthesizing spectrums of respective resonator filters in the first region 21 and the second region 22 when ΔL is changed under conditions that Mathematical formula 1 is established where m is 1. The organic light emitting device has a structure in which a hole injection layer being 95 nm thick, a hole transport layer being 95 nm thick, a light emitting layer being 25 nm thick generating green light, an electron transport layer being 20 nm thick, and the second electrode being 8 nm thick are sequentially layered over the first electrode 15. The area ratio between the first region 21 and the second region 22 is 1:1, and the peak wavelength λ of the spectrum of the light desired to be extracted is 530 nm.

As shown in FIG. 6, when the ΔL is within ±5% of the average optical distance $L_{ave}$, the half bandwidth of the synthesized spectrum is wider than the case that the ΔL is within ±0% of the average optical distance $L_{ave}$, that is, the case that the optical distance L1 in the first region 21 and the optical distance L2 in the second region 22 are equal, or the case that the ΔL is within ±2% of the average optical distance $L_{ave}$. That is, it is found that the resonator effects are modified.

Figure 7:
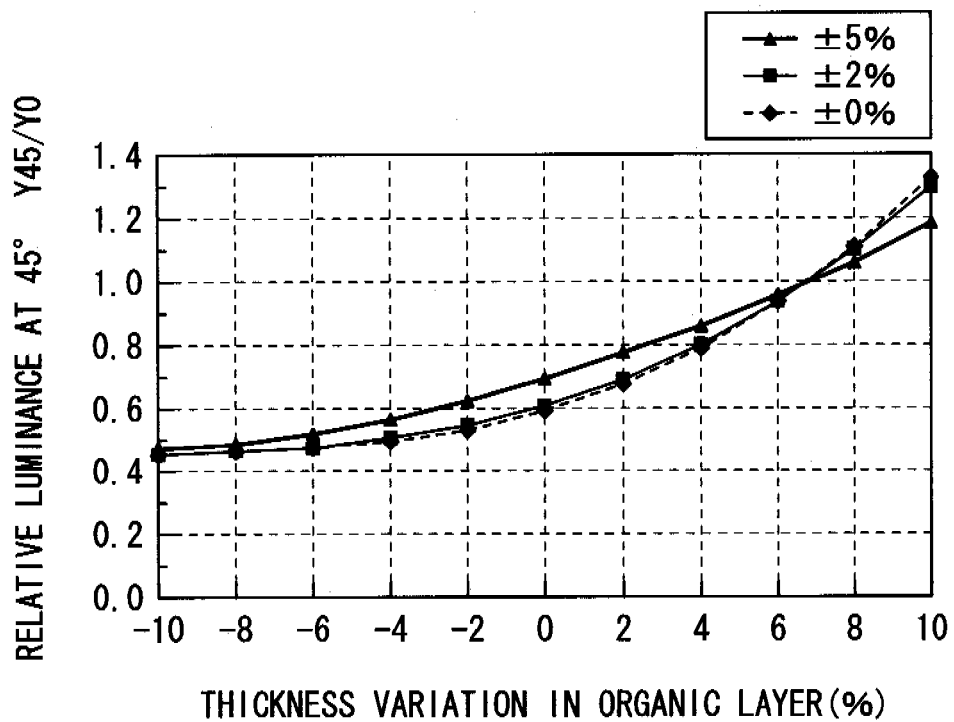
FIG. 7 is a diagram showing luminance change based on the view angle when $\Delta L$ is changed.
Figure 8:
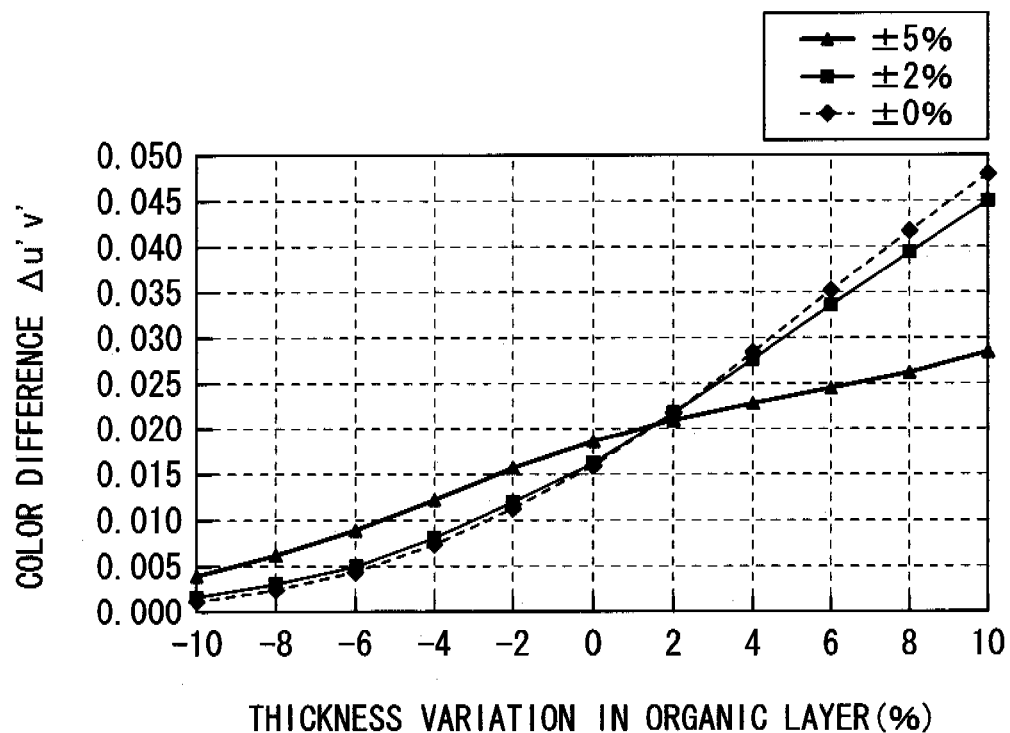
FIG. 8 is a diagram showing the color difference $\Delta u'v'$ based on the view angle when $\Delta L$ is changed.

FIG. 7 and FIG. 8 respectively show a relation between the relative luminance in the case that the screen is viewed at an angle of 45 deg (view angle: 45 deg) with respect to the case that the screen is viewed from the front (field angle: 0 deg) and the thickness variation in the organic layer 18, and a relation between the color difference Δu'v' and the thickness variation in the organic layer 18 when ΔL is changed under conditions that Mathematical formula 1 is established where m is 1. The structure of the organic light emitting device, the area ratio between the first region 21 and the second region 22, and the peak wavelength λ of the spectrum of the light desired to be extracted are the same as those of the case shown in FIG. 6.

As shown in FIG. 7, when the ΔL is within ±5% of the average optical distance $L_{ave}$, the luminance change due to the view angle is smaller than the case that the ΔL is within ±0% of the average optical distance $L_{ave}$ or the case that the ΔL is within ±2% of the average optical distance $L_{ave}$. Further, as shown in FIG. 8, when the ΔL is within ±5% of the average optical distance $L_{ave}$, the maximum value of the color difference Δu'v' is decreased in the range that the thickness variation in the organic layer 18 is 2% or more. That is, it is found that the view angle characteristics can be improved.

Though the case of m=1 has been described in FIG. 6 to FIG. 8, similar effects can be obtained when m is other value including 0.

Figure 9:
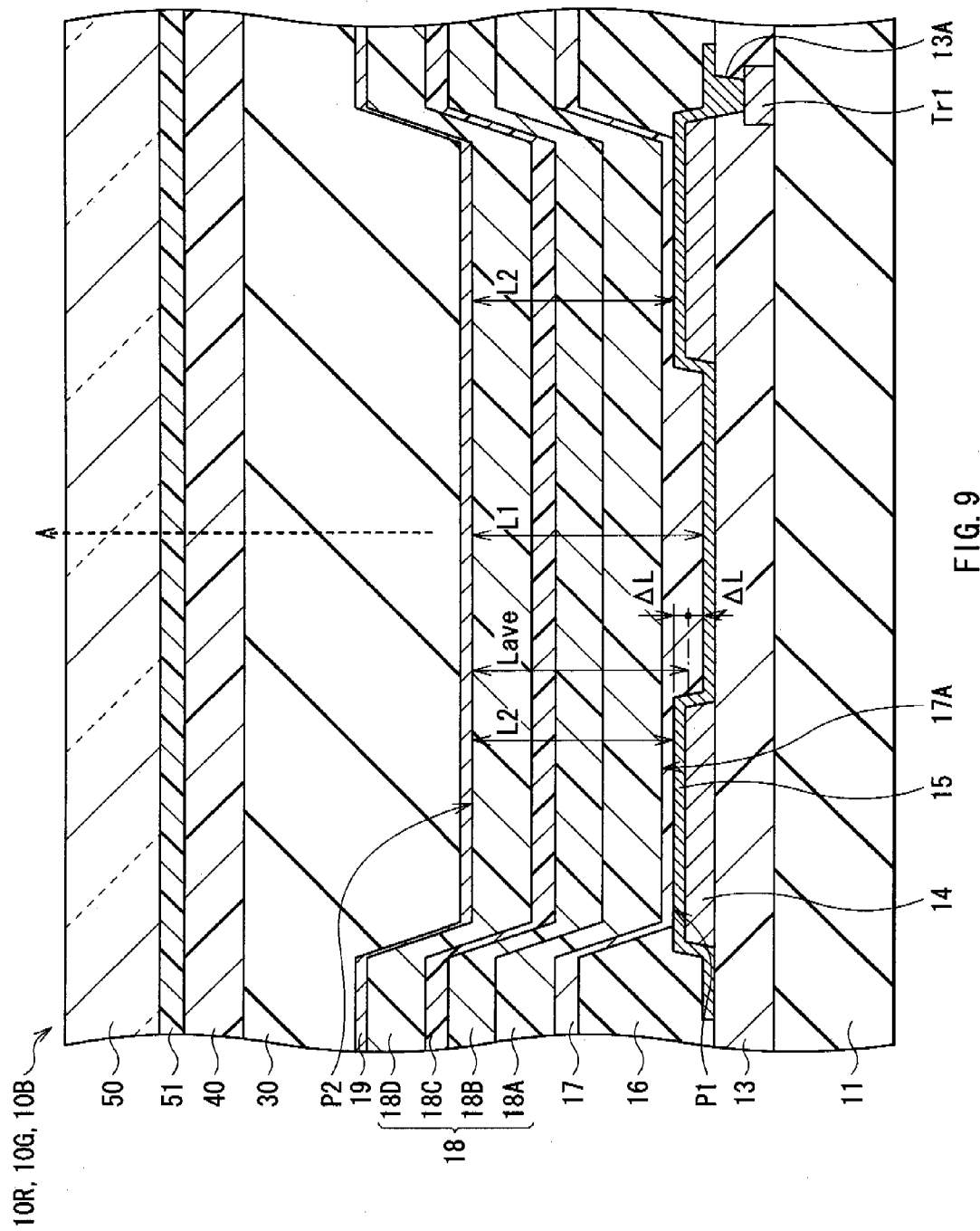
FIG. 9 is a cross section showing another structure of the organic light emitting device shown in FIG. 5.

The distance adjustment layer 17 may be provided between the first electrode 15 and the second electrode 19. The position and the component material are not particularly limited. However, for example, the distance adjustment layer 17 is preferably provided between the first electrode 15 and the organic layer 18, and is preferably made of the same material as that of a hole injection layer 18A of the organic layer 18 described later. Thereby, the distance adjustment layer 17 can also function as the hole injection layer 18A. Otherwise, the distance adjustment layer 17 may be provided between the hole injection layer 18A of the organic layer 18 and the light emitting layer 18C of the organic layer 18, made of the same organic material as that of a hole transport layer 18B, and function as the hole transport layer 18B. Further, as shown in FIG. 9, the distance adjustment layer 17 may be provided separately from the hole injection layer 18A or the hole transport layer 18B.

The organic layer 18 shown in FIG. 5 has, a structure for example, in which the hole injection layer 18A, the hole transport layer 18B, the light emitting layer 18C, and an electron transport layer 18D are layered from the first electrode 15 side. Of the foregoing layers, the layers other than the light emitting layer 18C may be provided according to needs.

Further, the organic layer 18 may have a structure varied according to the light emitting color of the organic light emitting devices 10R, 10G and 10B. The hole injection layer 18A is for improving the electron hole injection efficiency and functions as a buffer layer to prevent leakage. The electron transport layer 18B is for improving efficiency to transport electrons into the light emitting layer 18C. The light emitting layer 18C is for generating light due to electron-hole recombination by applying the electric field. The electron transport layer 18D is for improving efficiency to transport electrons into the light emitting layer 18C. It is possible to provide an electron injection layer (not shown) made of LiF, $Li_2O$ or the like between the electron transport layer 18D and the second electrode 19.

The hole injection layer 18A of the organic light emitting device 10R is, for example, from 5 nm to 300 nm thick, and is made of 4,4', 4"-tris(3-methylphenylamino)triphenyl amine (m-MTDATA) or 4,4', 4"-tris(2-naphthylphenylamino)triphenyl amine (2-TNATA). The hole transport layer 18B of the organic light emitting device 10R is, for example, from 5 nm to 300 nm thick, and is made of bis[(N-naphthyl)-N-phenyl] benzidine (α-NPD). The light emitting layer 18C of the organic light emitting device 10R is, for example, from 10 nm to 100 nm thick, and is made of a material in which 40 volume % of 2,6-bis [4-[N-(4-metoxyphenyl)-N-phenyl]aminostyril] naphthalene-1,5-dicarbonitrile (BSN-BCN) is mixed with 8-quinolinol aluminum complex ($Alq_3$). The electron transport layer 18D of the organic light emitting device 10R is, for example, from 5 nm to 300 nm thick, and is made of $Alq_3$.

The hole injection layer 18A of the organic light emitting device 10G is, for example, from 5 nm to 300 nm thick, and is made of m-MTDATA or 2-TNATA. The hole transport layer 18B of the organic light emitting device 10G is, for example, from 5 nm to 300 nm thick, and is made of α-NPD. The light emitting layer 18C of the organic light emitting device 10G is, for example, from 10 nm to 100 nm thick, and is made of a material in which 3 volume % of coumarin 6 is mixed with $Alq_3$. The electron transport layer 18D of the organic light emitting device 10G is, for example, from 5 nm to 300 nm thick, and is made of $Alq_3$.

The hole injection layer 18A of the organic light emitting device 10B is, for example, from 5 nm to 300 nm thick, and is made of m-MTDATA or 2-TNATA. The hole transport layer 18B of the organic light emitting device 10B is, for example, from 5 nm to 300 nm thick, and is made of α-NPD. The light emitting layer 18C of the organic light emitting device 10B is, for example, from 10 nm to 100 nm thick, and is made of spiro 6Φ. The electron transport layer 18D of the organic light emitting device 10B is, for example, from 5 nm to 300 nm thick, and is made of $Alq_3$.

The second electrode 19 shown in FIG. 5 is, for example, from 5 nm to 50 nm thick, and is made of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable.

The adhesive layer 40 shown in FIG. 5 is, for example, made of a thermosetting resin or an ultraviolet curable resin.

The sealing substrate 50 shown in FIG. 5 is located on the second electrode 19 side of the organic light emitting devices 10R, 10G and 10B. The sealing substrate 50 seals the organic light emitting devices 10R, 10G and 10B together with the adhesive layer 40 and is made of a material such as glass transparent to light generated in the organic light emitting devices 10R, 10G and 10B. The sealing substrate 50 is, for example, provided with the color filter 51 and extracts the light generated in the organic light emitting devices 10R, 10G and 10B, absorbs outside light reflected by the organic light emitting devices 10R, 10G and 10B and the wirings therebetween, and improves the contrast.

Though the color filter 51 may be provided on either side of the sealing substrate 50, the color filter 51 is preferably provided on the organic light emitting devices 10R, 10G and 10B side. Thereby, the color filter 51 is not exposed on the surface and can be protected by the adhesive layer 40. In addition, in this case, the distance between the light emitting layer 18C and the color filter 51 is reduced. Thereby, it is possible to prevent the light emitted from the light emitting layer 18C from entering the color filter 51 of other color and generating mixed color. The color filter 51 has a red filter, a green filter, and a blue filter (not shown). The red filter, the green filter, and the blue filter are sequentially arranged according to the organic light emitting devices 10R, 10G and 10B.

The red filter, the green filter, and the blue filter are, for example, respectively rectangle, and formed with no space in between. The red filter, the green filter, and the blue filter are respectively made of a resin mixed with a pigment. The red filter, the green filter, and the blue filter are adjusted so that the light transmittance in the targeted red, green, or blue wavelength band becomes high and the light transmittance in the other wavelength bands becomes low by selecting the pigment.

Further, a wavelength range with the high transmittance in the color filter 51 corresponds with the peak wavelength $\lambda$ of the spectrum of the light desired to be extracted from the resonator structure. Thereby, among the outside light entering from the sealing substrate 50, only the light having the wavelength equal to the peak wavelength $\lambda$ of the spectrum of the light desired to be extracted passes the color filter 51, and other outside light having other wavelength is prevented from entering the organic light emitting devices 10R, 10G and 10B.

The display unit can be manufactured, for example, as follows.

FIG. 10A to FIG. 12 show a method of manufacturing the display unit in the order of steps. First, as shown in FIG. 10A, the pixel driving circuit 140 including the driving transistor Tr1 is formed on the substrate 11 made of the foregoing material. After that, the planarizing insulating film 13 is formed by, for example, coating the whole area with a sensitive resin. Then, the planarizing insulating film 13 is patterned in a given shape by providing exposure and development. In addition, the connection hole 13A is formed and fired.

Next, as shown in FIG. 10B, the step forming layer 14 made of the foregoing material is formed by, for example, sputtering method. Subsequently, a resist pattern (not shown) is formed on the step forming layer 14 by using lithography method. The step forming layer 14 is selectively removed by wet etching with the use of the resist pattern as a mask. Thereby, the step forming layer 14 is formed only in the second region 22.

After that, as shown in FIG. 11A, the first electrode 15 made of the foregoing material is formed by, for example, sputtering method. Then, the first electrode 15 is selectively removed by wet etching and separated according to each organic light emitting device, 10R, 10G and 10B. Thereby, the step shape as shown in FIG. 5 is formed on the top face of the first electrode 15.

After the first electrode 15 is formed, as shown in FIG. 11A, coating is made with a photosensitive resin over the whole area of the substrate 11, and for example, photolithography is made to provide an opening corresponding to the light emitting region including the first region 21 and the second region 22. The resultant is fired to form the interelectrode insulating film 16.

Figure 12:
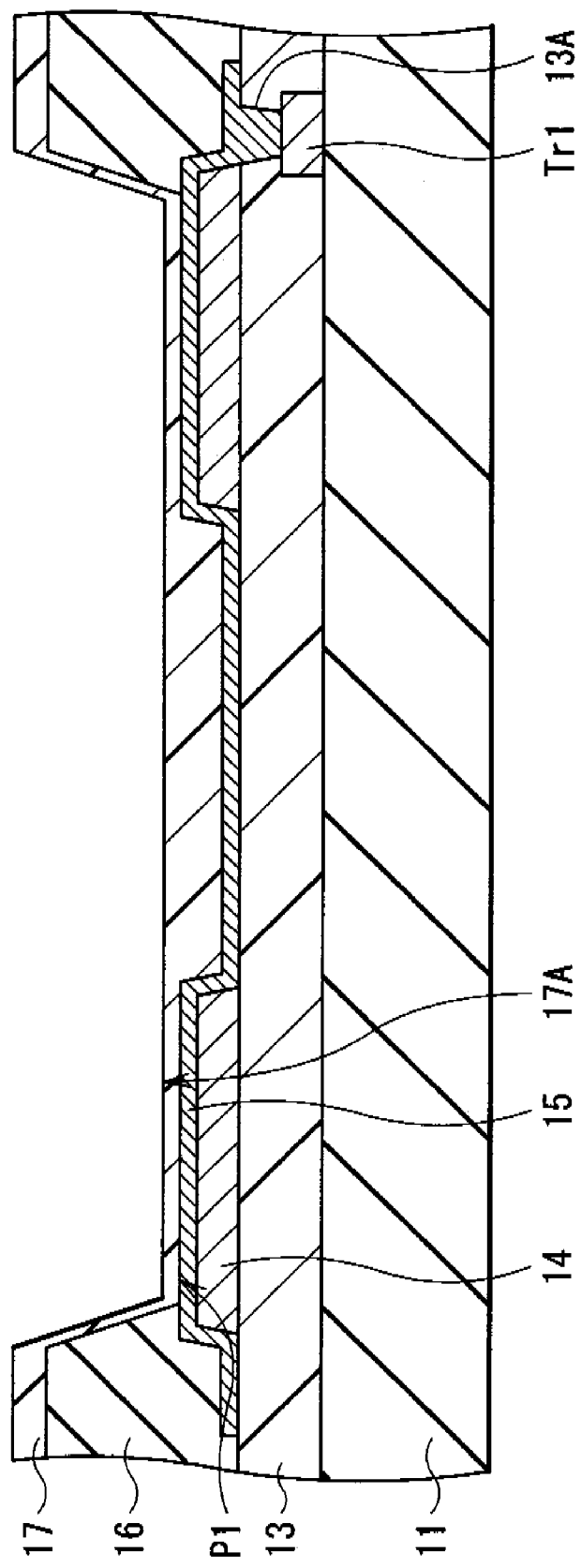
FIG. 12 is a cross section showing a step following FIG. 11B.

After the interelectrode insulating film 16 is formed, as shown in FIG. 11B, the distance adjustment layer 17 made of the foregoing material is formed on the first electrode 15 by, for example, vacuum vapor deposition method. The distance adjustment layer 17 is heated to temperatures equal to or more than the glass transition point of the component material. Thereby, as shown in FIG. 12, the step shape of the first electrode 15 is filled in by the distance adjustment layer 17, and the top face 17A is planarized.

After the distance adjustment layer 17 is formed, the hole injection layer 18A, the hole transport layer 18B, the light emitting layer 18C, the electron transport layer 18D, and the second electrode 19 that have the foregoing thickness and are made of the foregoing material are sequentially formed by, for example, vapor deposition method to form the organic light emitting devices 10R, 10G, and 10B as shown in FIG. 5. Since the step shape of the first electrode 15 has been filled in by the distance adjustment layer 17 and the top face 17A has been planarized, the end face of the second electrode 19 on the light emitting layer 18C side, that is, the second end P2 is planarized. Subsequently, the protective film 30 made of the foregoing material is formed on the organic light emitting devices 10R, 10G and 10B.

Further, for example, the sealing substrate 50 made of the foregoing material is coated with a material of the red filter by spin coat method or the like, the resultant is patterned by photolithography technology and fired, and thereby the red filter is formed. Subsequently, as in the red filter, the blue filter and the green filter are sequentially formed.

After that, the adhesive layer 40 is formed on the protective film 30, and the sealing substrate 50 is bonded to the protective film 30 with the adhesive layer 40 in between. Then, the face of the sealing substrate 50 formed with the color filter 51 is preferably arranged on the organic light emitting devices 10R, 10G and 10B side. Consequently, the display unit shown in FIG. 3 is completed.

In the display unit obtained as above, a scanning signal is supplied from the scanning line driving circuit 130 to each pixel via the gate electrode of the writing transistor Tr2. An image signal from the signal line driving circuit 120 is retained in the retention capacity Cs via the writing transistor Tr2. That is, the driving transistor Tr1 is on/off-controlled according to the signal retained in the retention capacity Cs. Thereby, the driving current Id is injected into the respective organic light emitting devices 10R, 10G and 10B. In the result, electron-hole recombination occurs, and thereby light is emitted. The light is multiply reflected between the first electrode 15 and the second electrode 19, and extracted through the second electrode 19, the color filter 51, and then the sealing substrate 50. In this embodiment, as shown in FIG. 5, the first end P1 of the resonator structure has the step shape. The step shape is filled in by the distance adjustment layer 17 and planarized, and thereby the second end P2 is planarized. In addition, the optical distance L1 in the first region 21 and the optical distance L2 in the second region 22 are different from each other. Therefore, the peak wavelength of the spectrum of the light to be extracted in the first region 21 is different from that in the second region 22. In the result, the spectrum of the light extracted in each device becomes a resultant obtained by synthesizing each spectrum. The half bandwidth of the spectrum thereof becomes wider than that in the existing case that the optical distance is identical over the entire device. That is, in this embodiment, the view angle characteristics are improved.

As above, in this embodiment, the first end P1 of the resonator structure has the step shape and the step shape is filled in by the distance adjustment layer 17 and planarized, and thereby the second end P2 is planarized. In addition, the optical distance L1 in the first region 21 and the optical distance L2 in the second region 22 are different from each other. Therefore, the peak wavelength of the spectrum of the light to be extracted from the first region 21 is different from that from the second region 22. In the result, the half bandwidth of the spectrum obtained by synthesizing each spectrum can be increased, and the view angle characteristics can be improved. Further, it is not necessary to form the structure for the transparent substrate such as a concave structure, a light diffusion layer, and a light refraction layer that may cause scattering of outside light. In the result, there is no risk to cause deterioration of the outside light contrast. Further, it is advantageous in the view of the manufacturing cost as well.

Furthermore, the transparent conductive film for adjusting the optical distance becomes unnecessary. In the result, there is no risk to cause non-light emitting defect or lowering of the aperture ratio. Further, the complexed patterning process for changing the thickness of the transparent conductive film is not needed, and thus it is advantageous in the view of the manufacturing cost. Therefore, it is possible to realize the display unit including the high-quality organic light emitting devices 10R, 10G and 10B by the simple structure and the simple steps.

Second Embodiment

Figure 13:
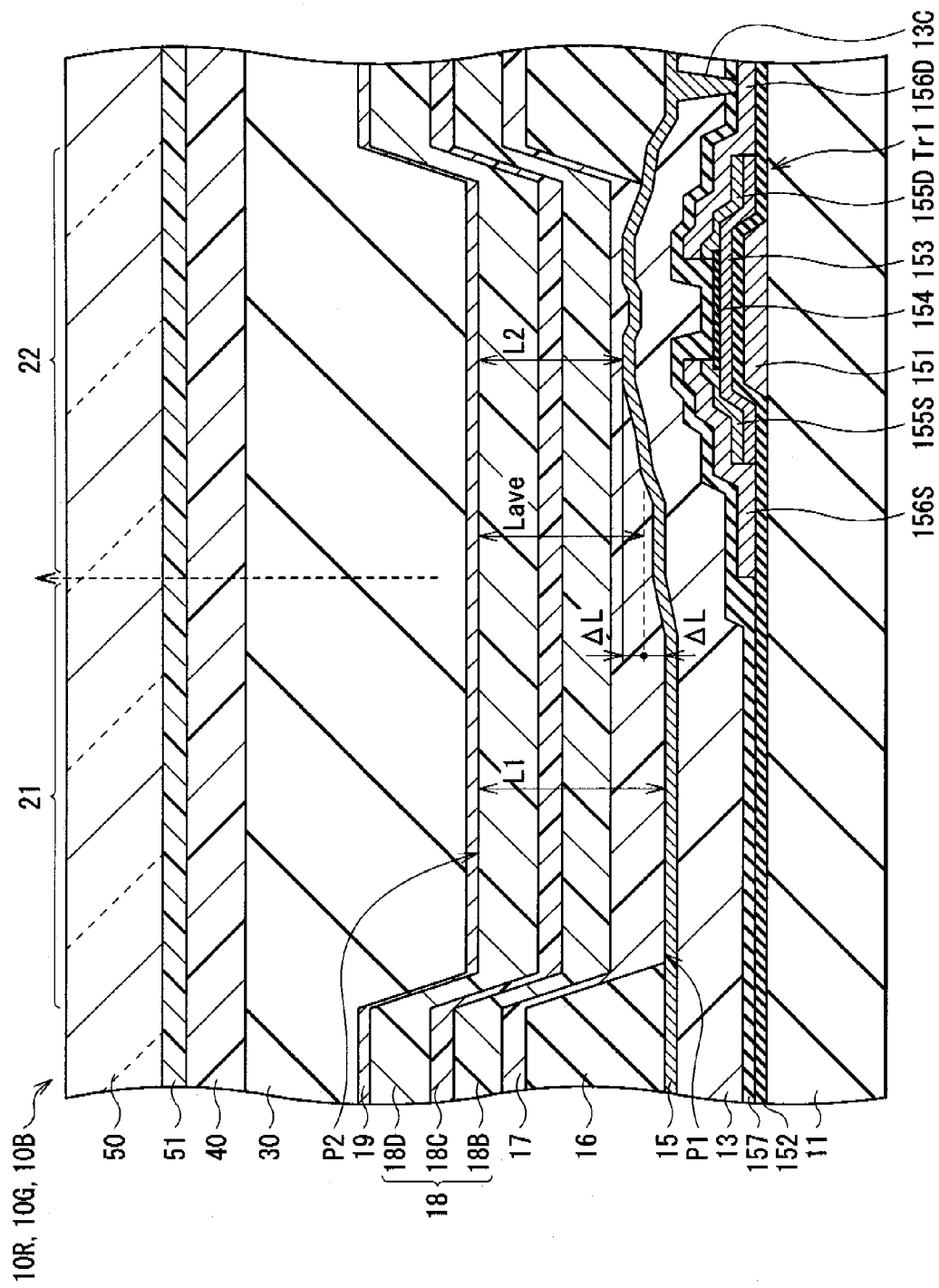
FIG. 13 is a cross section showing a structure of an organic light emitting device used for a display unit according to a second embodiment of the invention.

FIG. 13 shows a cross sectional structure of the organic light emitting devices 10R, 10G and 10B of a display unit according to a second embodiment of the invention. The organic light emitting devices 10R, 10G and 10B of the display unit according to the second embodiment is the same as those of the display unit described in the first embodiment, except that an arrangement relation between the driving transistor Tr1 of the pixel driving circuit 140 and the first electrode 15 is adjusted so that a step is formed on the interface of the first electrode 15 on the light emitting layer 18C side, and the step forming layer 14 is not provided. Therefore, a description will be given by affixing the same symbols to the same elements as those of the first embodiment.

The driving transistor Tr1 is provided in the second region 22 on the substrate 11. By providing a sufficient large step formed by the driving transistor Tr1, a step reflecting the driving transistor Tr1 is left on the surface of the planarizing insulating film 13. Thereby, the end face of the first electrode 15 on the light emitting layer 18C side, that is, the first end P1 of the resonator structure can have a step shape corresponding to the shape of the driving transistor Tr1. Except for this, the first electrode 15 is structured as in the first embodiment.

In FIG. 13, as the driving transistor Tr1, a driving transistor having inverted staggered type (so-called bottom gate type) is shown. In the driving transistor Tr1, for example, a gate electrode 151 made of a metal material such as molybdenum (Mo), aluminum (Al), and chromium (Cr) is provided on the substrate 11. A gate insulating film 152 made of silicon nitride or silicon oxide and a channel layer 153 made of a semiconductor thin film such as amorphous silicon are sequentially formed to cover the gate electrode 151. In the central region of the channel layer 153 above the gate electrode 151, an insulative channel protective film 154 is provided. In the both side regions of the channel layer 153 that are exposed from the channel protective film 154, a source electrode 155S and a drain electrode 155D made of an n-type semiconductor thin film such as n-type amorphous silicon are formed. The source electrode 155S and the drain electrode 155D are separated from each other by the channel protective film 154. The source electrode 155S and the drain electrode 155D are respectively formed with a source wiring 156S and a drain wiring 156D in which a titanium (Ti) layer, an aluminum (Al) layer, and a titanium (Ti) layer are sequentially layered. Further, the entire surface of the resultant is covered with a protective film 157 made of silicon nitride or the like. A structure of the driving transistor Tr1 of the co-planer type (so-called top gate type) driving transistor Tr1 is similar to that of the inverted staggered type, except that the lamination order of the elements are inversed as described above.

The optical distance L1 in the first region 21 and the optical distance L2 in the second region 22 preferably satisfy Mathematical formula 1 as in the first embodiment.

The display unit can be manufactured, for example, as follows.

First, the pixel driving circuit 140 is formed on the substrate 11. Then, the driving transistor Tr1 is formed in the second region 22. That is, the gate electrode 151 made of the foregoing material is formed by, for example, sputtering method, and a given pattern is formed by, for example, photolithography method and dry etching or wet etching. Next, the gate insulating film 152 made of the foregoing material is formed over the whole area of the substrate 11. Subsequently, the channel layer 153, the channel protective film 154, the source electrode 155S, the drain electrode 155D, the source wiring 156S, and the drain wiring 156D are sequentially formed in a given shape over the gate insulating film 152. After that, the entire surface of the resultant is covered with the protective film 157 made of the foregoing material, and thereby the driving transistor Tr1 is formed.

After the pixel driving circuit 140 including the driving transistor Tr1 is formed, as in the first embodiment, the planarizing insulating film 13, the first electrode 15, the interelectrode insulating film 16, the distance adjustment layer 17, the organic layer 18, and the second electrode 19 are sequentially formed, and the organic light emitting devices 10R, 10G and 10B are formed.

After that, the protective film 30 and the adhesive layer 40 are formed on the organic light emitting devices 10R, 10G and 10B, and the sealing substrate 50 provided with the color filter 51 is bonded thereto. Consequently, the display unit shown in FIG. 13 is completed.

The operation of the display unit is similar to that of the first embodiment.

As above, in this embodiment, by using the step formed by the driving transistor Tr1, the first end P1 of the resonator structure has the step shape corresponding to the shape of the driving transistor Tr1. Therefore, in addition to the effects similar to those of the first embodiment, there is an advantage that it is not necessary to form the step forming layer 14. In the result, the structure and the manufacturing steps can be more simplified.

In this embodiment, the description has been given of the case that the first electrode 15 is formed over the driving transistor Tr1 and thereby the first end P1 is provided with the step shape. However, instead of the driving transistor Tr1, it is possible that the first end P1 is provided with the step shape by an arrangement relation between the retention capacity Cs or the writing transistor Tr2 and the first electrode 15.

Further, it is possible that the wiring such as the signal line 120A, the scanning line 130A, and the power line is arranged in the second region 22 on the substrate 11, and the first electrode 15 is formed thereon. In this case, when the thickness of the wiring is thickened to further increase the step, the wiring resistance is lowered, and thus it is advantageous in the view of jumboizing the display unit. Otherwise, the wiring may be multilayered to further increase the step. In this case, the open area ratio can be improved, the current density flowing into the organic light emitting devices 10R, 10G and 10B can be decreased, and thus the life can be improved.

Further, it is possible that, when an auxiliary wiring is formed to lower the resistance of the second electrode 19, the first electrode 15 is formed on the auxiliary wiring and thereby the first end P1 is provided with the step shape.

Further, in addition to the driving transistor Tr1, the wiring, or the auxiliary wiring of this embodiment, the step forming layer 14 similar to that of the first embodiment may be formed on the planarizing insulating film 13.

Third Embodiment

Figure 14:
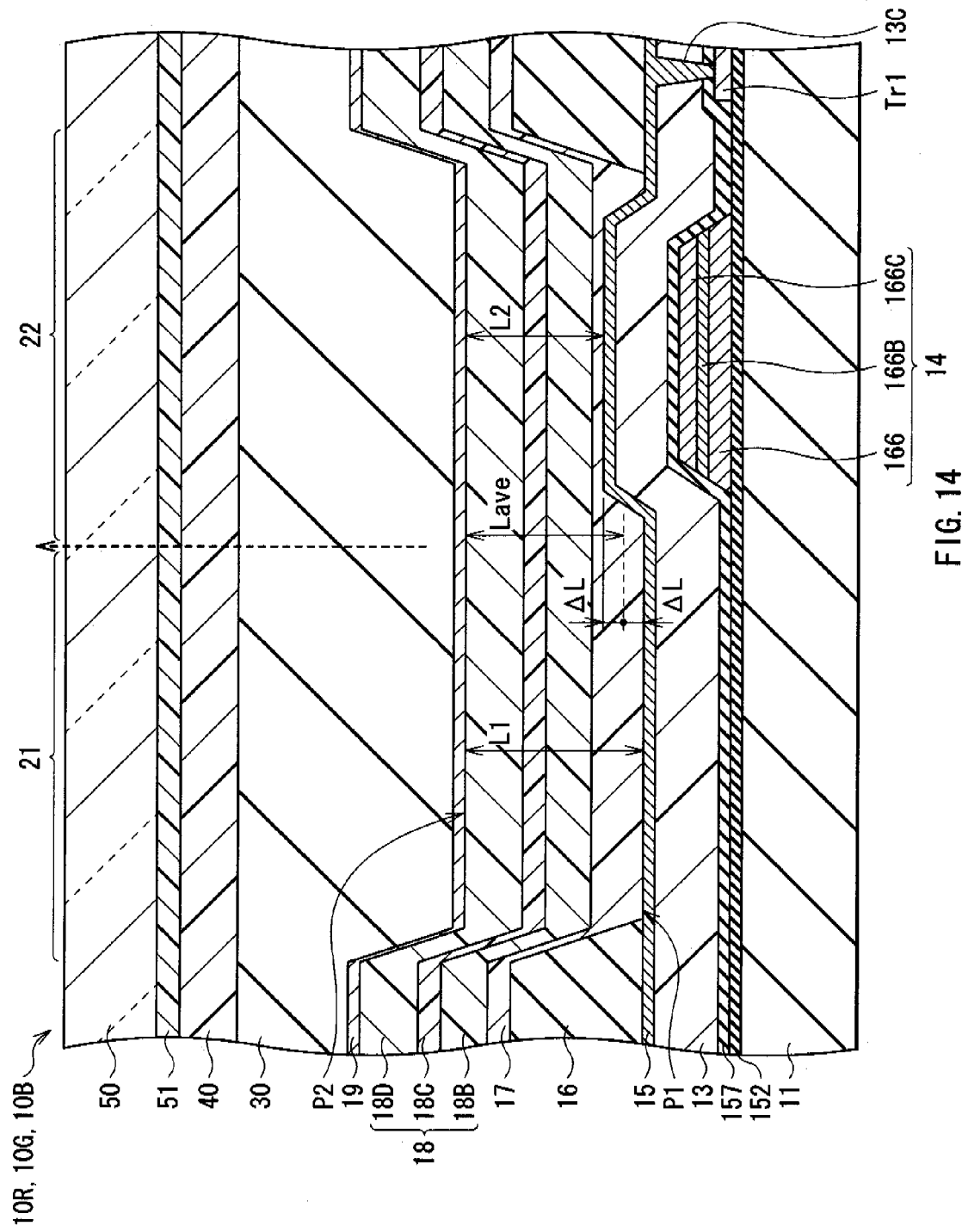
FIG. 14 is a cross section showing a structure of an organic light emitting device used for a display unit according to a third embodiment of the invention.

FIG. 14 shows a cross sectional structure of the organic light emitting devices 10R, 10G and 10B of a display unit according to a third embodiment of the invention. The organic light emitting devices 10R, 10G and 10B of the display unit according to the third embodiment are the same as those of the display unit described in the first embodiment, except that the step forming layer 14 is made of the same material as that of the driving transistor Tr1. Therefore, a description will be given by affixing the same symbols to the same elements as those of the first embodiment.

The step forming layer 14 is provided in the second region 22 on the substrate 11. The step forming layer 14 is made of the same material as that of the source wiring 156S and the drain wiring 156D of the driving transistor Tr1. That is, the step forming layer 14 has a structure in which a titanium (Ti) layer 166A, an aluminum (Al) layer 166B, a titanium (Ti) layer 166C, and the protective film 157 are layered in this order.

The first electrode 15 is formed over the step forming layer 14 with the planarizing insulating film 13 in between. By providing a sufficient large step formed by the step forming layer 14, a step reflecting the step forming layer 14 is left on the surface of the planarizing insulating film 13. Thereby, the end face of the first electrode 15 on the light emitting layer 18C side, that is, the first end P1 of the resonator structure can have a step shape corresponding to the shape of the driving transistor Tr1. Except for such a structure, the first electrode 15 is structured as in the first embodiment.

The optical distance L1 in the first region 21 and the optical distance L2 in the second region 22 preferably satisfy Mathematical formula 1 as in the first embodiment.

The display unit of this embodiment can be manufactured as in the second embodiment, except that, for example, when the driving transistor Tr1 of the pixel driving circuit 140 is formed, the step forming layer 14 made of the foregoing material having the foregoing lamination structure is formed in the second region 22 on the substrate 11.

The operation and the effect of the display unit are similar to those of the second embodiment.

Figure 15:
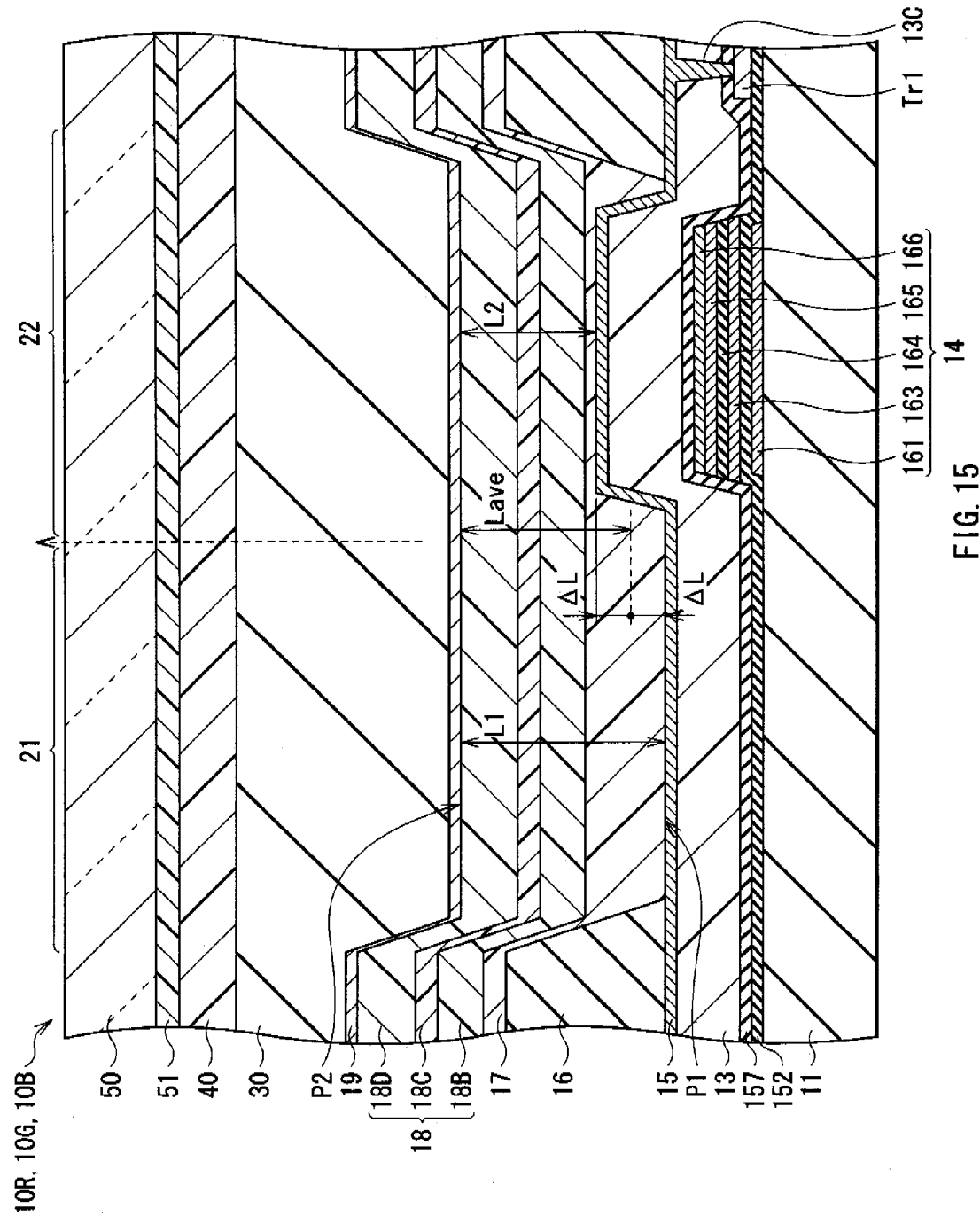
FIG. 15 is a cross section showing another structure of the organic light emitting device shown in FIG. 14.

In this embodiment, the description has been given of the case that the step forming layer 14 is made of the same material and have the same lamination structure as that of the source wiring 156S and the drain wiring 156D of the driving transistor Tr1. However, the step forming layer 14 may be made of the same material and have the same lamination structure as those of other layer of the driving transistor Tr1. For example, as shown in FIG. 15, the step forming layer 14 may be formed of a layer 161 made of the same material as that of the gate electrode 151 of the driving transistor Tr1, a gate insulating film 122, a layer 163 made of the same material as that of the channel layer 153, a layer 164 made of the same material as that of the channel protective layer 154, a layer 165 made of the same material as those of the source electrode 155S and the drain electrode 155D, and a layer 166 made of the same material as that of the source electrode 156S and the drain electrode 156D. By composing the step forming layer 14 by using more layers of the driving transistor Tr1, a higher step can be formed.

Further, the step forming layer 14 may be made of the same material and have the same lamination structure as those of the retention capacity Cs or the writing transistor Tr2, or the wiring such as the signal line 120A, the scanning line 130A, and the power line. Otherwise, the step forming layer 14 may be made of the same material and have the same lamination structure as those of the auxiliary wiring for decreasing the resistance of the second electrode 19.

Further, in addition to the step forming layer 14 of this embodiment, the step forming layer 14 similar to that of the first embodiment may be formed on the planarizing insulating film 13 to form a higher step.

Fourth Embodiment

Figure 16:
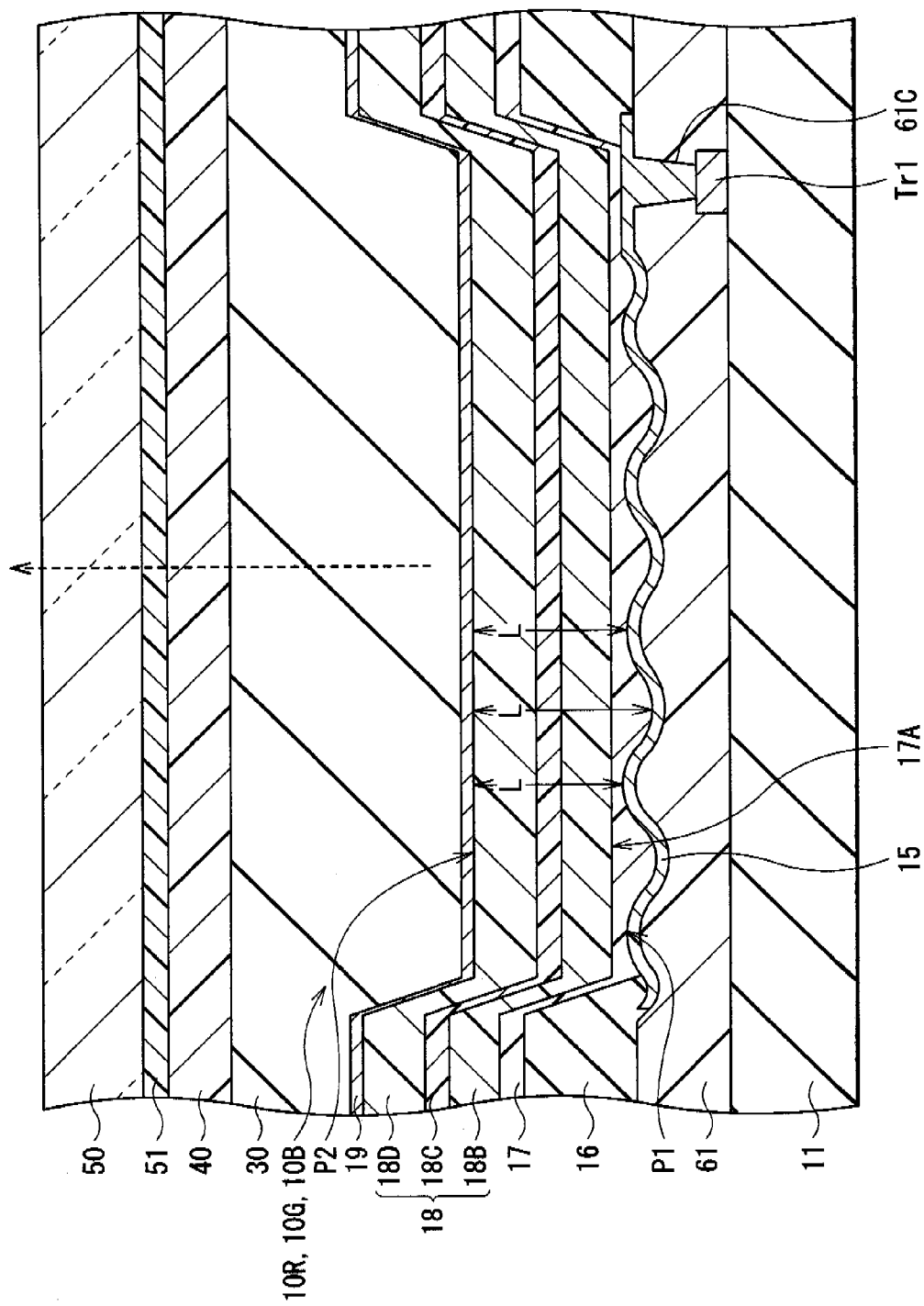
FIG. 16 is a cross section showing a structure of an organic light emitting device used for a display unit according to a fourth embodiment of the invention.

Next, a description will be given of a display unit according to a fourth embodiment of the invention. As shown in FIG. 16, the display unit of the fourth embodiment is the same as the display unit described in the first embodiment, except that the first electrode 15 is formed on a convexoconcave structure 61 provided on the substrate 11.

Figure 17:
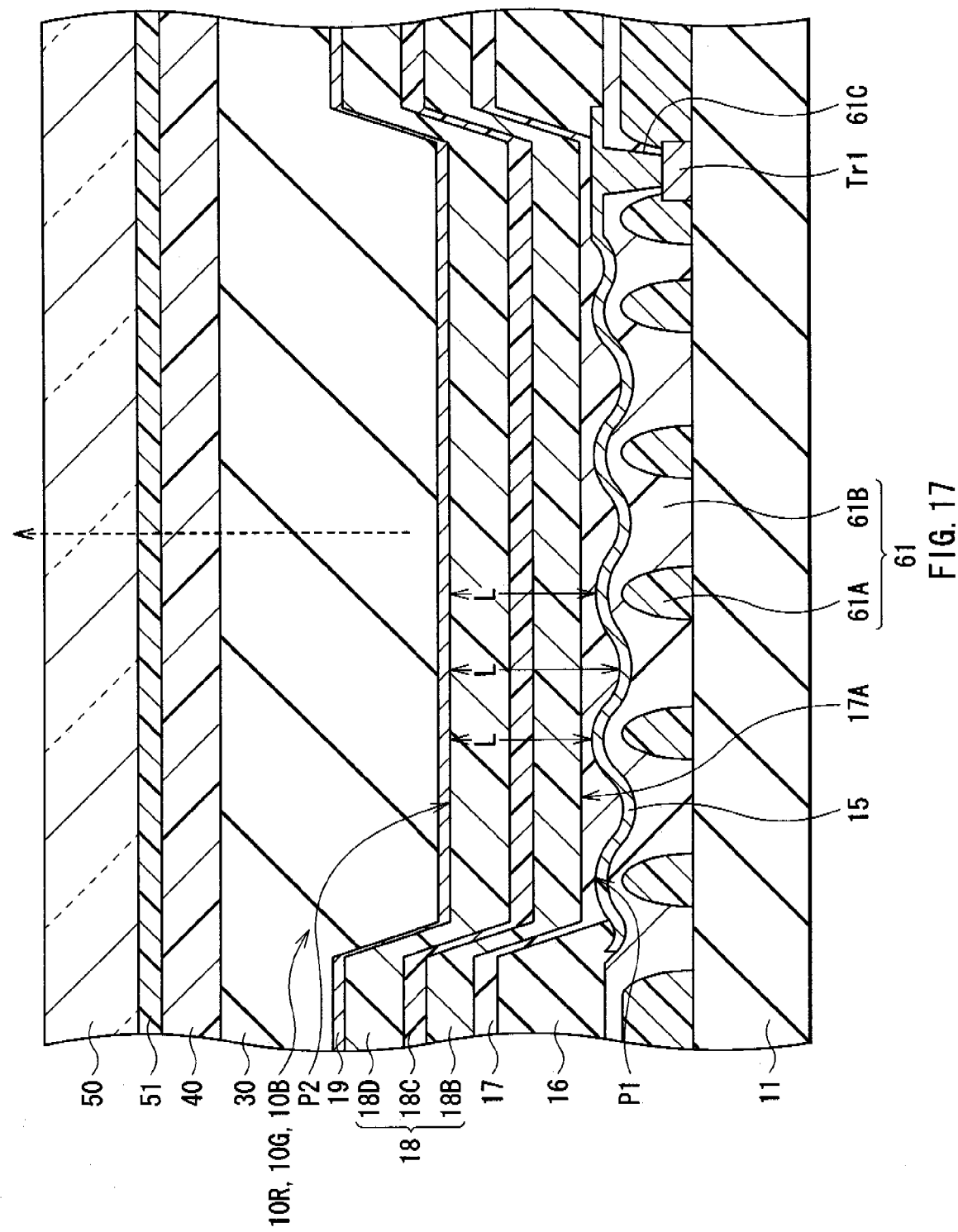
FIG. 17 is a cross section showing another structure of the organic light emitting device shown in FIG. 16.

The convexoconcave structure 61 is made of, for example, a photosensitive resin, and has a convexoconcave shape on the surface of the first electrode 15 side. The convexoconcave structure 61 may be formed of one layer as shown in FIG. 16. Otherwise, the convexoconcave structure 61 may be formed as shown in FIG. 17. In this case, the convexoconcave structure 61 has a plurality of projections 61A and a covering layer 61B that covers the projection 61A. The surface of the covering layer 61B on the first electrode 15 side has a convexoconcave shape corresponding to the projection 61A. The convexoconcave structure 61 may also function as the planarizing insulating film 13 described in the first embodiment. Further, the convexoconcave structure 61 may have a connection hole 61C.

The end face of the first electrode 15 on the light emitting layer 18C side is the first end P1 having the continuous convexoconcave shape corresponding to the convexoconcave structure 61. On the first electrode 15, the distance adjustment layer 17 that fills in the convexoconcave shape and has the flat surface 17A on the light emitting layer 18C side is provided. Thus, the second end P2 is planarized, and the optical distance L between the first end P1 and the second end P2 is continuously changed according to the convexoconcave shape of the first end P1. Thereby, in the organic light emitting devices 10R, 10G and 10B, the peak wavelength of spectrums of light to be extracted is continuously changed according to the optical distance L, the half bandwidth of the spectrum obtained by synthesizing each spectrum is widened, and thus the view angle characteristics can be improved.

The convexoconcave shape of the first end P1 is preferably a convexoconcave shape having a super low angle such as an average oblique angle of 2 deg or less. When the convexoconcave shape has a large oblique angle, the outside light scattering becomes large, causing a low contrast.

Figure 18:
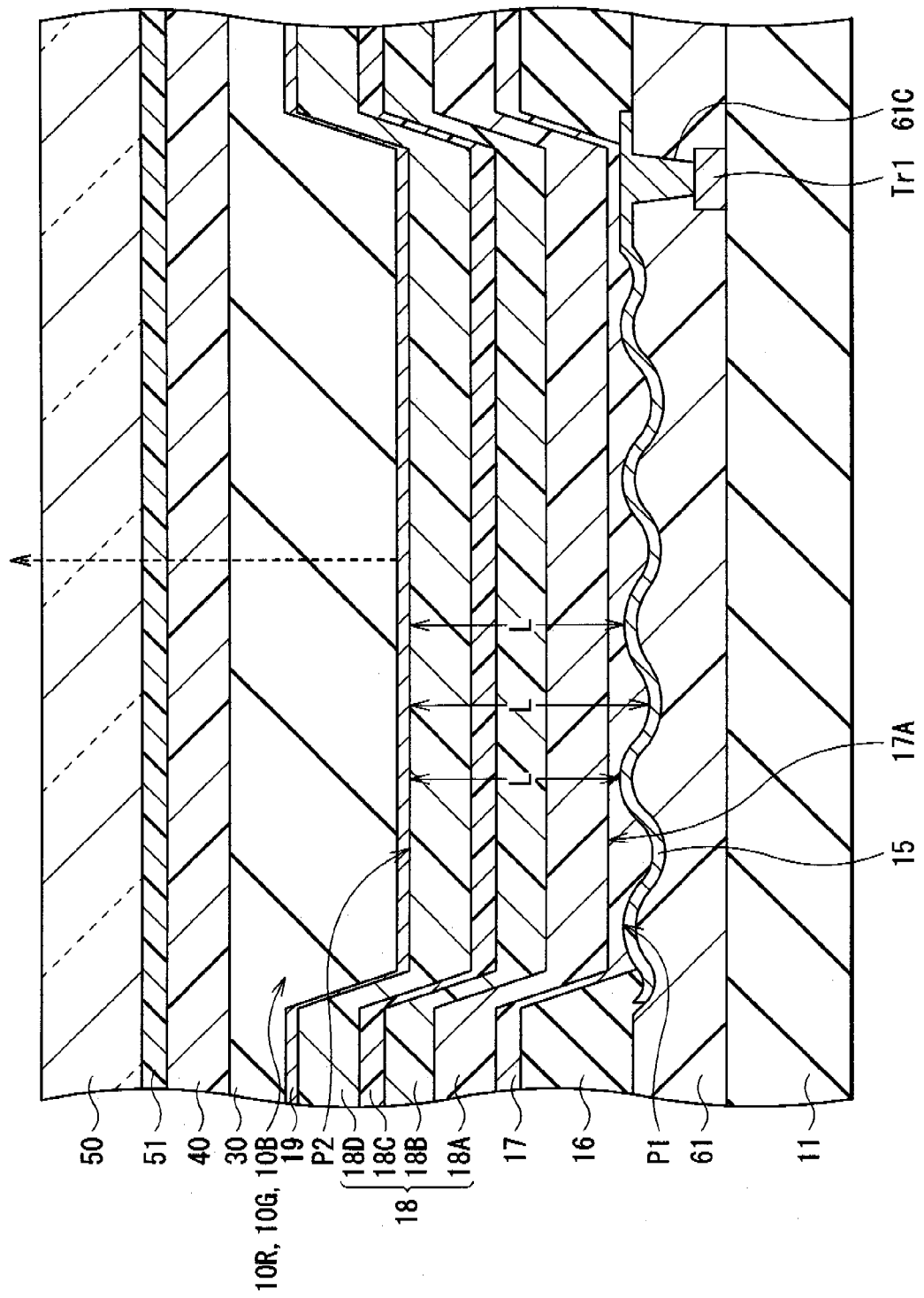
FIG. 18 is a cross section showing still another structure of the organic light emitting device shown in FIG. 16.

The distance adjustment layer 17 is made of the same organic material as that of the hole injection layer 18A or the hole transport layer 18B of the organic layer 18, for example. The distance adjustment layer 17 may also function as the hole injection layer 18A or the hole transport layer 18B. Further, as shown in FIG. 18, the distance adjustment layer 17 may be provided separately from the hole injection layer 18A or the hole transport layer 18B.

The display unit can be manufactured, for example, as follows.

FIG. 19A to FIG. 20B show a method of manufacturing the display unit in the order of steps. The method shows a case of forming the first electrode 15 on the single-layer convexoconcave structure 61 as shown in FIG. 16.

First, as shown in FIG. 19A, a photosensitive resin film 71 is formed by coating the substrate 11 formed with the pixel driving circuit 140 including the driving transistor Tr1 with a photosensitive resin.

Next, as shown in FIG. 19B, the photosensitive resin film 71 is exposed and developed by photolithography method using, for example, a halftone reticle 72 or two pieces of reticles to form the convexoconcave structure 61. Then, as a method to form the super low angle convexoconcave structure, for example, the pattern of the reticle used for exposure may be finer than the resolution of a photolithography machine. The method is not limited thereto, and other method can be used. Further, when the convexoconcave structure 61 also functions as the planarizing insulating film 13, the connection hole 61C may be formed concurrently.

Figure 20A:
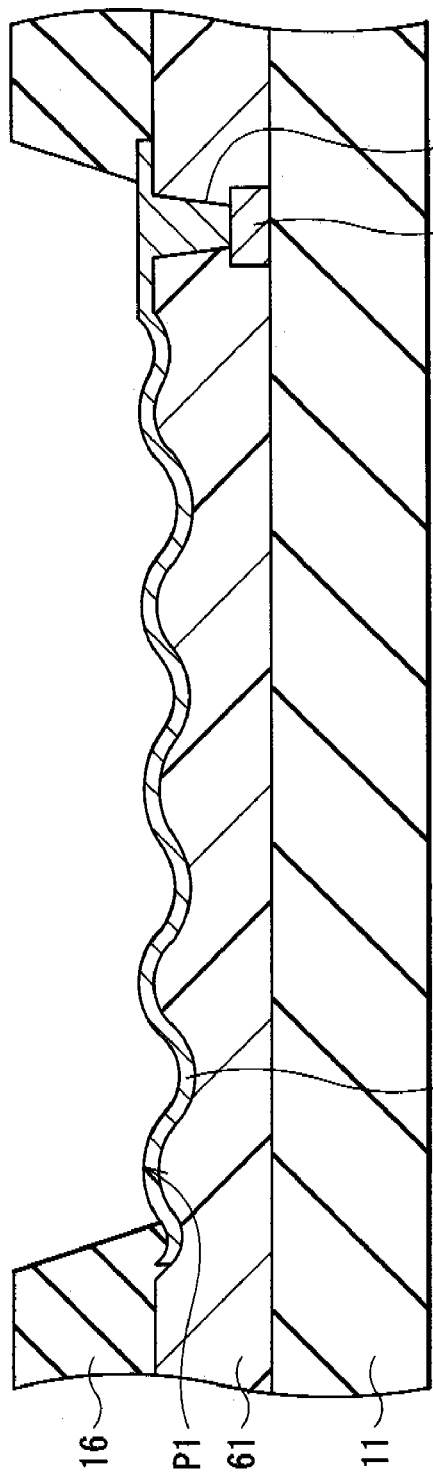
FIGS. 20A and 20B are cross sections showing steps following FIG. 19B.

Subsequently, as shown in FIG. 20A, after the convexoconcave structure 61 is fired, the first electrode 15 is formed by, for example, sputtering method on the convexoconcave structure 61. Thereby, the continuous convexoconcave shape corresponding to the convexoconcave structure 61 is formed on the end face of the first electrode 15 on the light emitting layer 18C side. After that, as shown in FIG. 20A, coating is made with a photosensitive resin as in the first embodiment, the resultant is formed by, for example, photolithography method, and fired. Thereby, the interelectrode insulating film 16 is formed.

Figure 20B:
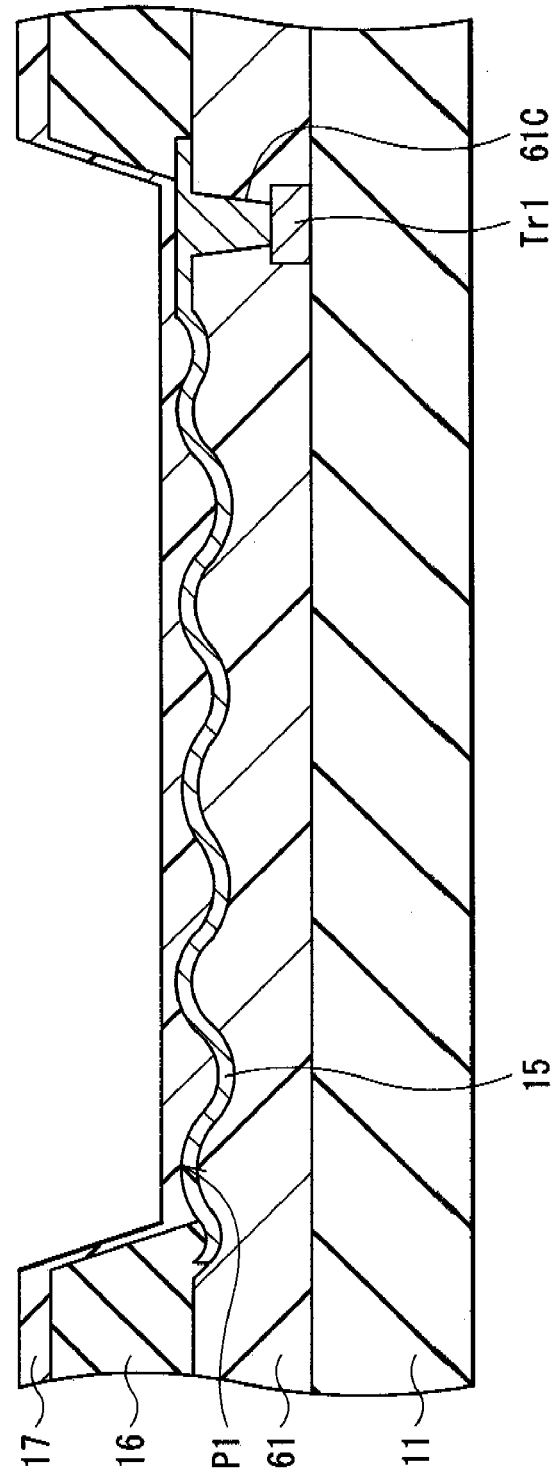

After the interelectrode insulating film 16 is formed, the distance adjustment layer 17 made of the foregoing material is formed on the first electrode 15 by, for example, vacuum vapor deposition method. The distance adjustment layer 17 is heated to temperatures equal to or more than the glass transition point of the component material of the distance adjustment layer 17. Thereby, as shown in FIG. 20B, the surface 17A of the distance adjustment layer 17 on the light emitting layer 18C is planarized.

After the distance adjustment layer 17 is formed, the organic layer 18 and the second electrode 19 are sequentially formed on the distance adjustment layer 17. Then, when the distance adjustment layer 17 is made of the same material as that of the hole injection layer 18A or the hole transport layer 18B, the hole injection layer 18A or the hole transport layer 18B can be formed again separately from the distance adjustment layer 17. Otherwise, the hole injection layer 18A and the hole transport layer 18B may be omitted and only the light emitting layer 18C and the electron transport layer 18D may be formed.

After that, the protective film 30 and the adhesive layer 40 are formed on the organic light emitting devices 10R, 10G and 10B. Then, the sealing substrate 50 provided with the color filter 51 is bonded thereto. Consequently, the display unit shown in FIG. 16 is completed.

Otherwise, the display unit can be manufactured as follows.

FIG. 21A to FIG. 22B show another method of manufacturing the display unit in the order of steps. The method shows a case of forming the first electrode 15 on the convexoconcave structure 61 in which the plurality of projections 61A are covered with the covering layer 61B as shown in FIG. 17.

First, as shown in FIG. 21A, a photosensitive resin film is formed by coating the substrate 11 formed with the pixel driving circuit 140 including the driving transistor Tr1 with a photosensitive resin. Next, the photosensitive resin film is exposed and developed by photolithography method by using, for example, a mask 81 to form and fire the projection 61A.

Next, as shown in FIG. 21B, the substrate 11 formed with the projection 61A is coated with a photosensitive resin again, and thereby the projection 61A is covered with the covering layer 61B.

Subsequently, as shown in FIG. 22A, the connection hole 61C is formed in the covering layer 61B by photolithography method using, for example, a mask 82 and fired.

Subsequently, as shown in FIG. 22B, the first electrode 15 is formed by, for example, sputtering method on the convexoconcave structure 61. Thereby, the continuous convexoconcave shape corresponding to the convexoconcave structure 61 is formed on the end face of the first electrode 15 on the light emitting layer 18C side.

After that, as in the foregoing manufacturing method, coating is made with a photosensitive resin, the resultant is formed by, for example, photolithography method, and fired. Thereby, the interelectrode insulating film 16 is formed. Subsequently, as in the foregoing manufacturing method, the distance adjustment layer 17 is formed on the first electrode 15, the distance adjustment layer 17 is heated to temperatures equal to or more than the glass transition point of the component material of the distance adjustment layer 17. Thereby, the surface 17A of the distance adjustment layer 17 on the light emitting layer 18C side is planarized.

After the distance adjustment layer 17 is formed, as in the foregoing manufacturing method, the organic layer 18 and the second electrode 19 are sequentially formed. After that, the protective film 30 and the adhesive layer 40 are formed on the organic light emitting devices 10R, 10G and 10B. Then, the sealing substrate 50 provided with the color filter 51 is bonded thereto. Consequently, the display unit shown in FIG. 17 is completed.

In this display unit, when a given voltage is applied between the first electrode 15 and the second electrode 19, light is emitted as in the first embodiment. The light is multiply reflected between the first electrode 15 and the second electrode 19, and extracted from the second electrode 19 side. In this embodiment, the first end P1 has the continuous convexoconcave shape. The continuous convexoconcave shape is filled in by the distance adjustment layer 17 and planarized. Thereby, the optical distance L is continuously changed. Therefore, the peak wavelength of spectrums of light to be extracted is continuously changed according to the optical distance L, the half bandwidth of the spectrum obtained by synthesizing each spectrum is widened, and thus the view angle characteristics are improved.

As above, in this embodiment, the first end P1 has the continuous convexoconcave shape. The convexoconcave shape is filled in by the distance adjustment layer 17 and planarized. Thereby, the optical distance L is continuously changed. Therefore, the peak wavelength of spectrums of the light to be extracted is continuously changed according to the optical distance L, and thus the view angle characteristics can be improved.

In the foregoing first to fourth embodiments, regions with the optical distance different from each other are provided in each organic light emitting device. Meanwhile, it is also possible that an optical distance between adjacent organic light emitting devices having the same color may be different from each other. A description will be hereinafter given of examples thereof.

Fifth Embodiment

Figure 23:
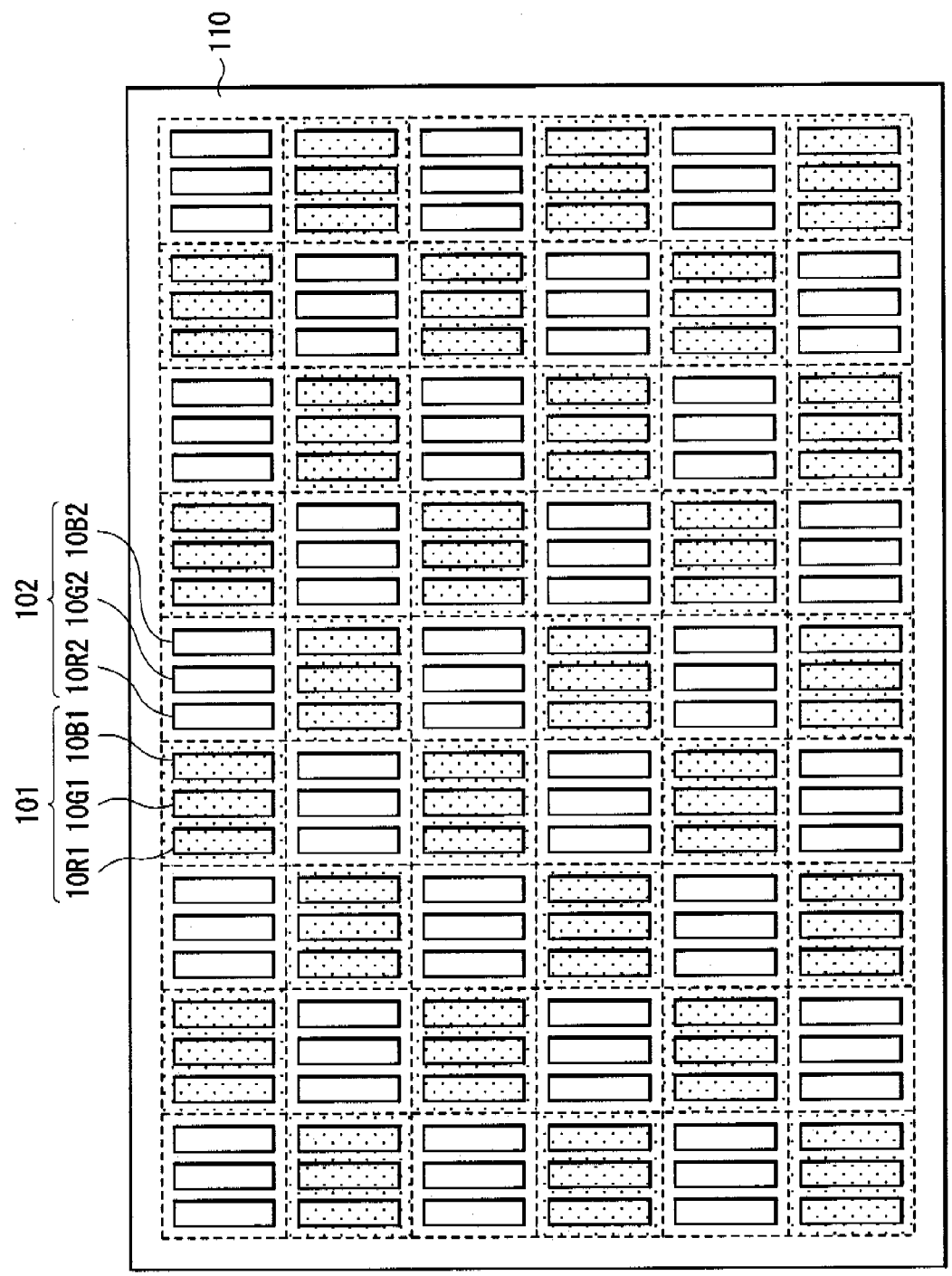
FIG. 23 is a plan view showing a configuration of a display unit according to a fifth embodiment of the invention.

FIG. 23 shows an example of a plane structure of the display region 110 of a display unit according to a fifth embodiment of the invention. In this display unit, organic light emitting devices 10R1 and 10R2, which are respectively included in adjacent pixels 101 and 102 and have the same light emitting wavelength, have optical distances LR1 and LR2 between the first end P1 and the second end P2 that are different from each other. Similarly, the optical distances LG1 and LG2 of organic light emitting devices 10G1 and 10G2 are different from each other, and the optical distances LB1 and LB2 of organic light emitting devices 10B1 and 10B2 are different from each other. Each internal portion of the organic light emitting devices 10R1, 10R2, 10G1, 10G2, 10B1, 10B2 is not separated into the first region 21 and the second region 22. Thus, the optical distance in each device is identical. Thereby, in the display unit, the peak wavelength of a spectrum of light extracted from the organic light emitting devices 10R1 and 10R2 (or 10G1 and 10G2, or 10B1 and 10B2) with the same light emitting wavelength can be different from each other. Therefore, the view angle characteristics can be improved.

The pixels 101 and 102 are arranged, for example, in a checked pattern. However, the pixels 101 and 102 may be linearly arrayed, or any other arrangement may be adopted as long as there is no visual problem. In FIG. 23, the pixel 101 is meshed.

Figure 24:
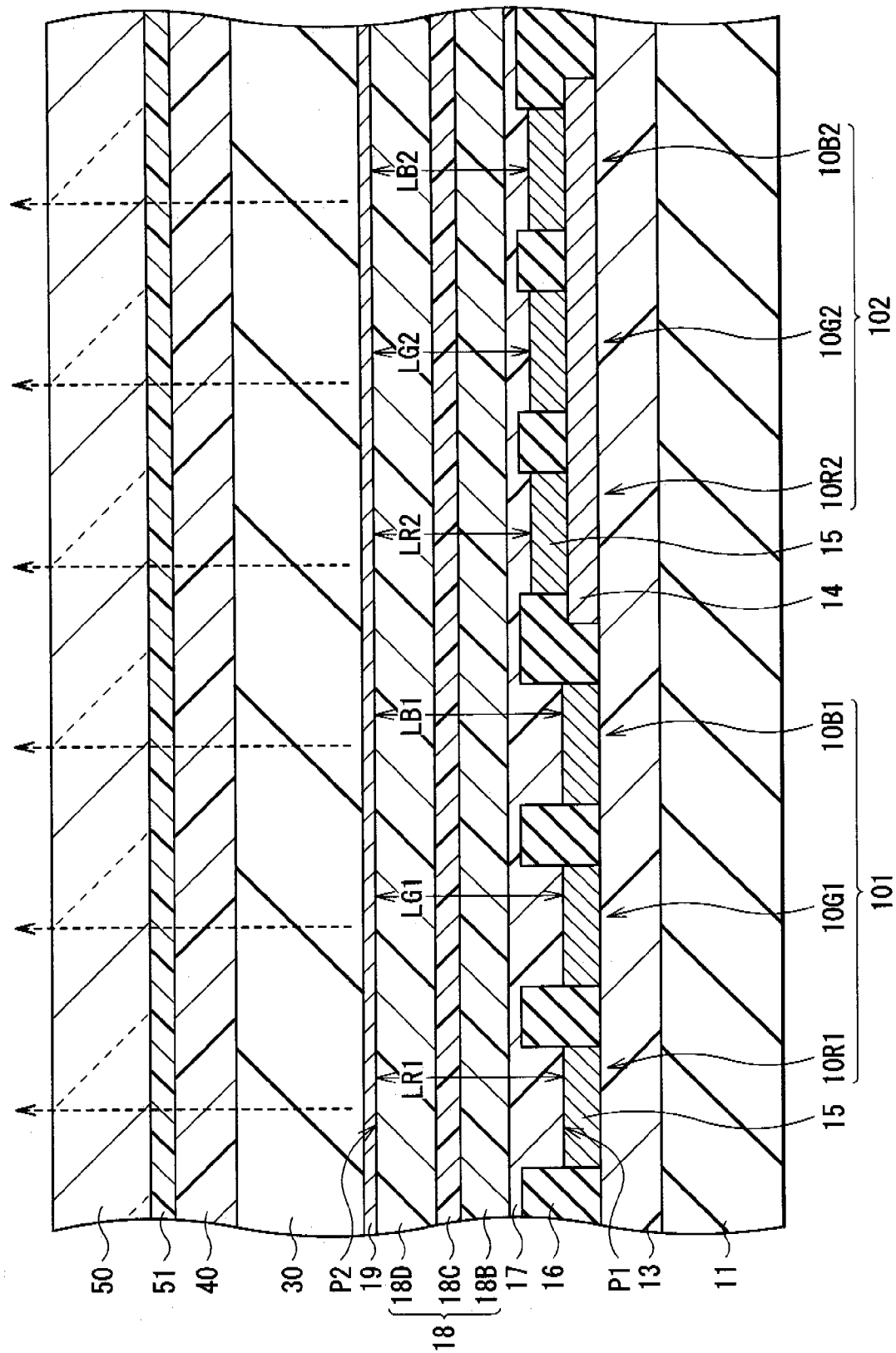
FIG. 24 is a cross section showing a structure of two adjacent pixels shown in FIG. 23.

FIG. 24 shows a cross sectional structure of the adjacent pixels 101 and 102. In the region of the pixel 102 of the substrate 11, the step forming layer 14 is formed. The first electrode 15 of the pixel 102 is formed on the step forming layer 14. Thereby, a vertical interval is provided between the first electrode 15 of the pixel 101 and the first electrode 15 of the pixel 102. That is, each end face of the first electrode 15 on the light emitting layer 18C side of the pixels 101 and 102 is the first end P1 having the vertical interval corresponding to the step forming layer 14. Further, on the first electrode 15, the distance adjustment layer 17 that fills in the vertical interval between each first electrode 15 of the pixels 101 and 102 and has the flat surface 17A on the second electrode 19 side is provided. Thus, the second end P2 is planarized, and the optical distance between the first end P1 and the second end P2 is different according to the vertical interval between each first electrode 15 of the pixels 101 and 102. Except for the foregoing structure, the organic light emitting devices 10R1, 10R2, 10G1 and 10G2, 10B1 and 10B2 are structured as in the first embodiment.

As in the first embodiment, the distance adjustment layer 17 is made of the same organic material as that of the hole injection layer 18A or a hole transport layer 18B of the organic layer 18. The distance adjustment layer 17 may also function as the hole injection layer 18A or the hole transport layer 18B as well. Further, though not shown, the distance adjustment layer 17 may be provided separately from the hole injection layer 18A or the hole transport layer 18B.

The optical distance LR1 in the organic light emitting device 10R1 and the optical distance LR2 in the organic light emitting device 10R2 preferably satisfy Mathematical formula 2. The optical distance LG1 in the organic light emitting device 10G1 and the optical distance LG2 in the organic light emitting device 10G2 preferably satisfy Mathematical formula 3. The optical distance LB1 in the organic light emitting device 10B1 and the optical distance LB2 in the organic light emitting device 10B2 preferably satisfy Mathematical formula 4.

$LR1 = LR_{ave} + \Delta LR$ $LR2 = LR_{ave} - \Delta LR$ $(2LR_{ave})/\lambda + \Phi/(2\pi) = m$  Mathematical formula 2

In the formula, $LR_{ave}$ represents the average optical distance of the optical distance LR1 in the organic light emitting device 10R1 and the optical distance LR2 in the organic light emitting device 10R2, $\Phi$ represents the sum of the phase shift $\Phi_1$ of the reflected light generated at the first end P1 and the phase shift $\Phi_2$ of the reflected light generated at the second end P2 ($\Phi = \Phi_1 + \Phi_2$) (rad), $\lambda$ represents the peak wavelength of the spectrum of the light desired to be extracted from the second end P2 side, and m represents an integer number when $LR_{ave}$ becomes positive. In Mathematical formula 2, the unit used for LR1 and LR2, $LR_{ave}$, and $\lambda$ should be common, for example, nm is used.

$LG1 = LG_{ave} + \Delta LG$ $LG2 = LG_{ave} - \Delta LG$ $(2LG_{ave})/\lambda + \Phi/(2\pi) = m$  Mathematical formula 3

In the formula, $LG_{ave}$ represents the average optical distance of the optical distance LG1 in the organic light emitting device 10G1 and the optical distance LG2 in the organic light emitting device 10G2, $\Phi$ represents the sum of the phase shift $\Phi_1$ of the reflected light generated at the first end P1 and the phase shift $\Phi_2$ of the reflected light generated at the second end P2 ($\Phi = \Phi_1 + \Phi_2$) (rad), $\lambda$ represents the peak wavelength of the spectrum of the light desired to be extracted from the second end P2 side, and m represents an integer number when $LG_{ave}$ becomes positive. In Mathematical formula 3, the unit used for LG1 and LG2, $LG_{ave}$, and $\lambda$ should be common, for example, nm is used.

$LB1 = LB_{ave} + \Delta LB$ $LB2 = LB_{ave} - \Delta LB$ $(2LB_{ave})/\lambda + \Phi/(2\pi) = m$  Mathematical formula 4

In the formula, $LB_{ave}$ represents the average optical distance of the optical distance LB1 in the organic light emitting device 10B1 and the optical distance LB2 in the organic light emitting device 10B2, $\Phi$ represents the sum of the phase shift $\Phi_1$ of the reflected light generated at the first end P1 and the phase shift $\Phi_2$ of the reflected light generated at the second end P2 ($\Phi = \Phi_1 + \Phi_2$) (rad), $\lambda$ represents the peak wavelength of the spectrum of the light desired to be extracted from the second end P2 side, and m represents an integer number when $LB_{ave}$ becomes positive. In Mathematical formula 4, the unit used for LB1 and LB2, $LB_{ave}$, and $\lambda$ should be common, for example, nm is used.

Mathematical formula 2 to Mathematical formula 4 express Mathematical formula 1 for every light emitting color (R, G, B). The meanings of the respective first, second, and third formulas are similar to those of Mathematical formula 1.

The display unit can be manufactured as in the first embodiment, except that the step forming layer 14 is formed in the prospective region where the pixel 102 is to be formed.

In the display unit of this embodiment, when a given voltage is applied between the first electrode 15 and the second electrode 19, light is emitted as in the first embodiment. The light is multiply reflected between the first electrode 15 and the second electrode 19, and extracted from the second electrode 19 side. In this embodiment, the organic light emitting devices 10R1 and 10R2, which are respectively included in the adjacent pixels 101 and 102 and have the same light emitting wavelength, have optical distances LR1 and LR2 between the first end P1 and the second end P2 that are different from each other. Therefore, the peak wavelength of a spectrum of light to be extracted from the organic light emitting devices 10R1 and 10R2 is different from each other.

In the result, when the organic light emitting devices 10R1 and 10R2 concurrently emit light, as in the first embodiment, the half bandwidth of the synthesized spectrum is widened, and the view angle characteristics are improved. Such effects can be similarly obtained for the organic light emitting devices 10G1 and 10G2, and the organic light emitting devices 10B1 and 10B2.

As above, in this embodiment, the organic light emitting devices 10R1 and 10R2 (or 10G1 and 10G2, or 10B1 and 10B2), which are included in the adjacent pixels 101 and 102 and have the same light emitting wavelength, have optical distances LR1 and LR2 (or LG1 and LG2, or LB1 and LB2) between the first end P1 and the second end P2 that are different from each other. Therefore, the peak wavelength of the spectrum of the light to be extracted from the devices having the same light emitting wavelength can be different from each other. In the result, the view angle characteristics can be improved.

In the foregoing embodiment, the description has been given of the case that the optical distance LR1/LG1/LB1 is set different from the optical distance LR2/LG2/LB2 by using the step forming layer 14 and the distance adjustment layer 17 as in the first embodiment. However, it is also possible that the optical distance LR1/LG1/LB1 is set different from the optical distance LR2/LG2/LB2 by using a step formed by the driving transistor Tr1, the wiring or the like as in the second or the third embodiment.

A description will be hereinafter given of Modification 1 to Modification 3 of the fifth embodiment in which the optical distance LR1/LG1/LB1 is set different from the optical distance LR2/LG2/LB2 by using other structure. In the Modifications 1 to 3, the optical distance LR1/LG1/LB1 is set different from the optical distance LR2/LG2/LB2 by using the difference of the structure of the first electrode 15, or the difference of the thickness of the organic layer 18.

Modification 1

Figure 25:
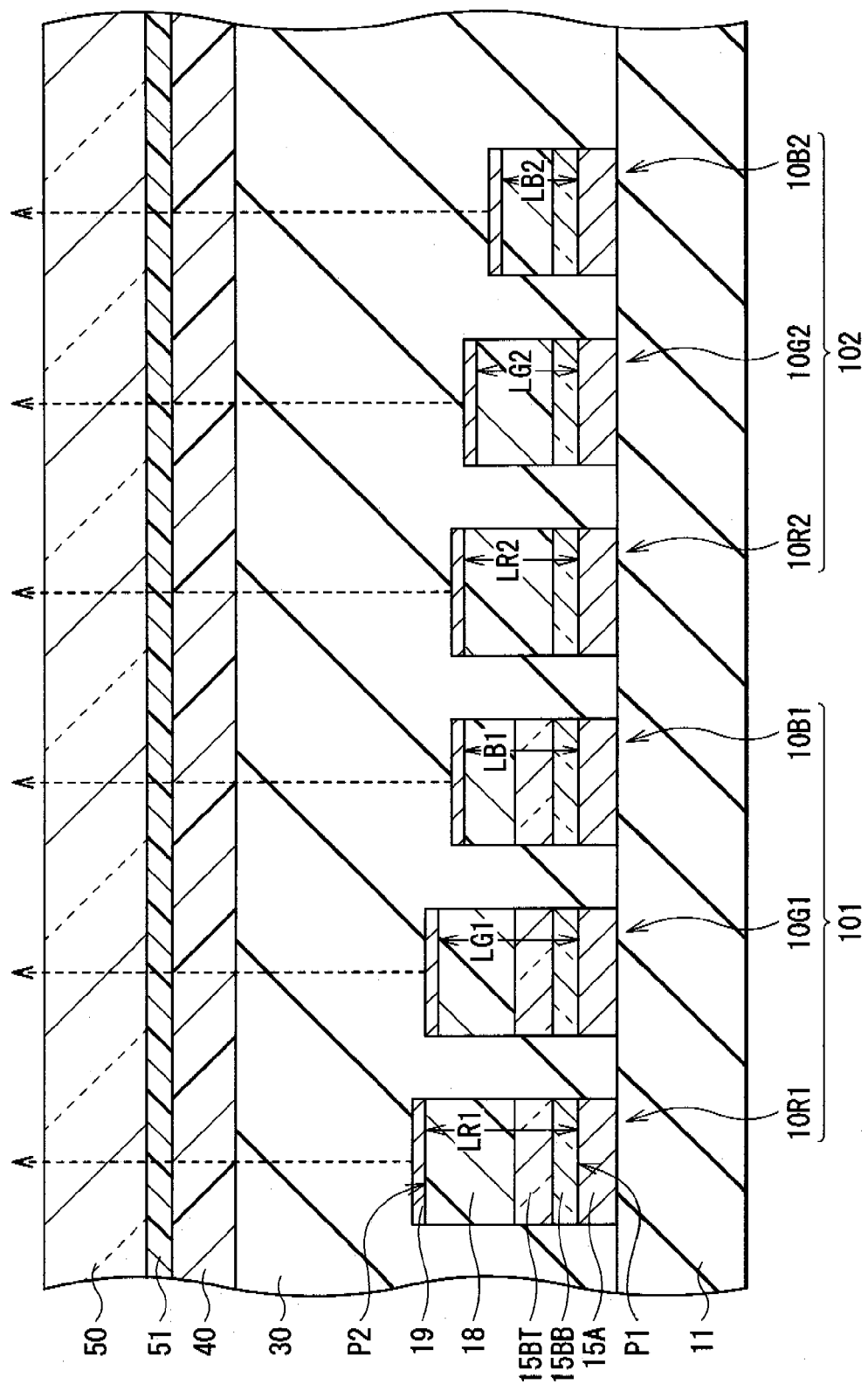
FIG. 25 is a cross section showing a structure of two adjacent pixels of Modification 1.

FIG. 25 shows a cross sectional structure of the pixels 101 and 102 according to Modification 1. In the first electrode 15 of the display device of the Modification 1, a reflective electrode 15A made of an alloy including silver (Ag) and a transparent electrode 15B are layered in this order from the substrate 11 side. In this case, the transparent electrode 15B of the pixel 101 has a structure in which a lower layer 15BB made of a polycrystal ITO and an upper layer 15BT made of amorphous ITO or IZO are layered in this order. The transparent electrode 15B of the pixel 102 has only the lower layer 15BB.

The display unit can be manufactured, for example, as follows.

Figure 27:
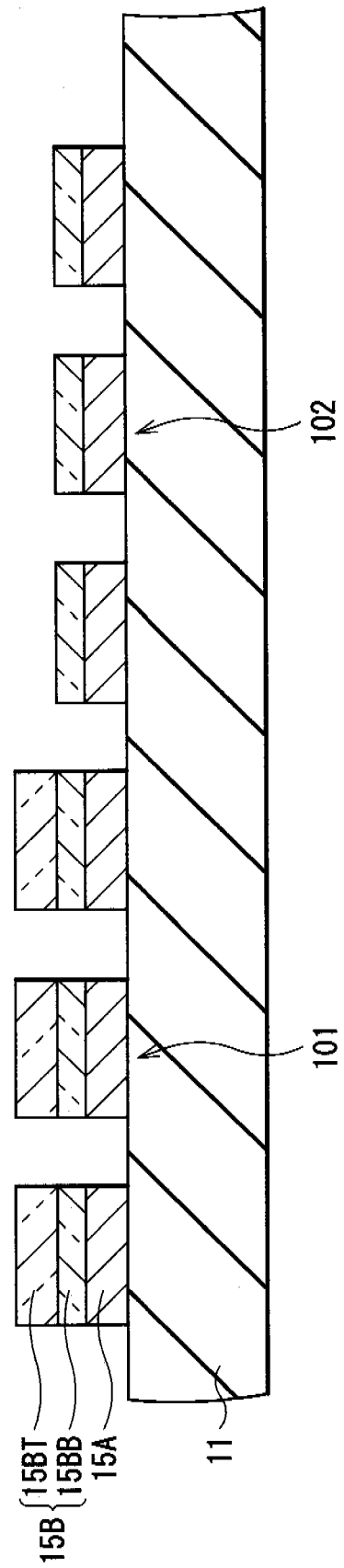
FIG. 27 is cross section showing a step following FIG. 26B.

FIG. 26A to FIG. 27 show a method of manufacturing the display unit in the order of steps. First, as shown in FIG. 26A, the pixel driving circuit 140 including the driving transistor Tr1 and the planarizing insulating film 13 are formed on the substrate 11 made of the foregoing material as in the first embodiment. After that, the reflective electrode 15A and the transparent electrode 15B including the lower layer 15BB and the upper layer 15BT that are made of the foregoing material are sequentially formed by, for example, sputtering method.

Next, on the upper layer 15BT, a resist pattern (not shown) is formed by using, for example, lithography method. As shown in FIG. 26B, the upper layer 15BT of the pixel 102 is selectively removed by wet etching with the use of the resist pattern as a mask. Then, for example, when the lower layer 15BB is made of polycrystal ITO and the upper layer 15BT is made of amorphous ITO or IZO, and when a mixture of phosphoric acid, nitric acid, and acetic acid is used as a wet etchant, only the upper layer 15BT can be selectively removed by using the wet etching selectivity between amorphous ITO or IZO and polycrystal ITO.

Further, as shown in FIG. 27, the transparent electrode 15B and the reflective electrode 15A are selectively removed by, for example, dry etching, and separated to each organic light emitting device, 10R, 10G and 10B. Thereby, the first electrode 15 as shown in FIG. 25 is formed.

After that, the interelectrode insulating film 16 (refer to FIG. 5) is formed between first electrodes 15. Then, the hole injection layer 18A, the hole transport layer 18B, the light emitting layer 18C, the electron transport layer 18D, and the second electrode 19 that have the foregoing thickness and are made of the foregoing material are sequentially formed by, for example, vapor deposition method to form the organic light emitting devices 10R, 10G and 10B as shown in FIG. 25. Subsequently, the protective film 30 and the adhesive layer 40 are formed on the organic light emitting devices 10R, 10G and 10B, and the sealing substrate 50 provided with the color filter 51 is bonded thereto. Consequently, the display unit shown in FIG. 25 is completed.

Modification 2

Figure 28:
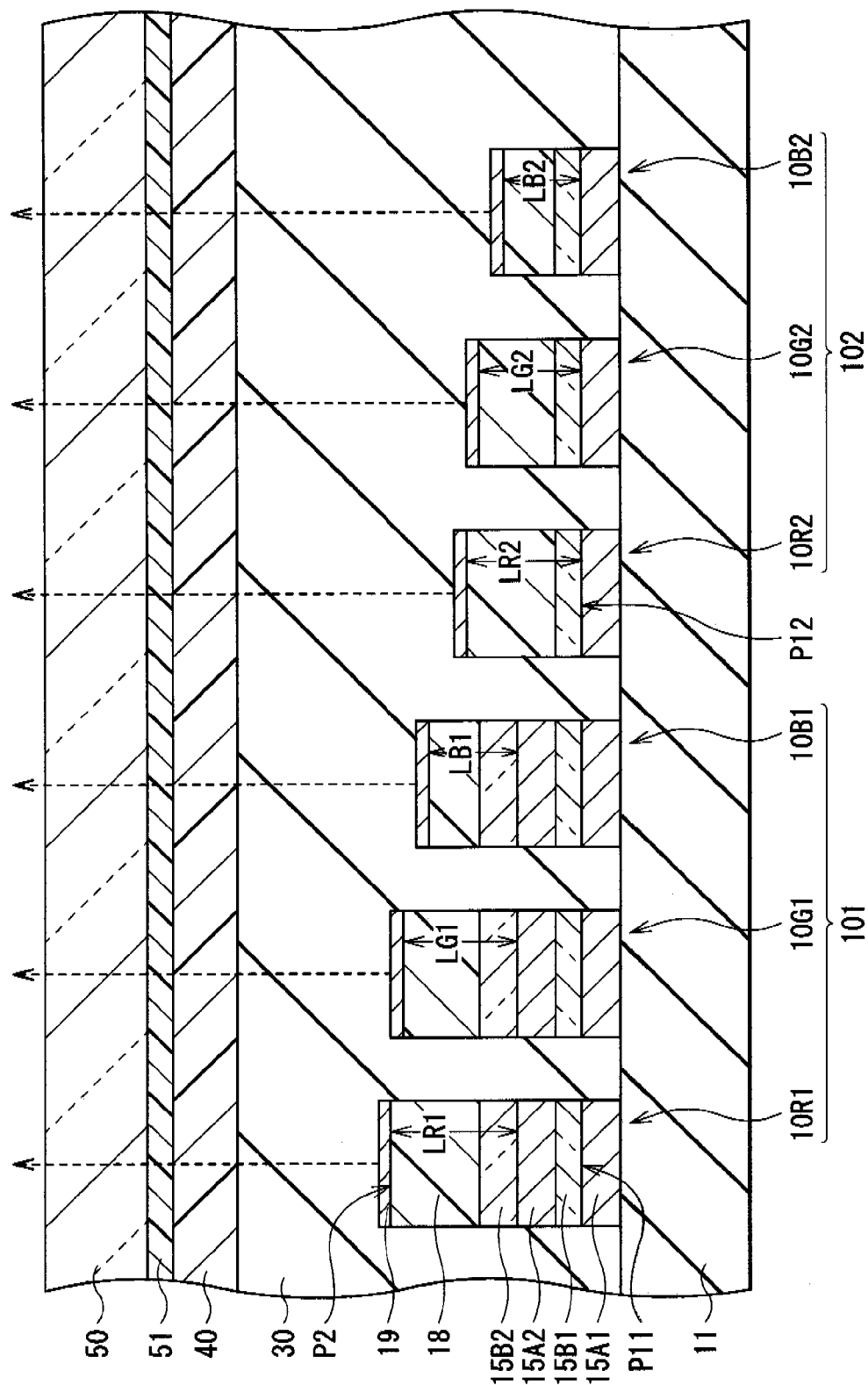
FIG. 28 is a cross section showing a structure of two adjacent pixels of Modification 2.

FIG. 28 shows another example of the structure of the first electrode 15. The first electrode 15 of this modification has a lamination structure in which the reflective electrode 15A and the transparent electrode 15B are alternately layered. The first electrode 15 of the pixel 101 has a structure in which a first reflective electrode 15A1 made of an alloy including silver (Ag), a first transparent electrode 15B1 made of polycrystal ITO, a second reflective electrode 15A2 made of an alloy including silver (Ag), a second transparent electrode 15B2 made of polycrystal ITO are layered in this order from the substrate 11 side. The first electrode 15 of the pixel 102 has a structure in which the first reflective electrode 15A1 and the first transparent electrode 15B1 are layered in this order from the substrate 11 side. The thickness of the first transparent electrode 15B1 and the second transparent electrode 15B2 is different according to the optical distances LR1, LG1, LB1 and the optical distances LR2, LG2, LB2. The second transparent electrode 15B2 is thicker than the first transparent electrode 15B1. The position of a first end P11 in the pixel 101 is the end face of the second reflective electrode 15A2 on the light emitting layer 18C side. The position of a first end P12 in the pixel 102 is the end face of the first reflective electrode 15A1 on the light emitting layer 18C side.

The display unit can be manufactured, for example, as follows.

FIG. 29A to FIG. 30B show a method of manufacturing the display unit in the order of steps. First, as shown in FIG. 29A, after the pixel driving circuit 140 including the driving transistor Tr1 and the planarizing insulating layer 13 are formed on the substrate 11 made of the foregoing material as in the first embodiment, the first reflective electrode 15A1, the first transparent electrode 15B1, the second reflective electrode 15A2, and the second transparent electrode 15B2 that are made of the foregoing material are respectively formed by, for example, sputtering method. Then, for example, the first transparent electrode 15B1 is made of polycrystal ITO, and the second reflective electrode 15A2 is made of the alloy including silver (Ag), respectively.

Next, on the second transparent electrode 15B2, a resist pattern (not shown) is formed by using, for example, lithography method. As shown in FIG. 29B, the second transparent electrode 15B2 and part of the second reflective electrode 15A2 in the thickness direction in regions other than the pixel 101 are selectively removed.

Further, as shown in FIG. 30A, the remaining portion of the second reflective electrode 15A2 in the thickness direction is selectively removed by wet etching using, for example, a mixture of phosphoric acid, nitric acid, and acetic acid as a wet etchant to expose the first transparent electrode 15B1. Then, only the second reflective electrode 15A2 can be removed by using the wet etching selectivity between ITO and the alloy including silver (Ag).

Subsequently, as shown in FIG. 30B, the first transparent electrode 15B1 and the first reflective electrode 15A1 are removed by, for example, dry etching and separated to each organic light emitting device, 10R, 10G and 10B. Thereby, the first electrode 15 as shown in FIG. 28 is formed.

After that, the interelectrode insulating film 16 (refer to FIG. 5) is formed between first electrodes 15. Then, as in the foregoing method, the hole injection layer 18A, the hole transport layer 18B, the light emitting layer 18C, the electron transport layer 18D, and the second electrode 19 are sequentially formed to form the organic light emitting devices 10R, 10G and 10B as shown in FIG. 28. After that, the protective film 30 and the adhesive layer 40 are formed on the organic light emitting devices 10R, 10G and 10B, and the sealing substrate 50 provided with the color filter 51 is bonded thereto. Consequently, the display unit shown in FIG. 28 is completed.

Modification 3

Figure 31:
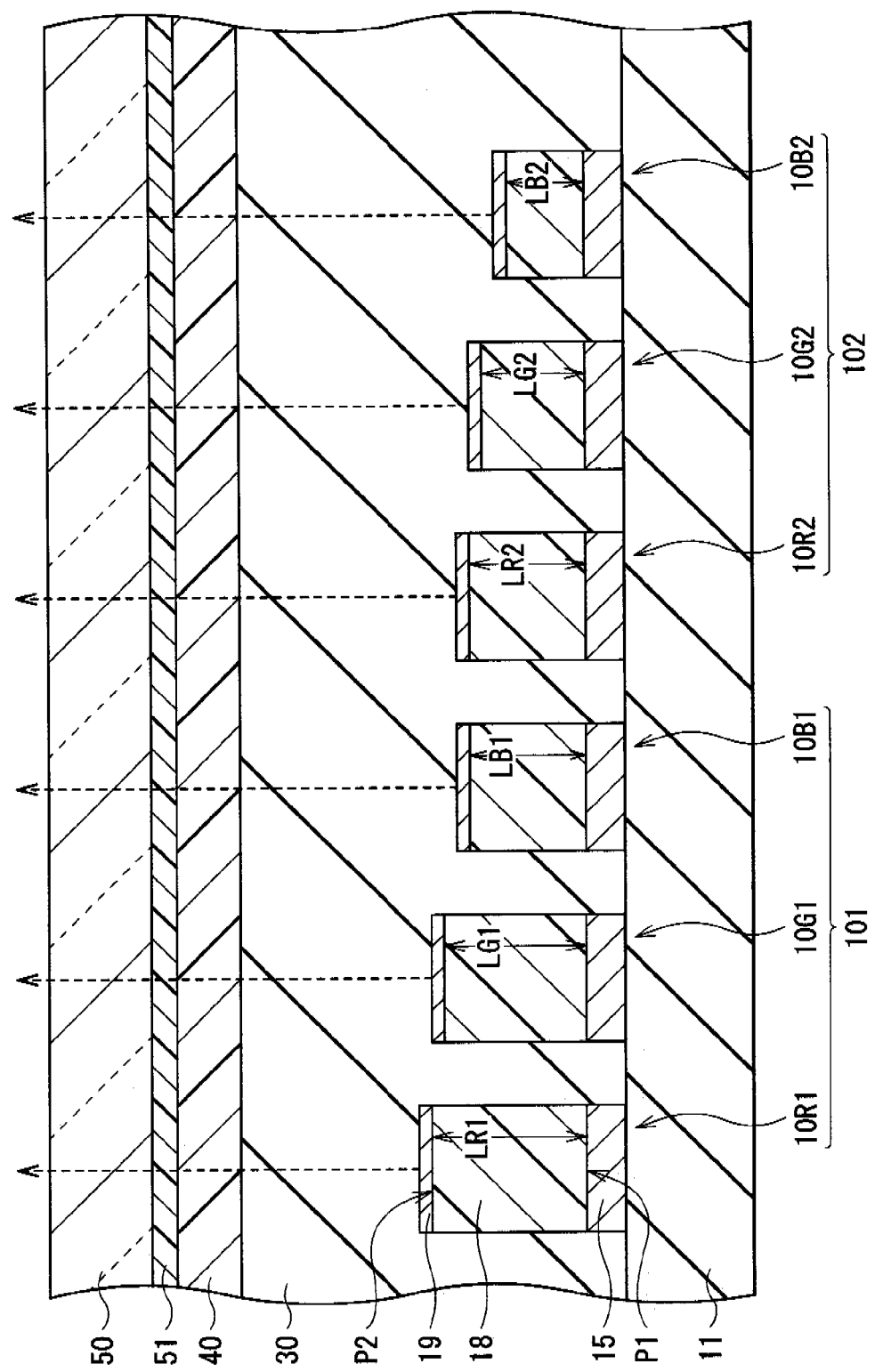
FIG. 31 is a cross section showing a structure of two adjacent pixels of Modification 3.

FIG. 31 shows a cross sectional structure of the pixels 101 and 102 according to the Modification 3. In the display unit of the Modification 3, the thickness of the organic layer 18 of the pixel 101 is thicker than that of the pixel 102. In this case, for example, one or more layers out of the hole injection layer 18A, the hole transport layer 18B, the light emitting layer 18C, and the electron transport layer 18D may be changed. In particular, the thickness of the hole injection layer 18A or the hole transport layer 18B is preferably changed, since these layers have the high carrier mobility and the small voltage dependence degree on the thickness. In general, when the thickness of the light emitting layer 18C or the electron transport layer 18D is changed, its effects on the driving voltage of the device are large, that is, the voltage becomes high in the thick region and low in the thin region, leading to unevenness in the light emitting luminance.

As a component material of the hole injection layer 18A, in general, a phthalocyanine compound, an amine compound, an azaaryl compound or the like can be cited. When the thickness of the organic layer 18 of the pixel 101 is different from that of the pixel 102, an azaanthracene derivative, an azatriphenylene derivative or the like as an azaaryl compound is preferable.

The display unit can be manufactured, for example, as follows.

First, the pixel driving circuit 140 including the driving transistor Tr1, the planarizing insulating film 13, the first electrode 15, and the interelectrode insulating film 16 that are made of the foregoing materials are formed over the substrate 11 as in the first embodiment.

Next, the hole injection layer 18A, the hole transport layer 18B, the light emitting layer 18C, the electron transport layer 18D, and the second electrode 19 are sequentially formed over the first electrode 15. Then, the thickness of the organic layer 18 of the pixel 101 is different from that of the pixel 102. As a method to form the organic layer 18 with various thicknesses, one of general methods used for forming the organic layer 18 such as vapor deposition method using a mask, inkjet method, laser transfer, and printing method can be used.

Subsequently, the protective film 30 and the adhesive layer 40 are formed on the organic light emitting devices 10R, 10G and 10B, and the sealing substrate 50 provided with the color filter 51 is bonded thereto. Consequently, the display unit shown in FIG. 31 is completed.

MODULE AND APPLICATION EXAMPLE

Application examples of the display unit hereinabove described in the first to fifth embodiments will be hereinafter described. The display units of the foregoing respective embodiments can be applied as a display unit of electronic devices in any field for displaying a video signal inputted from outside or a video signal created inside as an image or a video, such as a TV apparatus, a digital camera, a notebook personal computer, a mobile terminal such as a cellular phone, and a video camera.

Module

Figure 32:
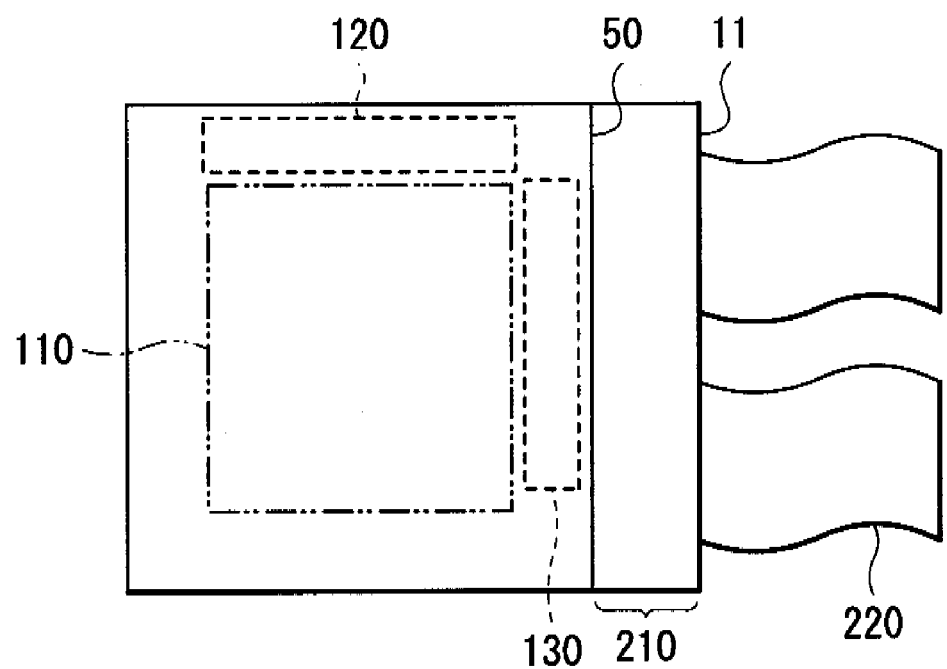
FIG. 32 is a plan view showing a schematic structure of a module including the display unit according to one of the foregoing respective embodiments.

The display unit according to the foregoing respective embodiments is, for example, as the module shown in FIG. 32, incorporated into various electronic devices such as aftermentioned Application examples 1 to 5. In the module, for example, a region 210 exposed from the sealing substrate 50 and the adhesive layer 40 is provided at one side of the substrate 11, and the wiring of the signal line driving circuit 120 and the scanning line driving circuit 130 is extended to the exposed region 210 to form an external connection terminal (not shown). The external connection terminal may be provided with a flexible printed (FPC) wiring substrate 220 for inputting and outputting a signal.

Application Example 1

Figure 33:
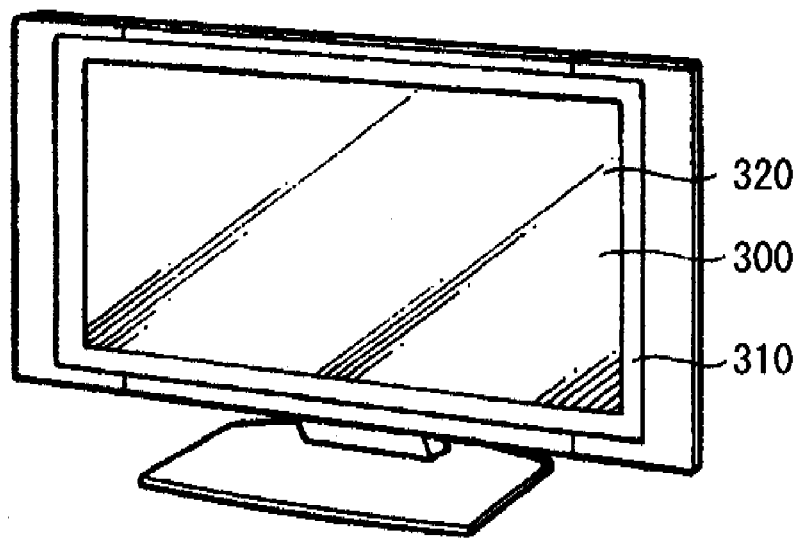
FIG. 33 is a perspective view showing an appearance of Application example 1 of one display unit of the foregoing respective embodiments.

FIG. 33 shows an appearance of a TV apparatus to which the display unit of the foregoing respective embodiments is applied. The television apparatus has, for example, a video display screen 300 including a front panel 310 and a filter glass 320. The video display screen 300 is formed of the display unit according to the foregoing embodiments.

Application Example 2

Figure 34A:
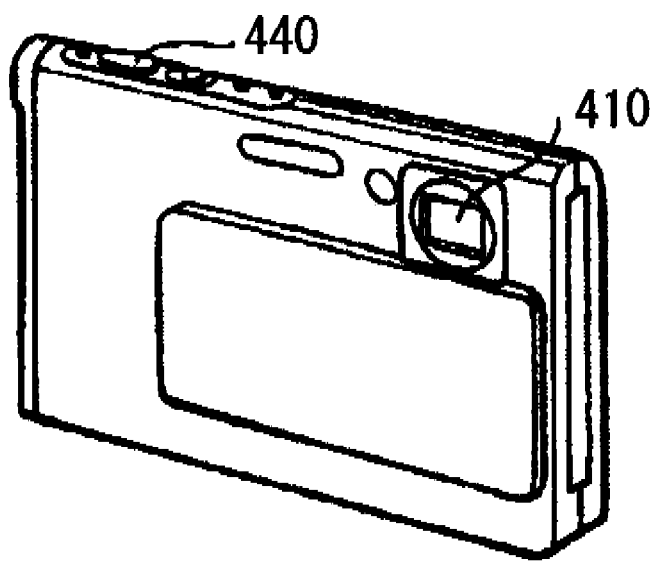
FIG. 34A is a perspective view showing an appearance viewed from the front side of Application example 2.
Figure 34B:
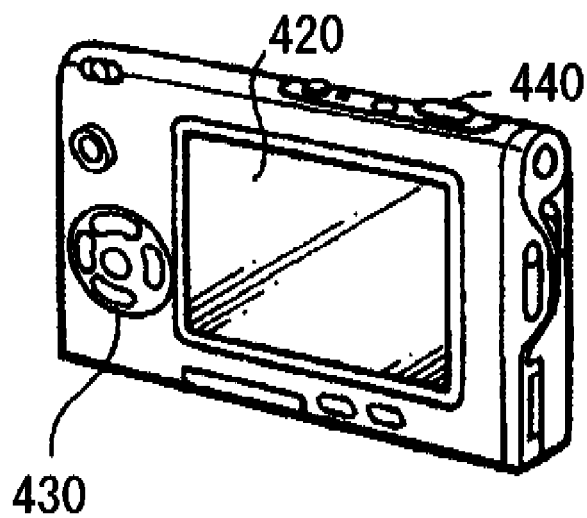
FIG. 34B is a perspective view showing an appearance viewed from the rear side of Application example 2.

FIGS. 34A and 34B show an appearance of a digital camera to which the display unit of the foregoing respective embodiments is applied. The digital camera has, for example, a light emitting portion for flash 410, a display 420, a menu switch 430, and a shutter button 440. The display 420 is formed of the display unit according to the foregoing embodiments.

Application Example 3

Figure 35:
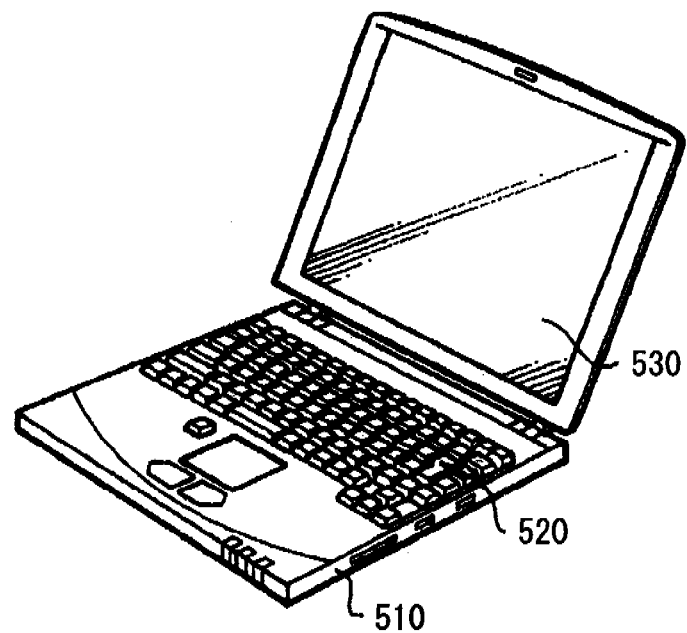
FIG. 35 is a perspective view showing an appearance of Application example 3.

FIG. 35 shows an appearance of a notebook personal computer to which the display unit of the foregoing respective embodiments is applied. The notebook personal computer has, for example, a body 510, a keyboard 520 for inputting characters and the like, and a display 530 for displaying an image. The display 530 is formed of the display unit according to the foregoing embodiments.

Application Example 4

Figure 36:
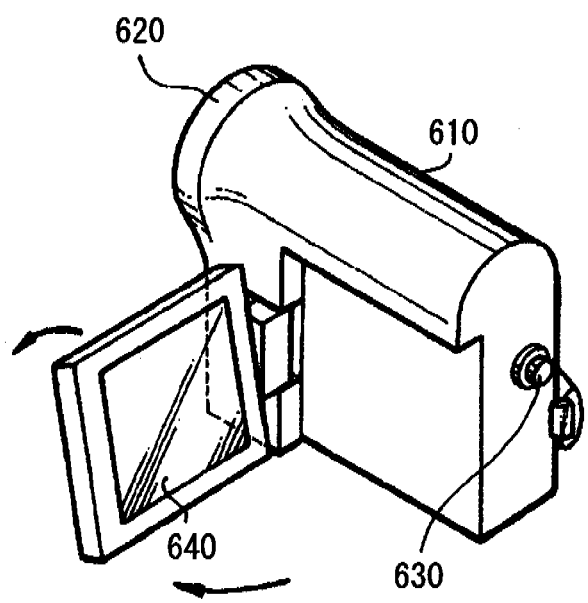
FIG. 36 is a perspective view showing an appearance of Application example 4.
Figure 37:
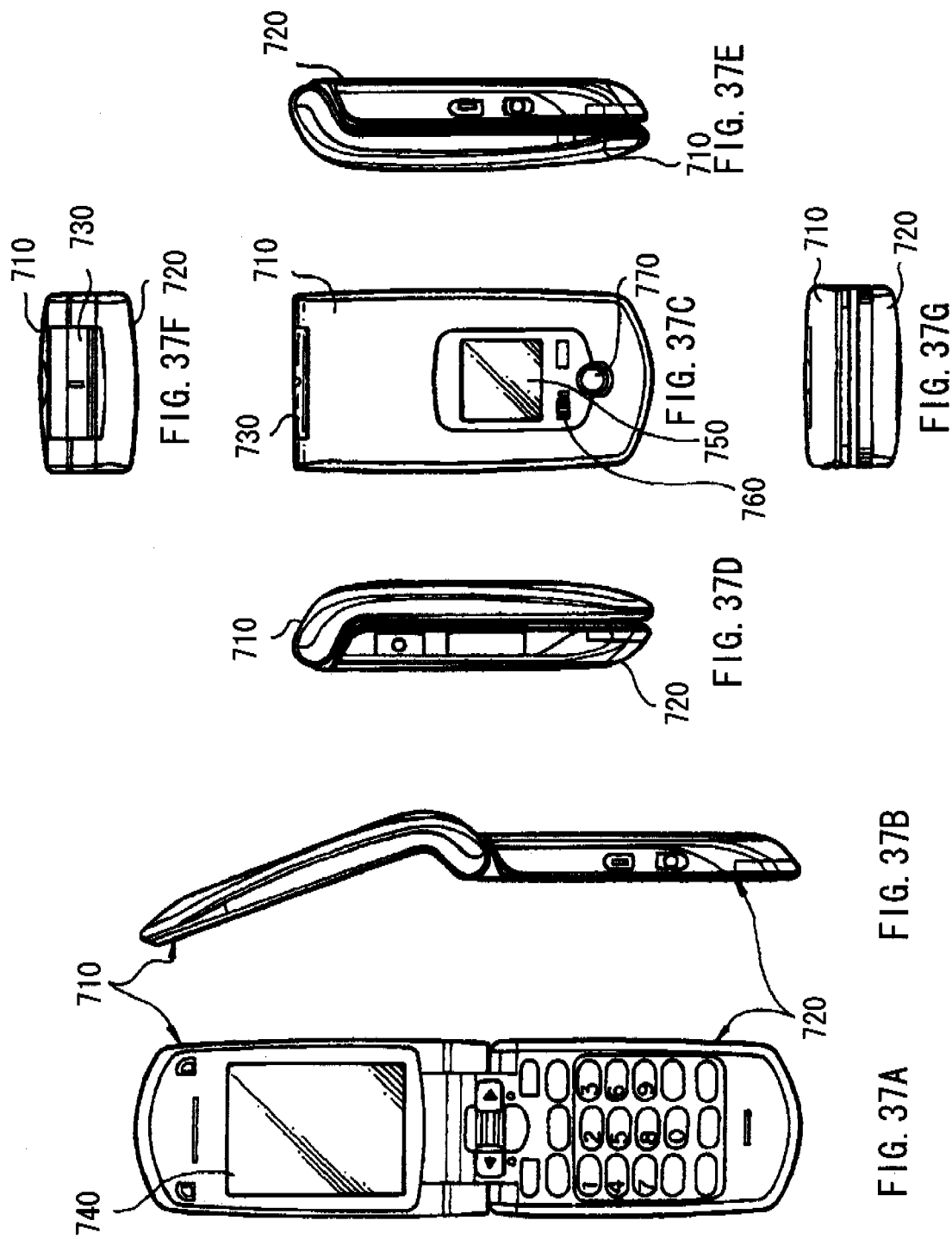
FIG. 37A is a front view of Application example 5 in an open state.
FIG. 37B is a side view thereof.
FIG. 37C is a front view of Application example 5 in a closed state.
FIG. 37D is a left side view thereof.
FIG. 37E is a right side view thereof.
FIG. 37F is a top view thereof.
FIG. 37G is a bottom view thereof.

FIG. 36 shows an appearance of a video camera to which the display unit of the foregoing respective embodiments is applied. The video camera has, for example, a body 610, a lens for shooting an object 620 provided on the front side face of the body 610, a start/stop switch 630 in shooting the object, and a display 640. The display 640 is formed of the display unit according to the foregoing embodiments.

Application Example 5

FIGS. 37A to 37F show an appearance of a cellular phone to which the display unit of the foregoing respective embodiments is applied. The cellular phone has a structure in which, for example, an upper housing 710 and a lower housing 720 are connected through a connection part (hinge) 730. The cellular phone has a display 740, a sub display 750, a picture light 760, and a camera 770. The display 740 or the sub display 750 is formed of the display unit according to the foregoing embodiments.

Figure 38:
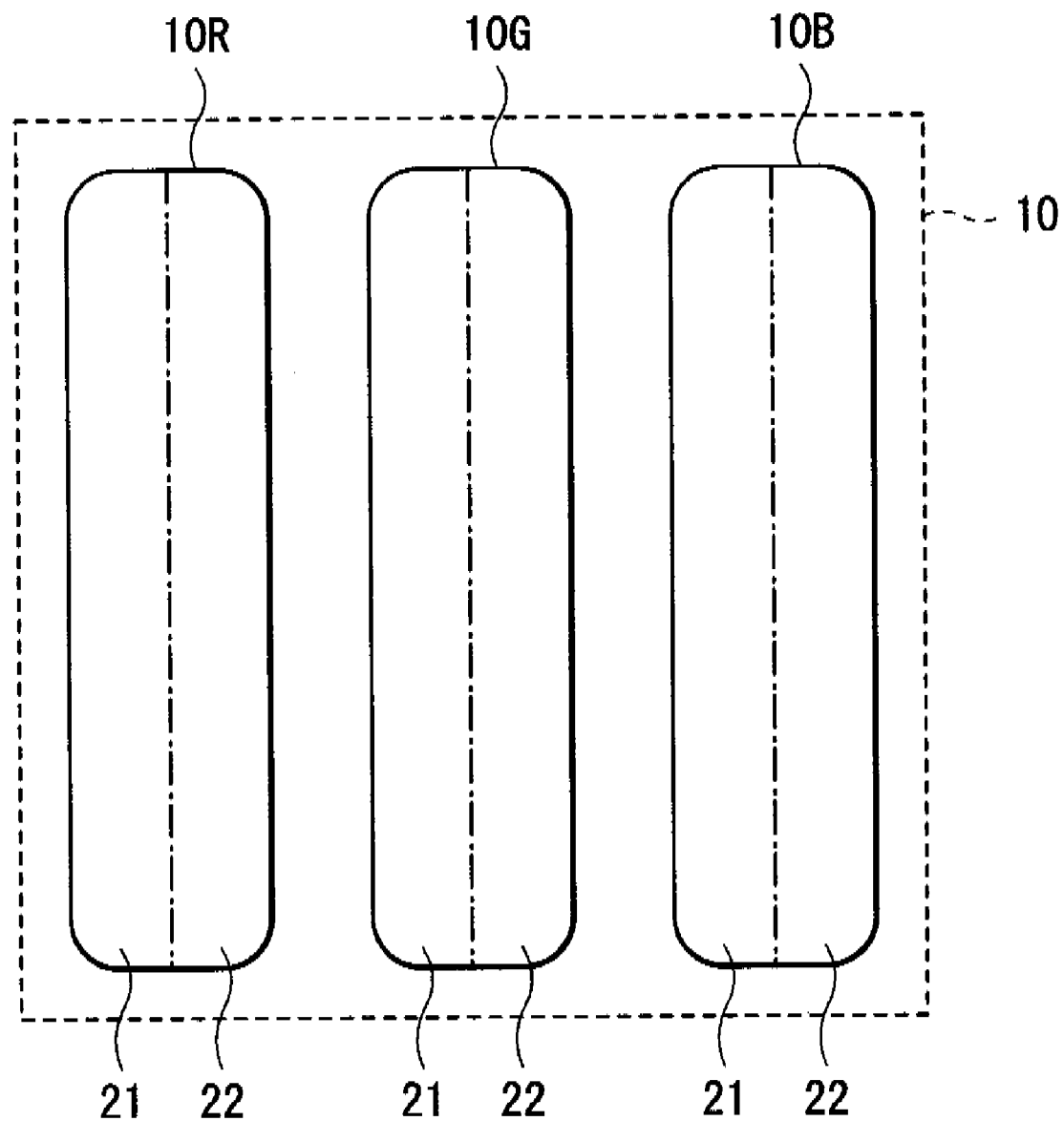
FIG. 38 is a plan view showing another example of a plan shape of a first region and a second region of the organic light emitting device shown in FIG. 2.
Figure 39:
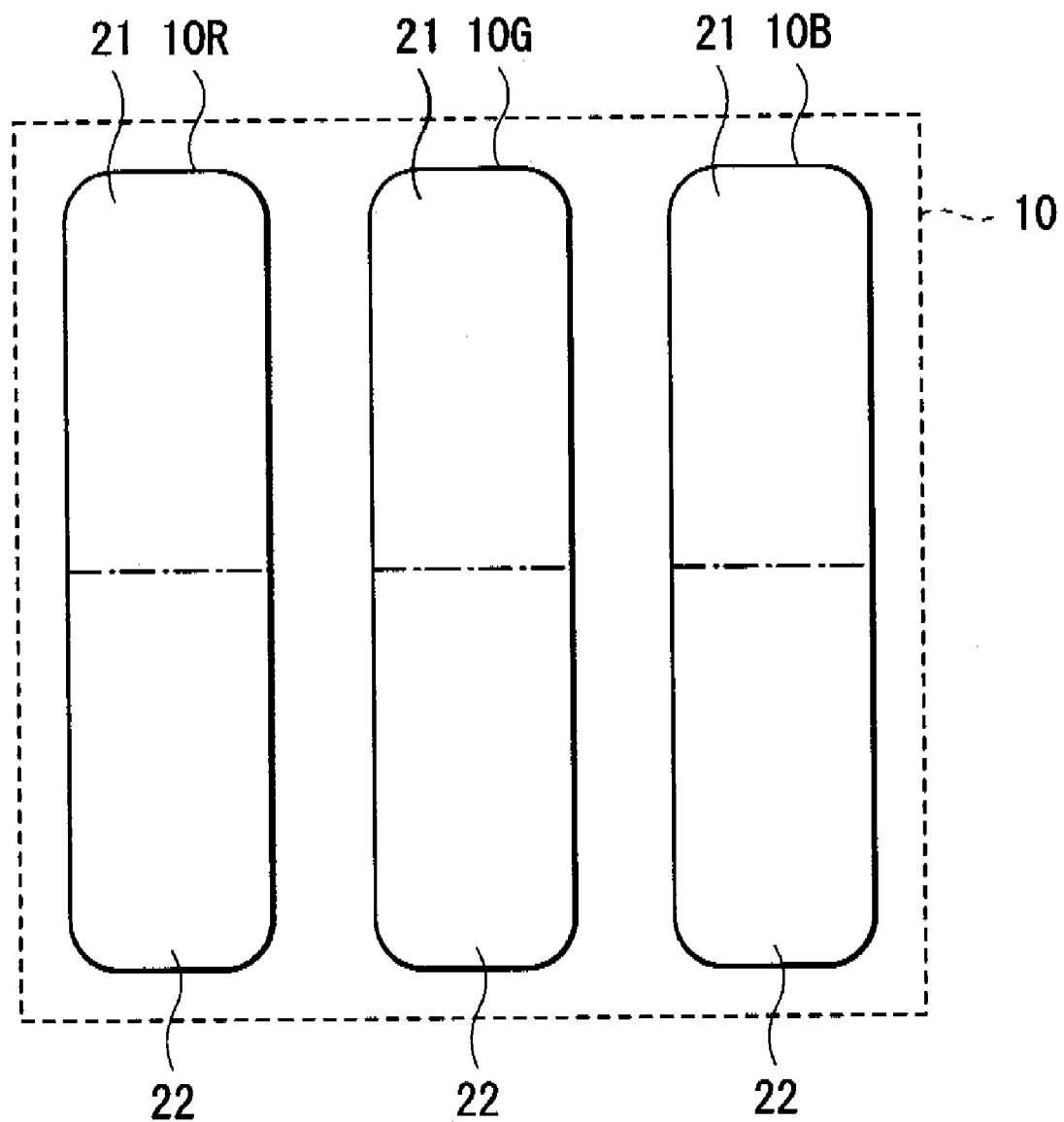
FIG. 39 is a plan view showing still another example of a plan shape of the first region and the second region of the organic light emitting device shown in FIG. 2.
Figure 40:
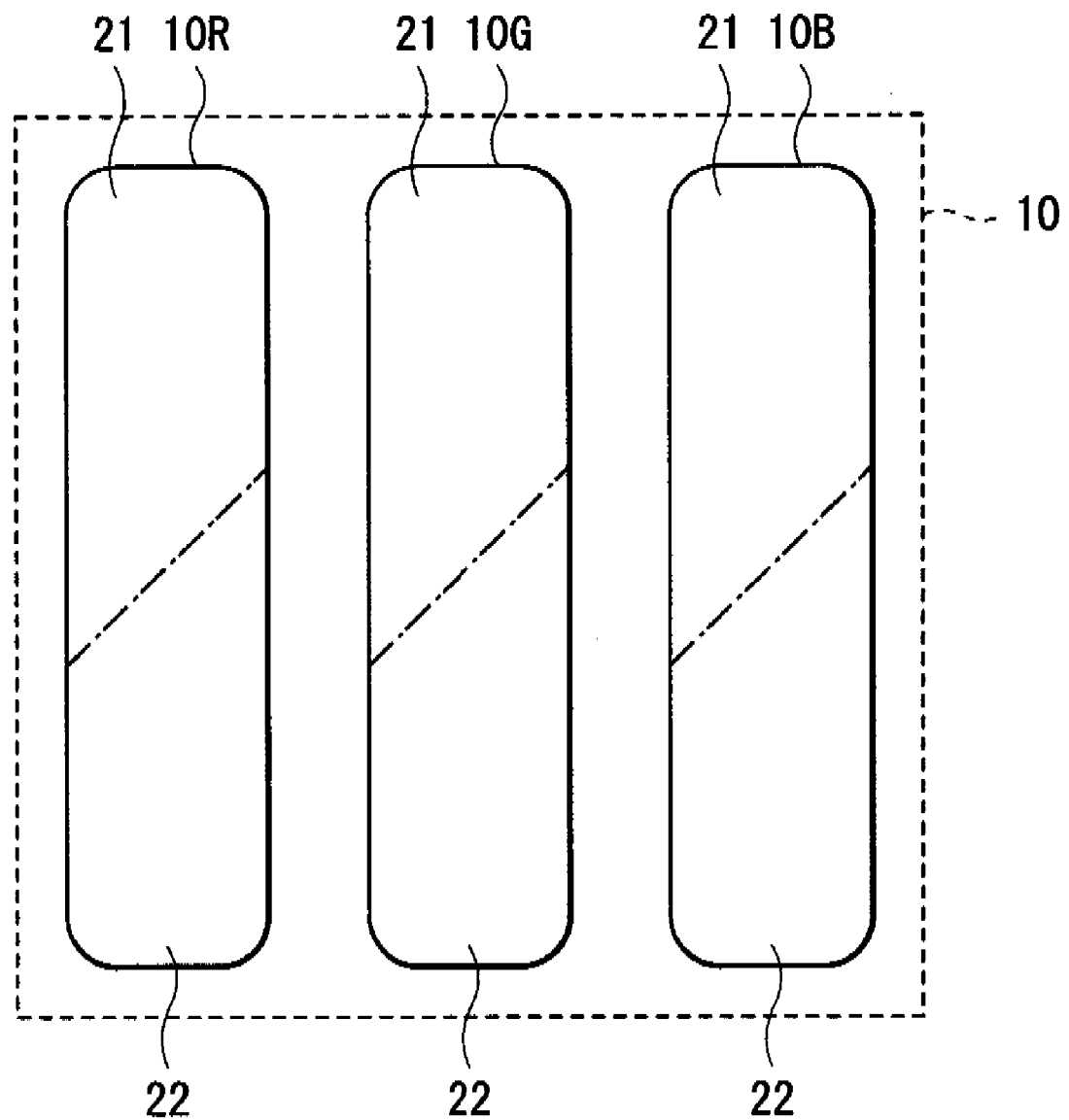
FIG. 40 is a plan view showing still another example of a plan shape of the first region and the second region of the organic light emitting device shown in FIG. 2.

While the invention has been described with reference to the embodiments, the invention is not limited to the foregoing embodiments, and various modifications may be made. For example, in the foregoing first to third embodiments, the case in which the light emitting layer 18C is divided into the central first region 21 and the right and left second region 22 in the plane shape has been described. However, as shown in FIG. 38, the light emitting layer 18C may be divided into the right side half second region 22 and the left side half first region 21 in the plane shape. Otherwise, as shown in FIG. 39, the light emitting layer 18C may be divided into the upper side half first region 21 and the lower side half second region 22. Otherwise, as shown in FIG. 40, the light emitting layer 18C may be divided by a diagonal borderline. That is, the first region 21 and the second region 22 may be defined in any fashion as long as there is no problem visually.

Further, the step forming layer 14 is not necessarily formed only on part of the substrate 11, and may be formed over the whole area of the substrate 11. In this case, by changing the thickness of the step forming layer 14, a step can be formed on the end face of the first electrode 15 on the light emitting layer 18C side.

Further, in the foregoing fourth embodiment, the case in which the first end P1 has the continuous convexoconcave shape has been described. However, it is enough that at least one of the first end P1 and the second end P2 has the continuous convexoconcave shape.

In addition, the organic light emitting devices 10R, 10G and 10B are not necessarily divided into two regions of the first region 21 and the second region 22, but may be divided into three regions or more. In this case, it is enough that at least two regions thereof have the optical distance different from each other.

Furthermore, for example, the material, the thickness, the film-forming method, the film-forming conditions and the like of each layer are not limited to those described in the foregoing embodiments, but other material, other thickness, other film-forming method, and other film-forming conditions may be adopted. For example, in the foregoing embodiments, the description has been given of the case in which the first electrode 15, the organic layer 18, and the second electrode 19 are sequentially layered from the substrate 11 side over the substrate 11, and light is extracted from the sealing substrate 50 side. However, it is possible that the lamination order is reversed, that is, the second electrode 19, the organic layer 18, and the first electrode 15 are sequentially layered from the substrate 11 side over the substrate 11, and light is extracted from the substrate 11 side.

In addition, for example, in the foregoing embodiments, the description has been given of the case in which the first electrode 15 is an anode and the second electrode 19 is a cathode. However, it is possible that the polarity is reversed, that is, the first electrode 15 is a cathode and the second electrode 19 is an anode. Further, it is possible that the first electrode 15 is a cathode and the second electrode 19 is an anode, the second electrode 19, the organic layer 18, and the first electrode 15 are sequentially layered from the substrate 11 side over the substrate 11, and light is extracted from the substrate 11 side.

Furthermore, in the foregoing embodiments, the structures of the organic light emitting devices 10R, 10G and 10B are described with the specific examples. However, it is not always necessary to provide all layers, and other layer may be further provided. For example, it is possible to provide a hole injection thin film layer made of chromium oxide (III) ($Cr_2O_3$), ITO (Indium-Tin Oxide: oxide mixed film of indium (In) and tin (Sn)) between the first electrode 15 and the organic layer 18. Further, for example, the first electrode 15 or the reflective electrode 15A may be formed of a dielectric multilayer film.

In addition, in the foregoing embodiments, the description has been given of the case that the second electrode 19 is formed of the semi-transparent reflective layer. However, the second electrode 19 may have a structure in which a semi-transparent reflective layer and a transparent electrode are sequentially layered from the first electrode 15 side. The transparent electrode is for decreasing the electric resistance of the semi-transparent reflective layer, and is made of a conductive material having sufficient translucency for the light generated in the light emitting layer. As a material for the transparent electrode, for example, ITO, or a compound including indium, zinc (Zn), and oxygen is preferable. Thereby, favorable conductivity can be obtained even when deposition is made at room temperatures. The thickness of the transparent electrode can be, for example 30 nm to 1000 nm. In this case, it is possible to form a resonator structure in which the semi-transparent reflective layer is set as one end, the other end is set at the position opposing to the semi-transparent electrode with the transparent electrode in between, and the transparent electrode is set as a resonator portion. Further, when such a resonator structure is provided, it is preferable that the organic light emitting devices 10R, 10G and 10B are covered with the protective film 30, and the protective film 30 is made of a material having the refractive index similar to that of the material composing the transparent electrode, since thereby the protective film 30 can be part of the resonator.

Further, the embodiments of the invention can be applied to the case that the second electrode 19 is formed of a transparent electrode, the reflectance of the end face of the transparent electrode on the opposite side of the organic layer 18 is large, and a resonator structure in which the end face of the first electrode 15 on the light emitting layer 18C side is the first end and the end face of the transparent electrode on the other side of the organic layer is the second end. For example, it is possible that the transparent electrode is contacted to an atmospheric layer, the reflectance of the boundary face between the transparent electrode and the atmospheric layer is increased, and the boundary face is set as the second end. Otherwise, it is possible that the reflectance of the boundary face with the adhesive layer is increased, and the boundary face is set as the second end. Otherwise, it is possible that the organic light emitting devices 10R, 10G and 10B are covered with the protective film 30, the reflectance of the boundary face with the protective film 30 is increased, and the boundary face is set as the second end.

In addition, in the foregoing embodiments, the description has been given of the active matrix display unit. However, the embodiments of the invention can be applied to a passive matrix display unit. Furthermore, the structure of the pixel driving circuit for the active matrix driving is not limited to the structure described in the foregoing respective embodiments. If necessary, a capacity device or a transistor may be added. In this case, according to the change of the pixel driving circuit, a necessary driving circuit may be added in addition to the foregoing signal driving circuit 120 and the scanning line driving circuit 130.

It should be understood by those skilled in the art that various modifications, combinations, sub-combinations and alternations may occur depending on design requirements and other factors insofar as they are within the scope of the appended claims or the equivalents thereof.

What is claimed is:

1. A light emitting device comprising:
    a substrate;
    a layer having a convexoconcave surface and disposed on the substrate such that the convexoconcave surface faces away from the substrate, the convexoconcave surface having a continuous convexoconcave shape with arcuate convex and concave segments;
    a first electrode on the convexoconcave surface and conforming thereto so as to have a first electrode surface having the continuous convexoconcave shape and facing away from the substrate;
    a distance adjustment layer that covers the first electrode, the distance adjustment layer having (i) a first surface that has the continuous convexoconcave shape and contacts the first electrode and (ii) a second surface that is flat and faces away from the first electrode;
    an organic layer on the distance adjustment layer, the organic layer including a light emitting layer and at least a hole injection layer, the hole injection layer being in contact with the second surface of the distance adjustment layer, and the organic layer being planar over the extent of the first electrode surface; and
    a second electrode on the organic layer, the second electrode having a second electrode surface that faces the organic layer and is planarized,
    wherein,
        the light emitting device has a resonator structure in which light generated in the light emitting layer is resonated between a first end and a second end, the first electrode surface being the first end and the second electrode surface being the second end, and the light being emitted via the second electrode, and
        an optical distance between the first end and the second end continuously varies according to the continuous convexoconcave shape of the first end.

2. The light emitting device of claim 1, further comprising: a color filter over the second electrode.

3. The light emitting device of claim 1, wherein the organic layer further includes a hole transport layer and an electron transport layer, the hole injection layer, the hole transport layer, the light emitting layer, and the electron transport layer being stacked in that order from the distance adjustment layer.

4. The light emitting device of claim 1, wherein the layer having the convexoconcave surface is made of a photosensitive resin.

5. The light emitting device of claim 1, wherein a material from which the distance adjustment layer is made is the same as a material from which one of the layers of the organic layer is made.

6. A display unit comprising:
    a light emitting device, the light emitting device including
        (a) a substrate;
        (b) a layer having a convexoconcave surface and disposed on the substrate such that the convexoconcave surface faces away from the substrate, the convexoconcave surface having a continuous convexoconcave shape with arcuate convex and concave segments;
        (c) a first electrode on the convexoconcave surface and conforming thereto so as to have a first electrode surface having the continuous convexoconcave shape and facing away from the substrate;
        (d) a distance adjustment layer that covers the first electrode, the distance adjustment layer having (i) a first surface that has the continuous convexoconcave shape and contacts the first electrode and (ii) a second surface that is flat and faces away from the first electrode;
        (e) an organic layer on the distance adjustment layer, the organic layer including a light emitting layer and at least a hole injection layer, the hole injection layer being in contact with the second surface of the distance adjustment layer, and the organic layer being planar over the extent of the first electrode surface; and
        (f) a second electrode on the organic layer, the second electrode having a second electrode surface that faces the organic layer and is planarized,
    wherein,
        the light emitting device has a resonator structure in which light generated in the light emitting layer is resonated between a first end and a second end, the first electrode surface being the first end and the second electrode surface being the second end, and the light being emitted via the second electrode, and
        an optical distance between the first end and the second end continuously varies according to the continuous convexoconcave shape of the first end.

7. The display unit of claim 6, further comprising: a color filter over the second electrode.

8. The display unit of claim 6, wherein the organic layer further includes a hole transport layer and an electron transport layer, the hole injection layer, the hole transport layer, the light emitting layer, and the electron transport layer being stacked in that order from the distance adjustment layer.

9. The display unit of claim 6, wherein the layer having the convexoconcave surface is made of a photosensitive resin.

10. The display unit of claim 6, wherein a material from which the distance adjustment layer is made is the same as a material from which one of the layers of the organic layer is made.

* * * * *